(12) United States Patent
Yamazaki et al.

(10) Patent No.: US 9,905,586 B2
(45) Date of Patent: Feb. 27, 2018

(54) CAPACITOR COMPRISING METAL OXIDE FILM HAVING HIGH ALIGNMENT

(71) Applicant: Semiconductor Energy Laboratory Co., Ltd., Atsugi-shi, Kanagawa-ken (JP)

(72) Inventors: Shunpei Yamazaki, Setagaya (JP); Junichi Koezuka, Tochigi (JP); Kenichi Okazaki, Tochigi (JP); Yasuharu Hosaka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/487,336

(22) Filed: Sep. 16, 2014

(65) Prior Publication Data
US 2015/0084045 A1   Mar. 26, 2015

(30) Foreign Application Priority Data

Sep. 25, 2013 (JP) .................................. 2013-198891

(51) Int. Cl.
*H01L 27/108* (2006.01)
*H01L 29/94* (2006.01)
*H01L 27/12* (2006.01)

(52) U.S. Cl.
CPC ...... *H01L 27/1255* (2013.01); *H01L 27/1222* (2013.01); *H01L 27/1225* (2013.01)

(58) Field of Classification Search
CPC ............. H01L 27/1255; H01L 27/1222; H01L 27/1225
USPC ............................ 257/43, 306, 350, E27.111
See application file for complete search history.

(56) References Cited

U.S. PATENT DOCUMENTS

| 5,731,856 | A  | 3/1998 | Kim et al. |
| 5,744,864 | A  | 4/1998 | Cillessen et al. |
| 6,294,274 | B1 | 9/2001 | Kawazoe et al. |
| 6,563,174 | B2 | 5/2003 | Kawasaki et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Robert Huber
(74) *Attorney, Agent, or Firm* — Robinson Intellectual Property Law Office; Eric J. Robinson

(57) ABSTRACT

An oxide semiconductor film with a low density of defect states is formed. In addition, an oxide semiconductor film with a low impurity concentration is formed. Electrical characteristics of a semiconductor device or the like using an oxide semiconductor film is improved. A semiconductor device including a capacitor, a resistor, or a transistor having a metal oxide film that includes a region; with a transmission electron diffraction measurement apparatus, a diffraction pattern with luminescent spots indicating alignment is observed in 70% or more and less than 100% of the region when an observation area is changed one-dimensionally within a range of 300 nm.

18 Claims, 48 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,796,683 B2 | 8/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062436 A1 | 3/2011 | Yamazaki et al. |
| 2011/0089417 A1 | 4/2011 | Yamazaki et al. |
| 2011/0127579 A1* | 6/2011 | Yamazaki ......... H01L 21/02472 257/192 |
| 2012/0138922 A1* | 6/2012 | Yamazaki ........... H01L 29/7869 257/43 |
| 2012/0161139 A1 | 6/2012 | Endo et al. |
| 2012/0275214 A1 | 11/2012 | Atsumi et al. |
| 2013/0200365 A1* | 8/2013 | Yamazaki ........... H01L 29/7869 257/43 |
| 2013/0300468 A1 | 11/2013 | Yamamoto et al. |
| 2013/0307496 A1 | 11/2013 | Watanabe |
| 2014/0034954 A1 | 2/2014 | Yamazakis et al. |
| 2014/0339544 A1 | 11/2014 | Hanaoka et al. |
| 2015/0076491 A1 | 3/2015 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUs on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW'08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivaton Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

(56) References Cited

OTHER PUBLICATIONS

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Sympoisum Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42:1: Invited Paper: Improved Amorphous In—Ga—Zn-O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size Amoled Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett, (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nakamura.M et al., "Syntheses and crystal structures of new homologous compounds, indium iron zinc oxides (InFeO3(ZnO)m) (m natural number) and related compounds", Kotai Butsuri (Solid State Physics), 1993, vol. 28, No. 5, pp. 317-327.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Yamazaki.S et al., "Properties of crystalline In—Ga—Zn-oxide semiconductor and its transistor characteristics", Jpn. J. Appl. Phys. (Japanese Journal of Applied Physics), Apr. 1, 2014, vol. 53, No. 4, pp. 04ED18-1-04ED18-10.

* cited by examiner

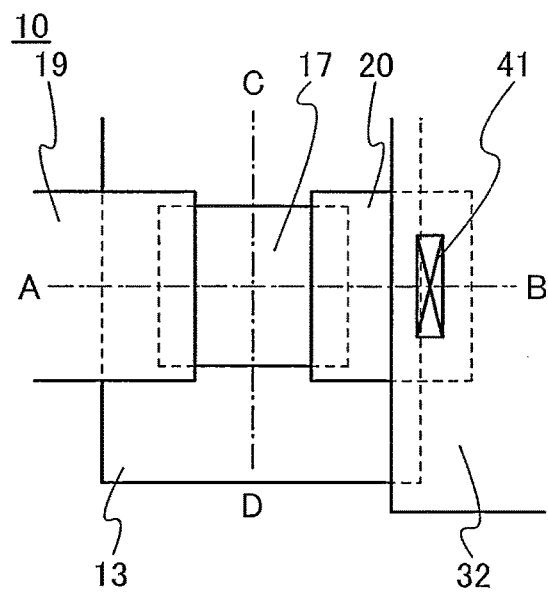
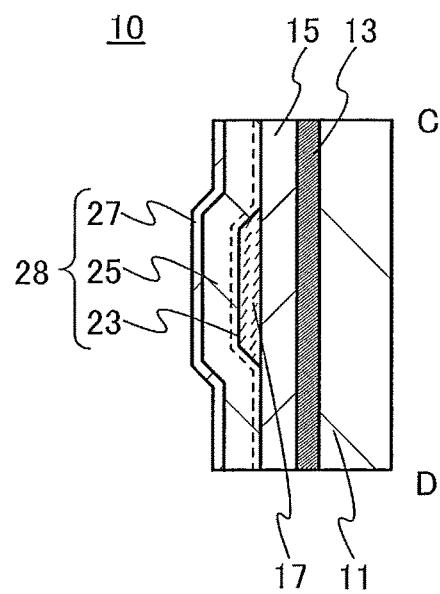
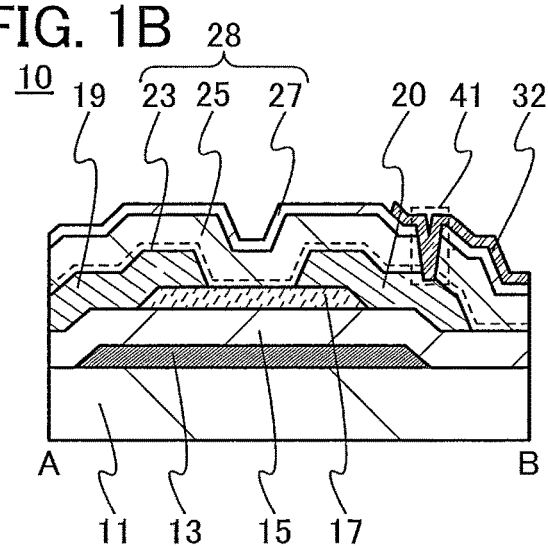

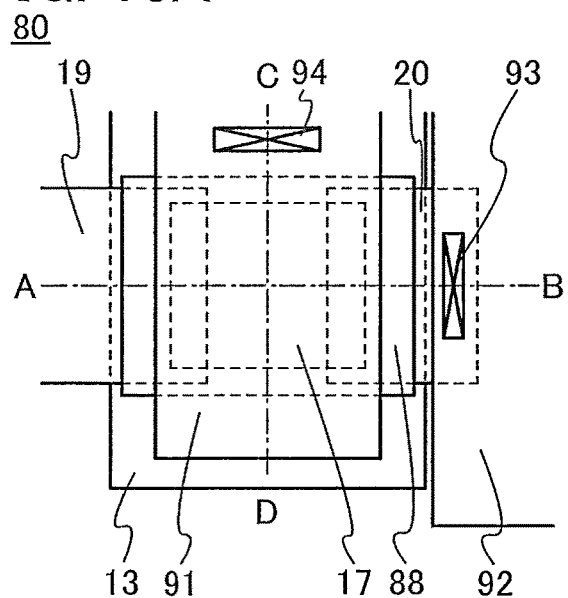
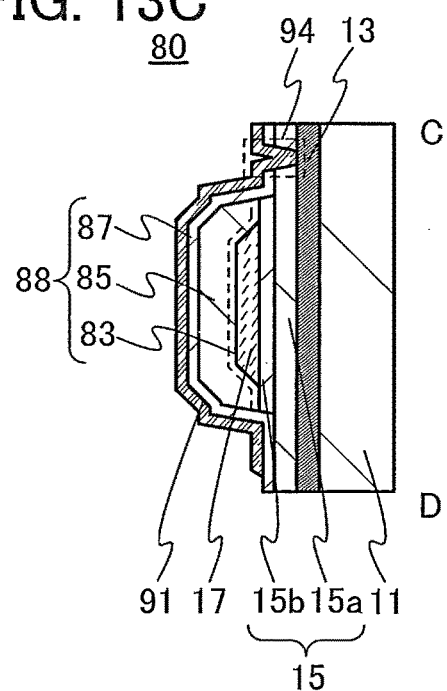
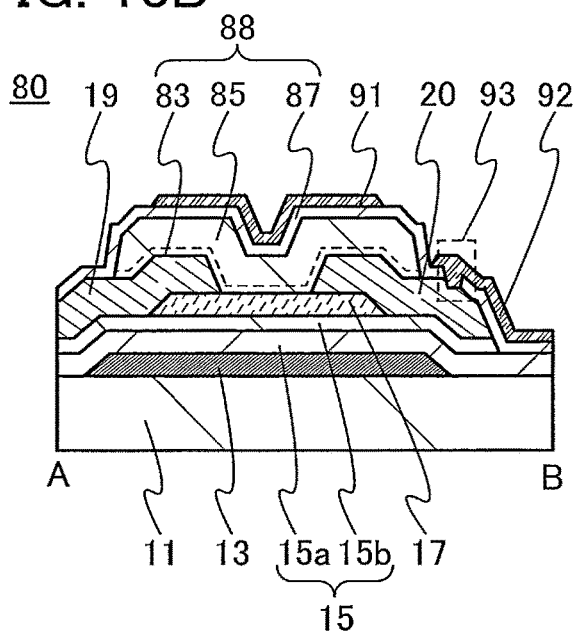

In:Sn:Zn=1:1:1

In:Sn:Zn=2:1:3   In:Ga:Zn=1:1:1

In:Sn:Zn=4:3:3

● In
○ Ga
● Sn
· Zn
● O

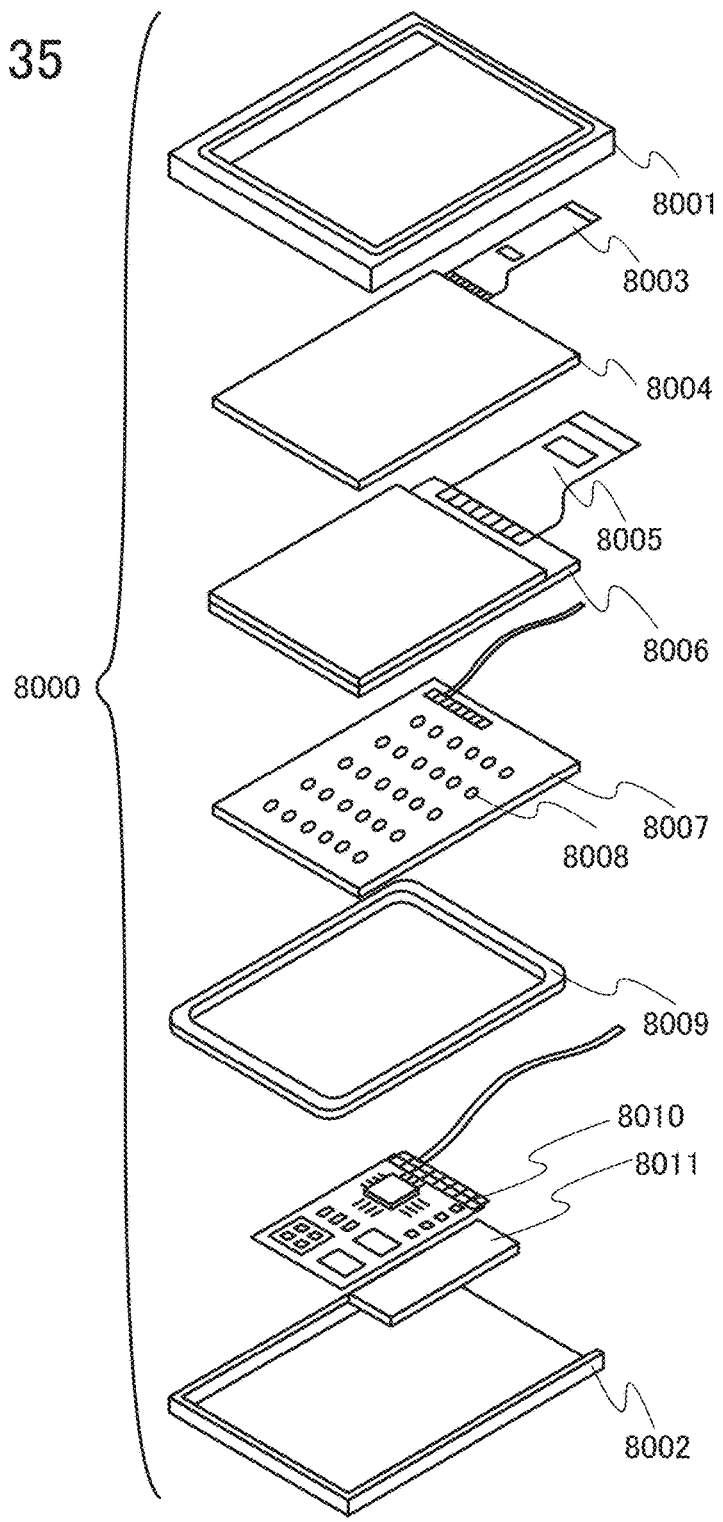

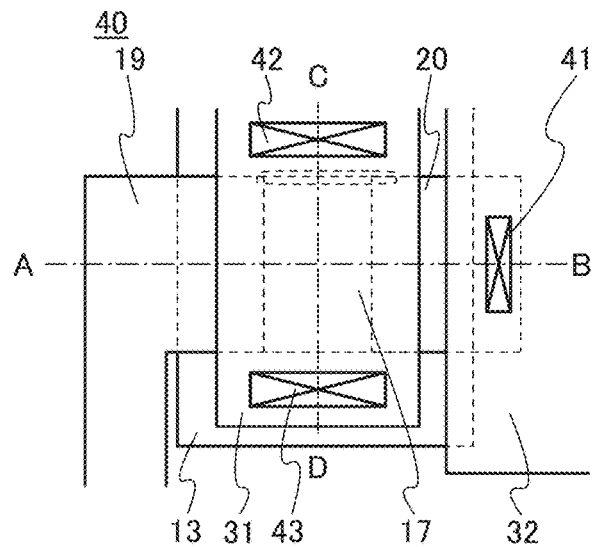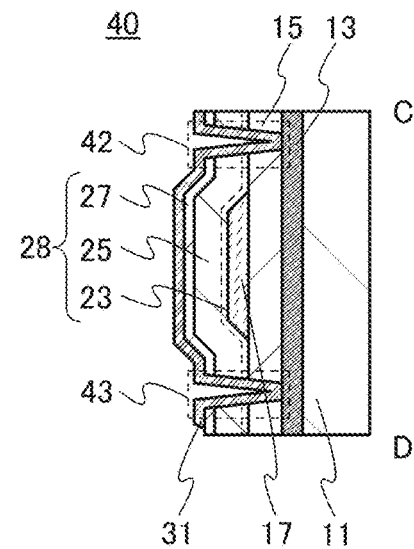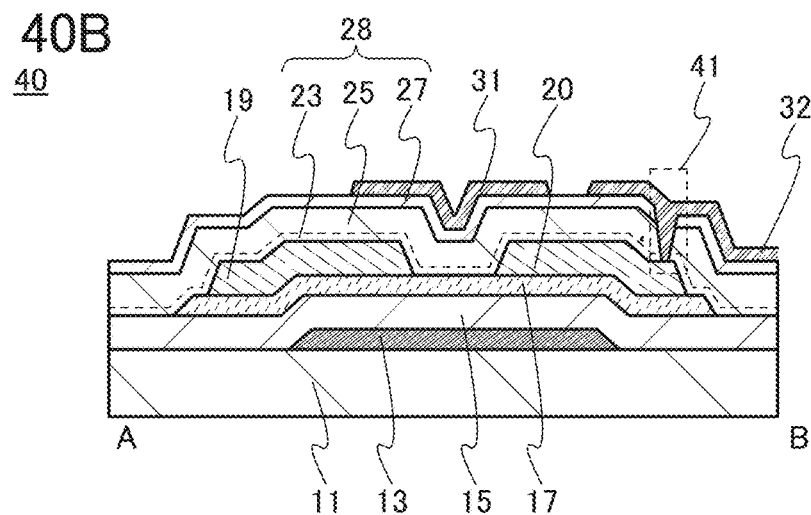

10 nm 2 nm 2 nm 2 nm

FIG. 43A
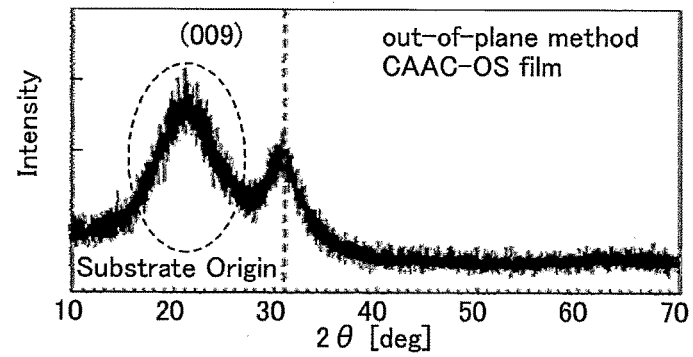
FIG. 43B
FIG. 43C
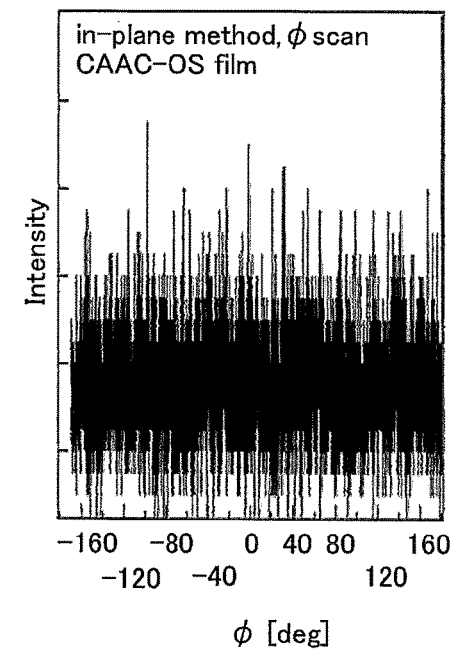
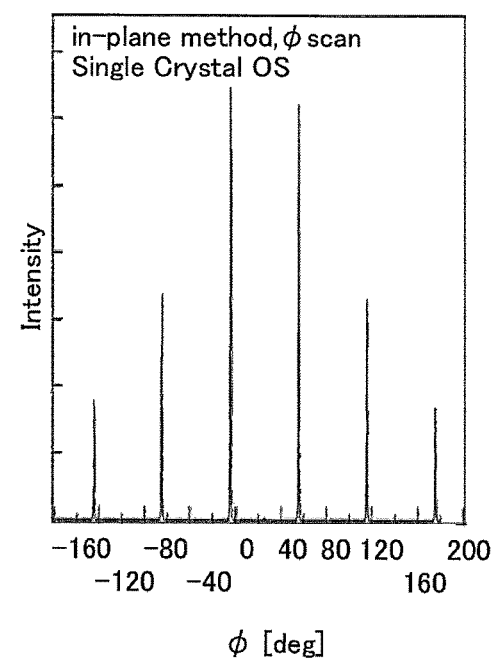

FIG. 46A Heated Substrate
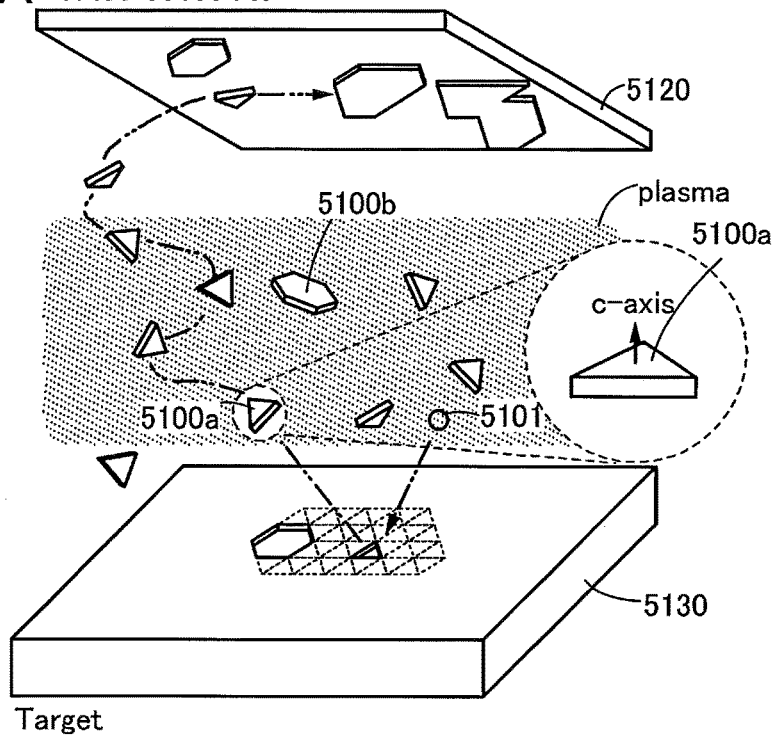
FIG. 46B Room-temperature Substrate
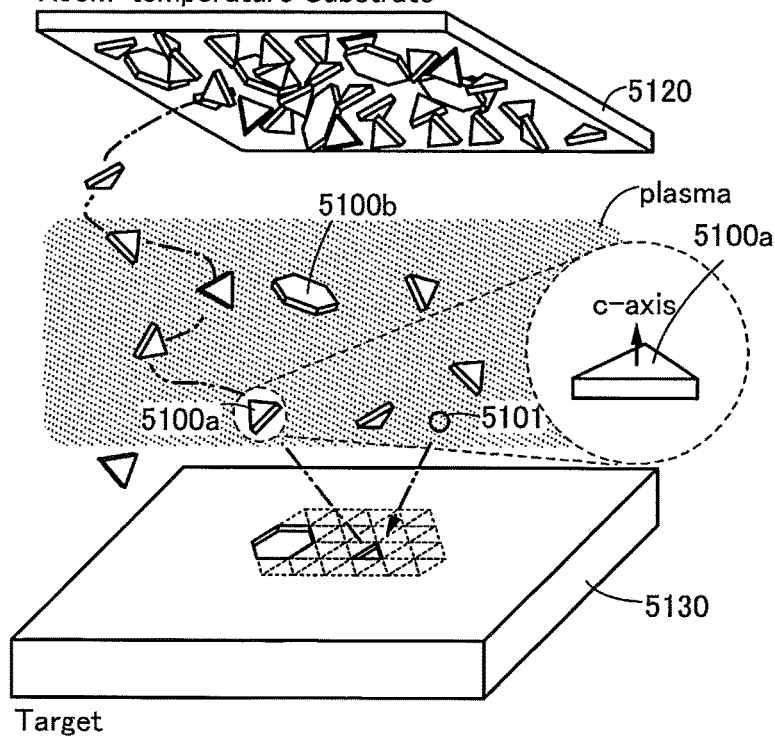

Cross-Sectional Pellet

Top-Surface of Pellet

CAPACITOR COMPRISING METAL OXIDE FILM HAVING HIGH ALIGNMENT

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. The present invention relates to a semiconductor device including a capacitor, a resistor, or a transistor that has an oxide semiconductor film and a manufacturing method thereof.

2. Description of the Related Art

Transistors used for most flat panel displays typified by a liquid crystal display device or a light-emitting display device include a silicon semiconductor such as amorphous silicon, single crystal silicon, or polycrystalline silicon formed over a glass substrate. A transistor using such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

As the oxide semiconductor, for example, $InGaO_3(ZnO)_m$ (m: a natural number) having a homologous phase is known (see Non-Patent Documents 1 and 2).

In addition, Patent Document 1 discloses a transparent thin film field-effect transistor using a homologous compound $InMO_3(ZnO)_m$ (M represents In, Fe, Ga, or Al, and m is an integer greater than or equal to 1 and less than 50).

REFERENCE

Patent Document

[Patent Document 1] Japanese Published Patent Application No. 2004-103957

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315

[Non-Patent Document 2] M. Nakamura, N. Kimizuka, T. Mohri, and M. Isobe, "Syntheses and Crystal Structures of New Homologous Compounds, $InFeO_3(ZnO)_m$ (m: natural number) and Related Compounds", *KOTAI BUTSURI (SOLID STATE PHYSICS)*, 1993, Vol. 28, No. 5, pp. 317-327

SUMMARY OF THE INVENTION

An oxide semiconductor film with low crystallinity is likely to include defects such as oxygen vacancies and dangling bonds.

In the case where stacked oxide semiconductor films formed using sputtering targets with different compositions have different crystallinities, defects are generated at the interface between the stacked oxide semiconductor films.

Defects included in an oxide semiconductor film or defects combined with hydrogen or the like might cause carrier generation and change electrical characteristics of the oxide semiconductor film. Impurities contained in the oxide semiconductor film might become carrier traps and sources of carriers. Defects and impurities cause poor electrical characteristics of a transistor and an increase in the amount of change in electrical characteristics of the transistor, typically the threshold voltage, due to a change over time or a stress test (e.g., a bias-temperature (BT) stress test or a BT photostress test), resulting in a reduction in the reliability of the transistor.

In view of the above, an object of one embodiment of the present invention is to form an oxide semiconductor film with a low density of defect states. Another object of one embodiment of the present invention is to form an oxide semiconductor film with a low impurity concentration. Another object of one embodiment of the present invention is to improve electrical characteristics of a semiconductor device or the like using an oxide semiconductor film. Another object of one embodiment of the present invention is to improve reliability of a semiconductor device using an oxide semiconductor film. Another object of one embodiment of the present invention is to provide a novel semiconductor device or the like. In one embodiment of the present invention, there is no need to achieve all the objects. Note that the descriptions of these objects do not disturb the existence of other objects. Other objects will be apparent from and can be derived from the description of the specification, the drawings, the claims, and the like.

One embodiment of the present invention is a semiconductor device including a capacitor or a resistor having a metal oxide film that includes a region; with a transmission electron diffraction measurement apparatus, a diffraction pattern with luminescent spots indicating alignment is observed in 70% or more and less than 100% of the region when an observation area is changed one-dimensionally within a range of 300 nm.

Note that the metal oxide film is in contact with a nitride insulating film. The metal oxide film preferably has a hydrogen concentration of $8 \times 10^{19}$ atoms/cm$^3$ or more.

Another embodiment of the present invention is a semiconductor device including a transistor having an oxide semiconductor film that includes a region; with a transmission electron diffraction measurement apparatus, a diffraction pattern with luminescent spots indicating alignment is observed in 70% or more and less than 100% of the region when an observation area is changed one-dimensionally within a range of 300 nm.

Note that the oxide semiconductor film preferably has a hydrogen concentration of less than $5 \times 10^{19}$ atoms/cm$^3$.

Another embodiment of the present invention is a semiconductor device including a transistor and a capacitor that are over an insulating surface. The transistor includes a gate electrode over the insulating surface, an oxide semiconductor film at least partly overlapping with the gate electrode, a gate insulating film between the gate electrode and the oxide semiconductor film, a pair of electrodes in contact with the oxide semiconductor film, an oxide insulating film covering at least part of the pair of electrodes, and a nitride insulating film. The capacitor includes a metal oxide film in contact with the gate insulating film, a light-transmitting conductive film at least partly overlapping with the metal oxide film, and the nitride insulating film between the metal oxide film and the light-transmitting conductive film. The oxide semiconductor film and the metal oxide film each include a region; with a transmission electron diffraction measurement apparatus, a diffraction pattern with luminescent spots indicating alignment is observed in 70% or more and less than 100% of the region when an observation area is changed one-dimensionally within a range of 300 nm.

Another embodiment of the present invention is a semiconductor device including a transistor and a capacitor that are over an insulating surface. The transistor includes an oxide semiconductor film in contact with an oxide insulating film that is over the insulating surface and has an opening, a pair of electrodes in contact with the oxide semiconductor film, a gate insulating film in contact with the oxide semiconductor film, and a gate electrode overlapping with the oxide semiconductor film with the gate insulating film positioned therebetween. The capacitor includes a nitride insulating film between the insulating surface and the oxide insulating film having the opening, a metal oxide film in contact with the nitride insulating film in the opening, the gate insulating film in contact with the metal oxide film, and a conductive film in contact with the gate insulating film. The oxide semiconductor film and the metal oxide film each include a region; with a transmission electron diffraction measurement apparatus, a diffraction pattern with luminescent spots indicating alignment is observed in 70% or more and less than 100% of the region when an observation area is changed one-dimensionally within a range of 300 nm.

Note that the oxide semiconductor film and the metal oxide film include the same metal elements.

A nanobeam with a probe diameter of 1 nm is used as an electron beam to observe the diffraction patterns.

One embodiment of the present invention makes it possible to form an oxide semiconductor film with a low density of defect states. One embodiment of the present invention makes it possible to form an oxide semiconductor film with a low impurity concentration. One embodiment of the present invention makes it possible to improve electrical characteristics of a semiconductor device or the like using an oxide semiconductor film. One embodiment of the present invention makes it possible to improve reliability of a semiconductor device or the like using an oxide semiconductor film. One embodiment of the present invention makes it possible to provide a novel semiconductor device or the like.

Note that the descriptions of these effects do not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF THE DRAWINGS

FIGS. 1A to 1C are a top view and cross-sectional views illustrating one mode of a transistor.

FIGS. 13A to 13C are a top view and cross-sectional views illustrating one mode of a transistor.

FIG. 35 is a diagram illustrating a display module.

FIGS. 40A to 40C are a top view and cross-sectional views illustrating one mode of a transistor.

FIGS. 43A to 43C show structural analysis of a CAAC-OS film and a single crystal oxide semiconductor by XRD.

FIGS. 46A and 46B are schematic views showing deposition models of a CAAC-OS film and an nc-OS film.

DETAILED DESCRIPTION OF THE INVENTION

Figure 2A:
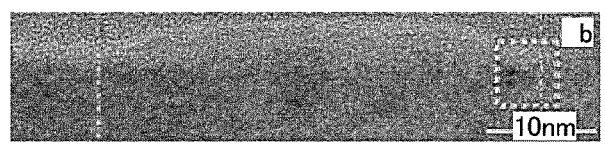
FIGS. 2A to 2D are cross-sectional TEM images and a local Fourier transform image of an oxide semiconductor.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a semiconductor device of one embodiment of the present invention and a method for manufacturing the semiconductor device will be described with reference to drawings.

FIGS. 1A to 1C are a top view and cross-sectional views of a transistor 10 included in a semiconductor device. FIG. 1A is a top view of the transistor 10, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 15, an oxide insulating film 23, an oxide insulating film 25, a nitride insulating film 27, and the like are omitted for simplicity.

The transistor 10 illustrated in FIGS. 1B and 1C is a channel-etched transistor including a gate electrode 13 provided over the substrate 11; the gate insulating film 15 formed over the substrate 11 and the gate electrode 13; an oxide semiconductor film 17 overlapping with the gate electrode 13 with the gate insulating film 15 provided therebetween; and a pair of electrodes 19 and 20 in contact with the oxide semiconductor film 17. The transistor 10 further includes the oxide insulating film 23, the oxide insulating film 25, and the nitride insulating film 27 over the gate insulating film 15, the oxide semiconductor film 17, and the pair of electrodes 19 and 20. In addition, an electrode 32 in contact with one of the pair of electrodes 19 and 20 (here, the electrode 20) is formed over the nitride insulating film 27. Note that the electrode 32 serves as a pixel electrode.

The oxide semiconductor film 17 is formed using a metal oxide film containing at least In or Zn; as a typical example, an In—Ga oxide film, an In—Zn oxide film, or an In-M-Zn oxide film (M is Al, Ti, Ga, Y, Zr, Sn, La, Ce, or Nd) can be given.

Note that in the case where the oxide semiconductor film 17 is the In-M-Zn oxide film, the proportion of In and the proportion of M, not taking Zn and O into consideration, are preferably greater than 25 atomic % and less than 75 atomic %, respectively, further preferably greater than 34 atomic % and less than 66 atomic %, respectively.

In the case where the oxide semiconductor film 17 is the In-M-Zn oxide film (M represents Al, Ti, Ga, Y, Zr, Sn, La, Ce, or Nd), it is preferable that the atomic ratio of metal elements included in a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 17 vary from the above atomic ratio of metal elements included in the sputtering target within a range of ±40% as an error.

The energy gap of the oxide semiconductor film 17 is 2 eV or more, preferably 2.5 eV or more, further preferably 3 eV or more. The use of an oxide semiconductor having such a wide energy gap reduces the off-state current of the transistor 10.

The oxide semiconductor film 17 is formed using a c-axis aligned crystalline oxide semiconductor (CAAC-OS) film. As described later, the proportion of CAAC in the oxide semiconductor film 17 is 70% or more and less than 100%, preferably 80% or more and less than 100%, further preferably 90% or more and less than 100%, still further preferably 95% or more and 98% or less when an observation area is changed one-dimensionally within a range of 300 nm in observation with a transmission electron diffraction measurement apparatus. Therefore, the oxide semiconductor film 17 has a low impurity concentration and a low density of defect states.

Here, the details of the CAAC-OS film are described. The CAAC-OS film is an oxide semiconductor film having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts (also referred to as pellets), that is, a grain boundary is not clearly observed. Thus, in the CAAC-OS film, a reduction in electron mobility due to the grain boundary is less likely to occur. Furthermore, it is possible to reduce variation in electrical characteristics and to improve reliability.

Figure 41A:
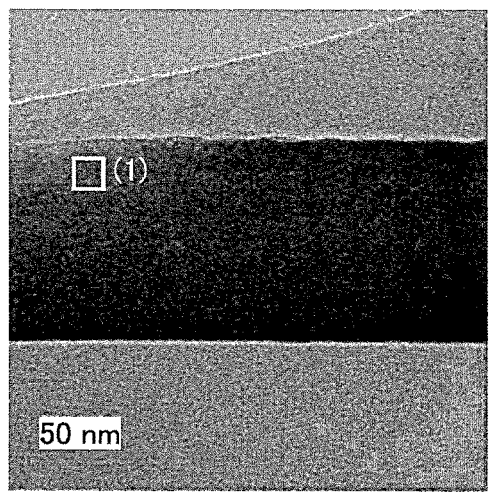
FIGS. 41A to 41D are Cs-corrected high-resolution TEM images of a cross section of a CAAC-OS film and a cross-sectional schematic view of a CAAC-OS film.

FIG. 41A shows an example of a high-resolution TEM image of a cross section of the CAAC-OS film which is obtained from a direction substantially parallel to the sample surface. Here, the TEM image is obtained with a spherical aberration corrector function. The high-resolution TEM image obtained with a spherical aberration corrector function is particularly referred to as a Cs-corrected high-resolution TEM image in the following description. Note that the Cs-corrected high-resolution TEM image can be obtained with, for example, an atomic resolution analytical electron microscope JEM-ARM200F manufactured by JEOL Ltd.

Figure 41B:
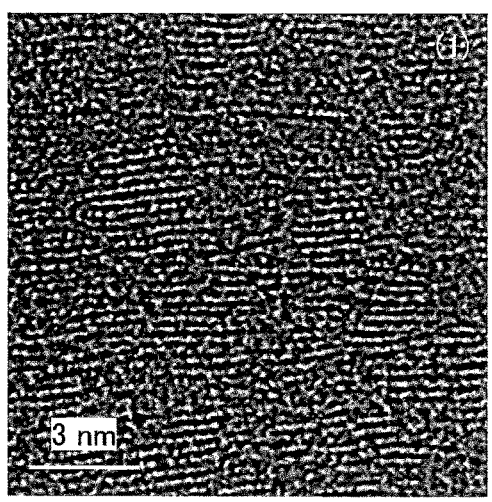

FIG. 41B is an enlarged Cs-corrected high-resolution TEM image of a region (1) in FIG. 41A. FIG. 41B shows that metal atoms are arranged in a layered manner in a crystal part. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

Figure 41C:
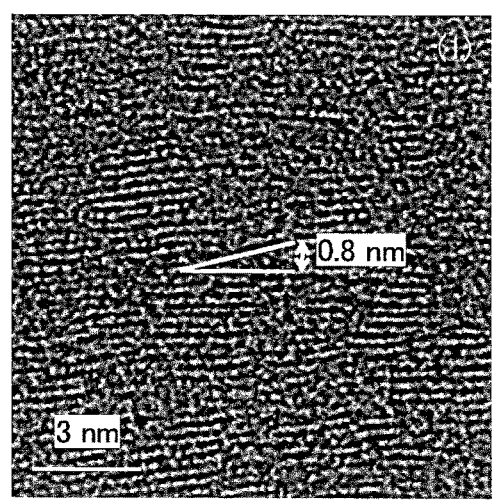

As shown in FIG. 41B, the CAAC-OS film has a characteristic atomic arrangement. The characteristic atomic arrangement is denoted by an auxiliary line in FIG. 41C. FIGS. 41B and 41C prove that the size of a crystal part is approximately 1 nm to 3 nm, and the size of a space caused by tilt of the crystal parts is approximately 0.8 nm. Therefore, the crystal part can also be referred to as a nanocrystal (nc).

Figure 41D:
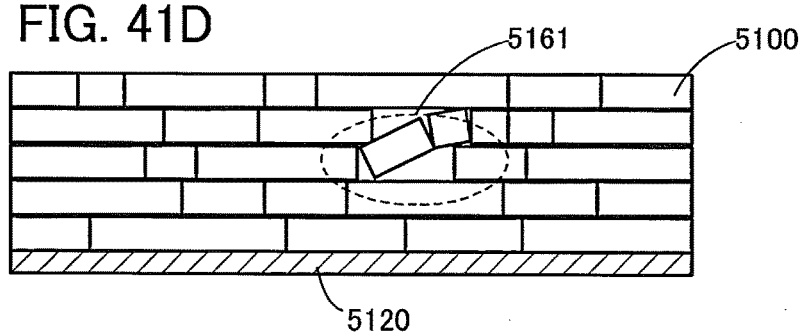

Here, according to the Cs-corrected high-resolution TEM images, the schematic arrangement of pellets 5100 of a CAAC-OS film over a substrate 5120 is illustrated by such a structure in which bricks or blocks are stacked (see FIG. 41D). The portion in which the pellets are tilted as observed in FIG. 41C corresponds to a region 5161 shown in FIG. 41D.

Figure 42A:
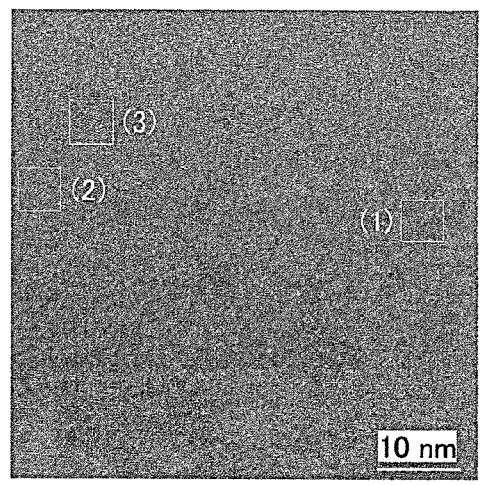
FIGS. 42A to 42D are Cs-corrected high-resolution TEM images of a plane of a CAAC-OS film.
Figure 42B:
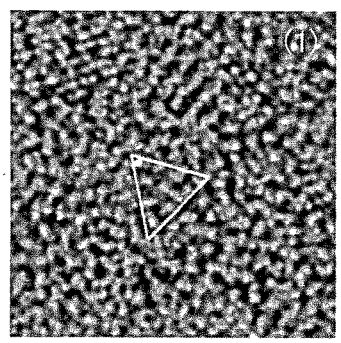
Figure 42C:
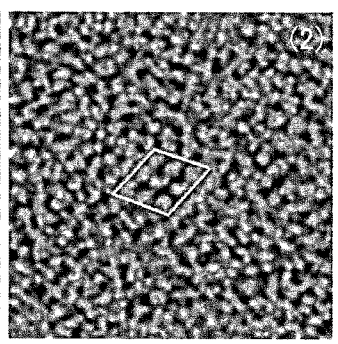
Figure 42D:
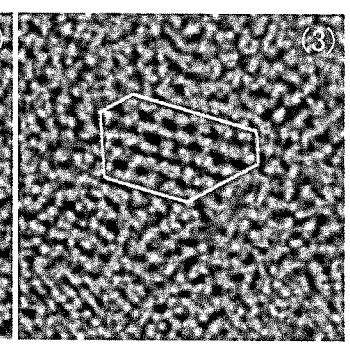

For example, as shown in FIG. 42A, a Cs-corrected high-resolution TEM image of a plane of the CAAC-OS film obtained from a direction substantially perpendicular to the sample surface is observed. FIGS. 42B, 42C, and 42D are enlarged Cs-corrected high-resolution TEM images of regions (1), (2), and (3) in FIG. 42A, respectively. FIGS. 42B, 42C, and 42D indicate that metal atoms are arranged in a triangular, quadrangular, or hexagonal configuration in a crystal part. However, there is no regularity of arrangement of metal atoms between different crystal parts.

Figure 2B:
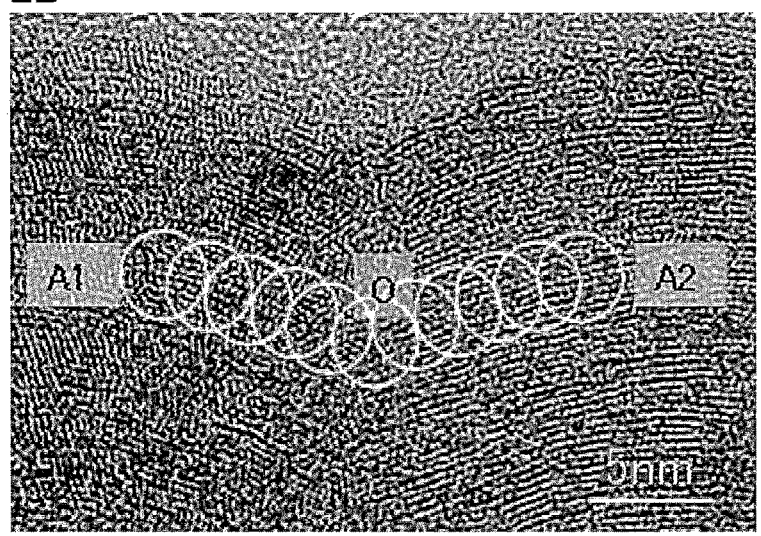
Figure 2C:
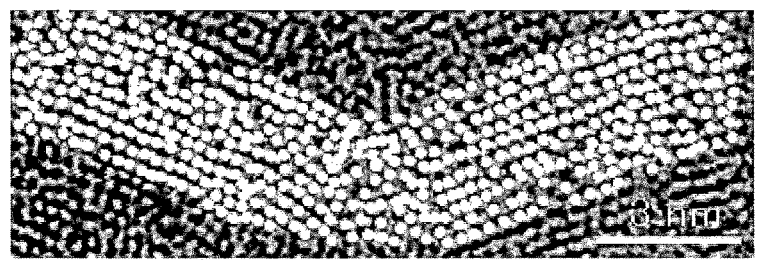

FIG. 2A is a high-resolution cross-sectional TEM image of a CAAC-OS film. FIG. 2B is an enlarged high-resolution cross-sectional TEM image of a region b surrounded by a dotted line in FIG. 2A, and FIG. 2C is a diagram in which atomic arrangement is highlighted for easy understanding of the high-resolution cross-sectional TEM image of FIG. 2B.

Figure 2D:
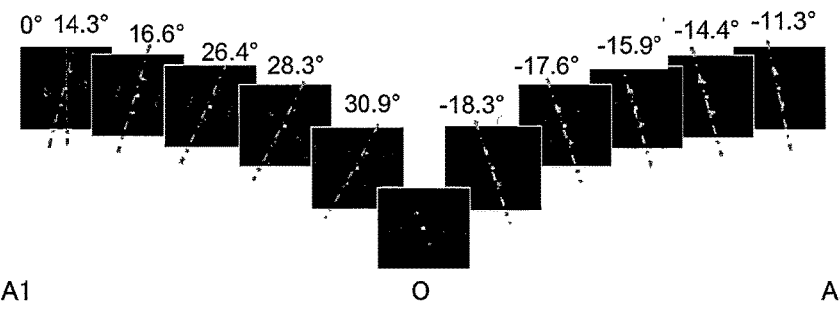

FIG. 2D is Fourier transform images of regions each surrounded by a circle (the diameter is approximately 4 nm) between A1 and O and between O and A2 in FIG. 2B. C-axis alignment can be observed in each region in FIG. 2D. The c-axis direction between A1 and O is different from that between O and A2, which indicates that a crystal part in the region between A1 and O is different from that between O and A2. In addition, between A1 and O, the angle of the c-axis continuously and gradually changes, for example, 14.3°, 16.6°, and 26.4°. Similarly, between O and A2, the angle of the c-axis continuously and gradually changes, for example −18.3°, −17.6°, and −15.9°.

Figure 3A:
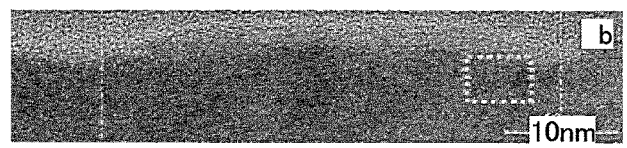
FIGS. 3A to 3C are cross-sectional TEM images and a local Fourier transform image of an oxide semiconductor.
Figure 3B:
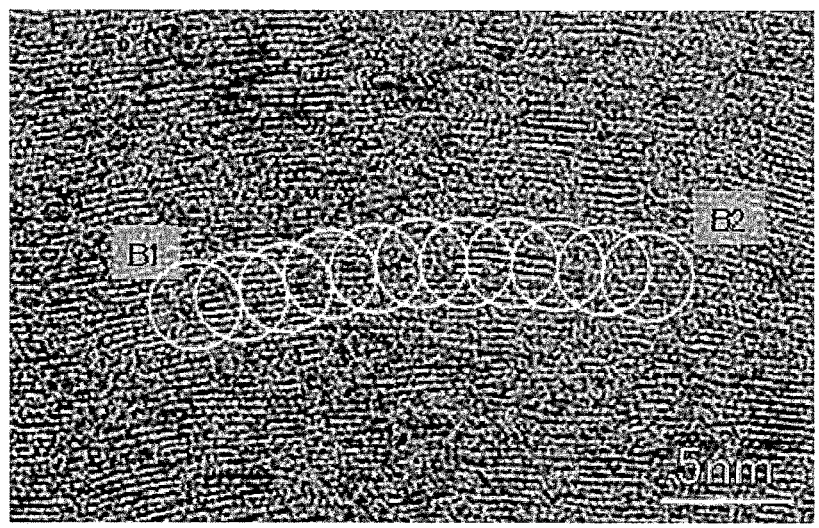

In a high-resolution cross-sectional TEM image of FIG. 3A, a region different from the region b in FIG. 2A is surrounded by the dashed line. The region surrounded by the dashed line is slightly shifted from the region b. Note that a surface near the region is curved. FIG. 3B is an enlarged high-resolution cross-sectional TEM image of the region surrounded by the dashed line.

Figure 3C:
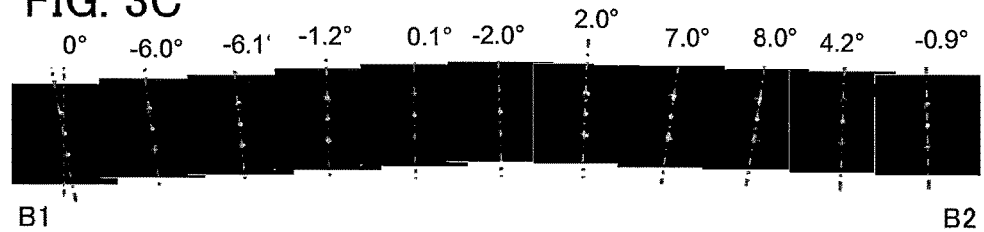

FIG. 3C is Fourier transform images of regions each surrounded by a circle (the diameter is approximately 4 nm) between B1 and B2 in FIG. 3B. As seen in FIG. 3C, c-axis alignment can be observed in each region. Between B1 and B2, the angle of the c-axis continuously and gradually changes, for example −6.0°, −6.1°, and −1.2°.

Figure 4A:
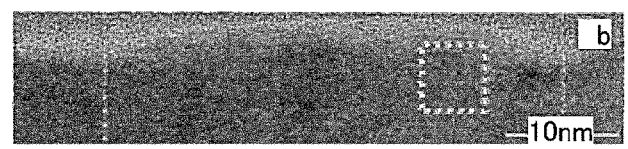
FIGS. 4A to 4C are cross-sectional TEM images and a local Fourier transform image of an oxide semiconductor.
Figure 4B:
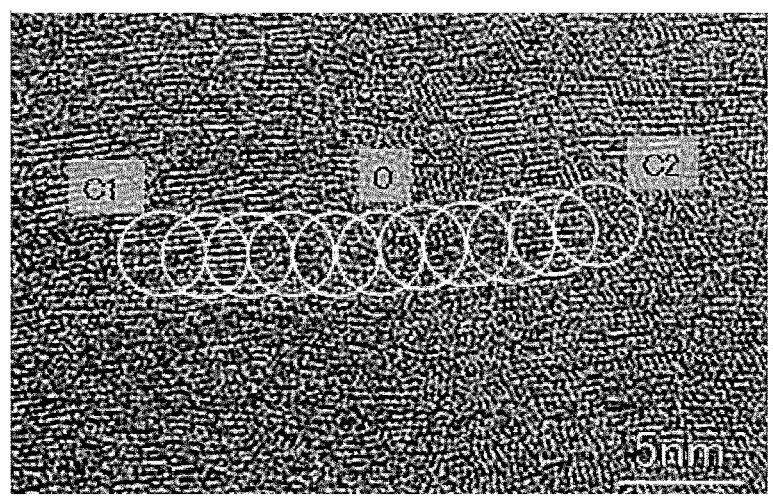

In a high-resolution cross-sectional TEM image of FIG. 4A, a region different from the region b in FIG. 2A is surrounded by the dashed line. The region surrounded by the dashed line is slightly shifted from the region b. Note that a surface near the region is flat. FIG. 4B is an enlarged high-resolution cross-sectional TEM image of the region surrounded by the dashed line.

Figure 4C:
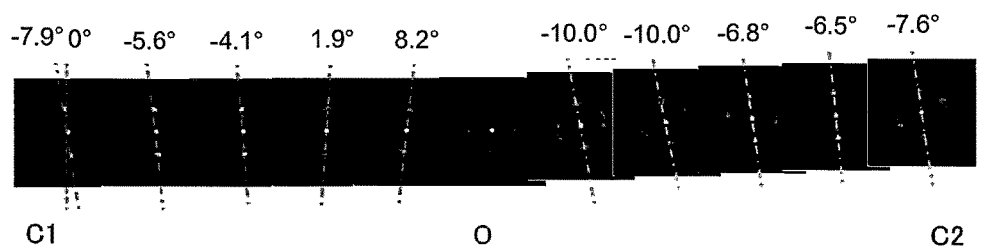

FIG. 4C is Fourier transform images of regions each surrounded by a circle (the diameter is approximately 4 nm) between C1 and O and between O and C2 in FIG. 4B. As seen in FIG. 4C, c-axis alignment can be observed in each region. Between C1 and O, the angle of the c-axis continuously and gradually changes, for example −7.9°, −5.6°, and −4.1°. Similarly, between O and C2, the angle of the c-axis continuously and gradually changes, for example −10.0°, −10.0°, and −6.8°.

Note that in an electron diffraction pattern of the CAAC-OS film, spots (luminescent spots) indicating alignment are observed. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 5A).

The results of the high-resolution cross-sectional TEM image and the high-resolution plan TEM image show that the crystal parts in the CAAC-OS film have alignment.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan TEM image.

For example, when the structure of a CAAC-OS film including an InGaZnO$_4$ crystal is analyzed by an out-of-plane method using an X-ray diffraction (XRD) apparatus, a peak appears at a diffraction angle (2θ) of around 31° as shown in FIG. 43A. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film including an InGaZnO$_4$ crystal by an out-of-plane method, another peak may appear when 2θ is around 36°, in addition to the peak at 2θ of around 31°. The peak at 2θ of around 36° indicates that a crystal having no c-axis alignment, typically, a crystal having a spinel structure, is included in part of the CAAC-OS film. Metal elements, typically, copper elements easily diffuse at an interface with the crystal having the spinel structure, and the interface becomes a carrier trap. For these reasons, it is preferable that the CAAC-OS film not include the crystal having the spinel structure. Furthermore, it is preferable that in the CAAC-OS film, a peak appear when 2θ is around 31° and that a peak not appear when 2θ is around 36°.

On the other hand, in structural analysis of the CAAC-OS film by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS film, when analysis (φ scan) is performed with 2θ fixed at around 56° and with the sample rotated using a normal vector of the sample surface as an axis (φ axis), as shown in FIG. 43B, a peak is not clearly observed. In contrast, in the case of a single crystal oxide semiconductor of InGaZnO$_4$, when φ scan is performed with 2θ fixed at around 56°, as shown in FIG. 43C, six peaks which are derived from crystal planes equivalent to the (110) plane are observed. Accordingly, the structural analysis using XRD shows that the directions of a-axes and b-axes are different in the CAAC-OS film.

Figure 44A:
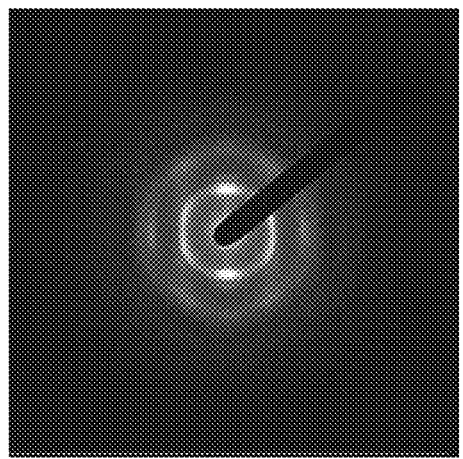
FIGS. 44A and 44B show electron diffraction patterns of a CAAC-OS film.
Figure 44B:
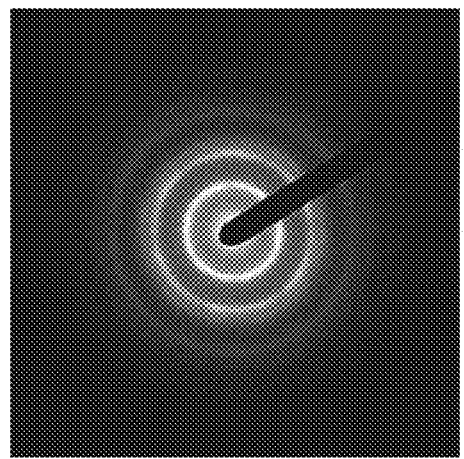

Next, FIG. 44A shows a diffraction pattern (also referred to as a selected-area transmission electron diffraction pattern) obtained in such a manner that an electron beam with a probe diameter of 300 nm is incident on an In—Ga—Zn oxide that is a CAAC-OS film in a direction parallel to the sample surface. As shown in FIG. 44A, for example, spots derived from the (009) plane of an InGaZnO$_4$ crystal are observed. Thus, the electron diffraction also indicates that crystal parts included in the CAAC-OS film have c-axis alignment and that the c-axes are aligned in a direction substantially perpendicular to the formation surface or the top surface of the CAAC-OS. Meanwhile, FIG. 44B shows a diffraction pattern obtained in such a manner that an electron beam with a probe diameter of 300 nm is incident on the same sample in a direction perpendicular to the sample surface. As shown in FIG. 44B, a ring-like diffraction pattern is observed. Thus, the electron diffraction also indicates that the a-axes and b-axes of the crystal parts included in the CAAC-OS film do not have regular alignment. The first ring in FIG. 44B is considered to be derived from the (010) plane, the (100) plane, and the like of the InGaZnO$_4$ crystal. The second ring in FIG. 44B is considered to be derived from the (110) plane and the like.

According to the above results, in the CAAC-OS film having c-axis alignment, while a-axes are not aligned and b-axes are not aligned in the crystal parts, c-axes are aligned in a direction parallel to a normal vector of a formation surface or a normal vector of a top surface of the CAAC-OS film. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axes of the crystals are aligned in a direction parallel to a normal vector of the formation surface or a normal vector of the top surface of the CAAC-OS film. Thus, for example, in the case where a shape of the CAAC-OS film is changed by etching or the like, the c-axes might not be necessarily parallel to a normal vector of the formation surface or a normal vector of the top surface of the CAAC-OS film.

Since the c-axes of the crystal parts (nanocrystals) are aligned in a direction substantially perpendicular to the formation surface or the top surface in the above manner, the CAAC-OS film can also be referred to as an oxide semiconductor film including c-axis aligned nanocrystals (CANC) film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. In the CAAC-OS film to which an impurity is added, a region to which the impurity is added is altered, and the proportion of the c-axis aligned crystal parts in the CAAC-OS film varies depending on regions, in some cases.

The CAAC-OS film is an oxide semiconductor film with a low impurity concentration. The impurity means an element other than the main components of the oxide semiconductor film, such as hydrogen, carbon, silicon, or a transition metal element. An element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity when it is contained in the oxide semiconductor film. Additionally, the impurity contained in the oxide semiconductor film might serve as a carrier trap or a carrier generation source.

Accordingly, it is preferable that hydrogen be reduced as much as possible in the oxide semiconductor film 17. Specifically, in the oxide semiconductor film 17, the concentration of hydrogen which is measured by secondary ion mass spectrometry (SIMS) is set to lower than $5 \times 10^{19}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$, still further preferably lower than $5 \times 10^{17}$ atoms/cm$^3$, still further preferably lower than $1 \times 10^{16}$ atoms/cm$^3$. As a result, the transistor 10 has positive threshold voltage (normally-off characteristics).

When silicon or carbon that is one of elements belonging to Group 14 is contained in the oxide semiconductor film 17, oxygen vacancies are increased in the oxide semiconductor film 17, and the oxide semiconductor film 17 becomes an n-type film. For this reason, the concentration of silicon or carbon (the concentration is measured by SIMS) of the oxide semiconductor film 17 is lower than $2 \times 10^{18}$ atoms/cm$^3$, preferably lower than $2 \times 10^{17}$ atoms/cm$^3$. As a result, the transistor 10 has positive threshold voltage (normally-off characteristics).

In a transistor using the CAAC-OS film, change in electrical characteristics due to irradiation with visible light or ultraviolet light is small.

Here, a microcrystalline oxide semiconductor film is described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. An oxide semiconductor film including a nanocrystal that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) film. In a high-resolution TEM image of the nc-OS film, for example, a grain boundary is not clearly observed in some cases. Note that there is a possibility that the origin of the nanocrystal is the same as that of a pellet in a CAAC-OS film. Therefore, a crystal part of the nc-OS film may be referred to as a pellet in the following description.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not ordered. Accordingly, the nc-OS film cannot be distinguished from an amorphous oxide semiconductor film, depending on an analysis method. For example, when the nc-OS film is subjected to structural analysis by an out-of-plane method with an XRD apparatus using an X-ray having a diameter larger than the size of a crystal part, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a crystal part (the electron diffraction is also referred to as selected-area electron diffraction). Meanwhile, spots appear in a nanobeam electron diffraction pattern of the nc-OS film when an electron beam having a probe diameter (e.g., 1 nm or larger and 30 nm or smaller) that is close to or smaller than the size of a crystal part is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases (see FIG. 5B).

Since there is no regularity of crystal orientation between the pellets (nanocrystals) as mentioned above, the nc-OS film can also be referred to as an oxide semiconductor film including random aligned nanocrystals (RANC) film.

The nc-OS film is an oxide semiconductor film that has high regularity as compared with an amorphous oxide semiconductor film. Therefore, the nc-OS film is likely to have a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of a crystal part, for example, a CAAC-OS and an nc-OS cannot be called an amorphous oxide semiconductor or a completely amorphous oxide semiconductor.

Note that an oxide semiconductor may have a structure having physical properties intermediate between the nc-OS and the amorphous oxide semiconductor. The oxide semiconductor having such a structure is specifically referred to as an amorphous-like oxide semiconductor (a-like OS).

In a high-resolution TEM image of the a-like OS film, a void may be observed. Furthermore, in the high-resolution TEM image, there are a region where a crystal part is clearly observed and a region where a crystal part is not observed.

A difference in effect of electron irradiation between structures of an oxide semiconductor is described below.

An a-like OS film, an nc-OS film, and a CAAC-OS film are prepared. Each of the samples is an In—Ga—Zn oxide film.

First, a high-resolution cross-sectional TEM image of each sample is obtained. The high-resolution cross-sectional TEM images show that all the samples have crystal parts.

Figure 45:
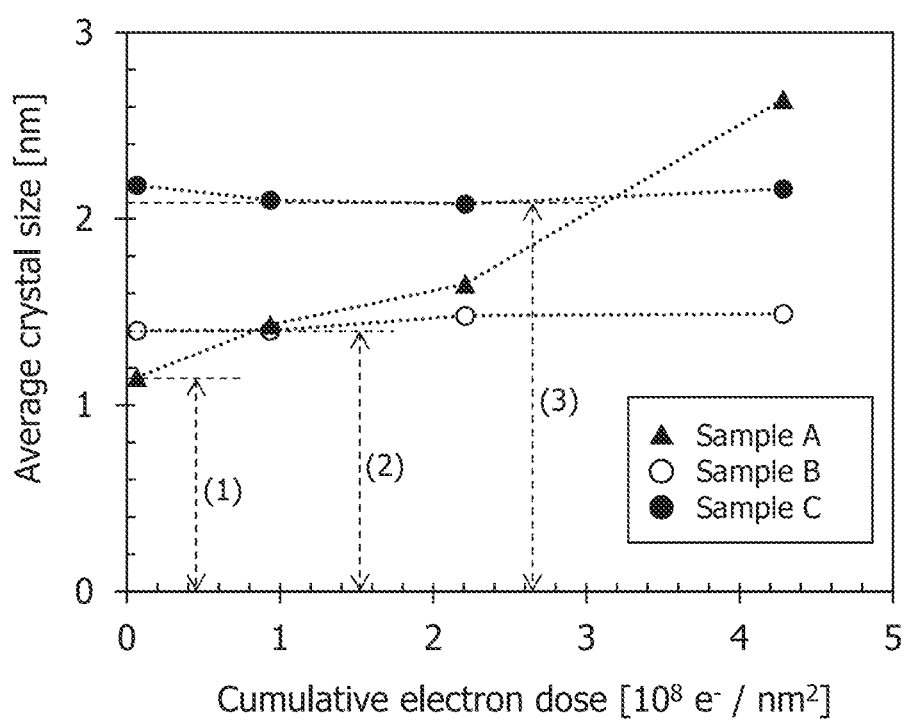
FIG. 45 shows a change in crystal parts of In—Ga—Zn oxide films induced by electron irradiation.

Then, the size of the crystal part of each sample is measured. FIG. 45 shows the change in the average size of crystal parts (at 22 points to 45 points) in each sample. FIG. 45 indicates that the crystal part size in the a-like OS film increases with an increase in the cumulative electron dose. Specifically, as shown by (1) in FIG. 45, a crystal part of approximately 1.2 nm at the start of TEM observation (the crystal part is also referred to as an initial nucleus) grows to a size of approximately 2.6 nm at a cumulative electron dose of $4.2 \times 10^8$ e$^-$/nm$^2$. In contrast, the crystal part size in the nc-OS film and the CAAC-OS film shows little change from the start of electron irradiation to a cumulative electron dose of $4.2 \times 10^8$ e$^-$/nm$^2$ regardless of the cumulative electron dose. Specifically, as shown by (2) in FIG. 45, the average crystal size is approximately 1.4 nm regardless of the observation time by TEM. Furthermore, as shown by (3) in FIG. 45, the average crystal size is approximately 2.1 nm regardless of the observation time by TEM.

In this manner, growth of the crystal part occurs due to the crystallization of the a-like OS film, which is induced by a slight amount of electron beam employed in the TEM observation. In contrast, in the nc-OS film and the CAAC-OS film that have good quality, crystallization hardly occurs by a slight amount of electron beam used for TEM observation.

Note that the crystal part size in the a-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the InGaZnO$_4$ crystal.

Furthermore, the density of an oxide semiconductor varies depending on the structure in some cases. For example, when the composition of an oxide semiconductor is determined, the structure of the oxide semiconductor can be expected by comparing the density of the oxide semiconductor with the density of a single crystal oxide semiconductor having the same composition as the oxide semiconductor. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

Specific examples of the above description are given. For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor may be a stacked film including two or more films of an amorphous oxide semiconductor film, an a-like OS film, a microcrystalline oxide semiconductor film, and a CAAC-OS film, for example.

In the case where the oxide semiconductor film has a plurality of structures, the structures can be analyzed using nanobeam electron diffraction in some cases.

Figure 5A:
FIGS. 5A and 5B show nanobeam electron diffraction patterns of oxide semiconductor films and FIGS. 5C and 5D illustrate an example of a transmission electron diffraction measurement apparatus.
Figure 5B:
Figure 5C:
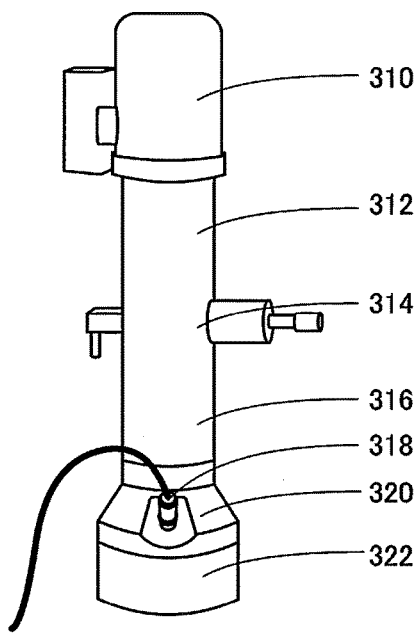

FIG. 5C illustrates a transmission electron diffraction measurement apparatus which includes an electron gun chamber 310, an optical system 312 below the electron gun chamber 310, a sample chamber 314 below the optical system 312, an optical system 316 below the sample chamber 314, an observation chamber 320 below the optical system 316, a camera 318 installed in the observation chamber 320, and a film chamber 322 below the observation chamber 320. The camera 318 is provided to face toward the inside of the observation chamber 320. Note that the film chamber 322 is not necessarily provided.

Figure 5D:
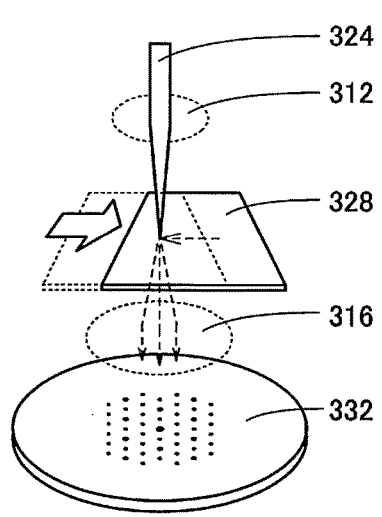

FIG. 5D illustrates an internal structure of the transmission electron diffraction measurement apparatus illustrated in FIG. 5C. In the transmission electron diffraction measurement apparatus, a substance 328 which is positioned in the sample chamber 314 is irradiated with electrons emitted from an electron gun installed in the electron gun chamber 310 through the optical system 312. Electrons passing through the substance 328 enter a fluorescent plate 332 provided in the observation chamber 320 through the optical system 316. On the fluorescent plate 332, a pattern corresponding to the intensity of the incident electron appears, which allows measurement of a transmission electron diffraction pattern.

The camera 318 is installed so as to face the fluorescent plate 332 and can take a picture of a pattern appearing in the fluorescent plate 332. An angle formed by a straight line which passes through the center of a lens of the camera 318 and the center of the fluorescent plate 332 and an upper surface of the fluorescent plate 332 is, for example, 15° or more and 80° or less, 30° or more and 75° or less, or 45° or more and 70° or less. As the angle is reduced, distortion of the transmission electron diffraction pattern taken by the camera 318 becomes larger. Note that if the angle is obtained in advance, the distortion of an obtained transmission electron diffraction pattern can be corrected. Note that the film chamber 322 may be provided with the camera 318. For example, the camera 318 may be set in the film chamber 322 so as to be opposite to the incident direction of electrons 324. In this case, a transmission electron diffraction pattern with less distortion can be taken from the rear surface of the fluorescent plate 332.

A holder for fixing the substance 328 that is a sample is provided in the sample chamber 314. The holder transmits electrons passing through the substance 328. The holder may have, for example, a function of moving the substance 328 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 328.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 324 that are a nanobeam in the substance, as illustrated in FIG. 5D. At this time, when the substance 328 is a CAAC-OS film, a diffraction pattern shown in FIG. 5A is observed. When the substance 328 is an nc-OS film, a diffraction pattern shown in FIG. 5B is observed.

Even when the substance 328 is a CAAC-OS film, a diffraction pattern similar to that of an nc-OS film or the like is partly observed in some cases. For this reason, the quality of the CAAC-OS film can be represented by the proportion of CAAC in some cases. Note that the proportion of CAAC refers to the proportion of a region where a diffraction pattern of a CAAC-OS film is observed, i.e., the proportion of a region where spots (luminescent spots) indicating alignment are observed in transmission electron diffraction measurement as shown in FIG. 5A. The proportion of CAAC in the oxide semiconductor film 17 in this embodiment is 70% or more and less than 100%, preferably 80% or more and less than 100%, further preferably 90% or more and less than 100%, still further preferably 95% or more and 98% or less when an observation area is changed one-dimensionally within a range of 300 nm in observation with a transmission electron diffraction measurement apparatus. That is, the oxide semiconductor film 17 in this embodiment has low impurity concentration and low density of defect states. Note that the proportion of a region where a diffraction pattern different from that of the CAAC-OS film is observed in a certain area is referred to as the proportion of not-CAAC.

An oxide semiconductor film with low carrier density is used as the oxide semiconductor film 17. For example, an oxide semiconductor film whose carrier density is lower than $1\times10^{17}/cm^3$, preferably lower than $1\times10^{15}/cm^3$, further preferably lower than $1\times10^{13}/cm^3$, still further preferably lower than $1\times10^{11}/cm^3$ is used as the oxide semiconductor film 17.

It is preferable to use, as the oxide semiconductor film 17, an oxide semiconductor film in which the impurity concentration is low and density of defect states is low, in which case the transistor can have excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus can have a low carrier density. A CAAC-OS film and an nc-OS film have a lower impurity concentration and a lower density of defect states than an a-like OS film and an amorphous oxide semiconductor film. That is, a CAAC-OS film and an nc-OS film are likely to be highly purified intrinsic or substantially highly purified intrinsic oxide semiconductor films. Thus, a transistor including a CAAC-OS film or an nc-OS film rarely has negative threshold voltage (is rarely normally on). The highly purified intrinsic or substantially highly purified intrinsic oxide semiconductor film has few carrier traps. The highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Therefore, a transistor including a CAAC-OS film or an nc-OS film has small variation in electrical characteristics and high reliability. An electric charge trapped by the carrier traps in the oxide semiconductor film takes a long time to be released. The trapped electric charge may behave like a fixed electric charge. Thus, the transistor in which a channel region is formed in the oxide semiconductor and which has a high impurity concentration and a high density of defect states might have unstable electrical characteristics.

The thickness of the oxide semiconductor film 17 is greater than or equal to 3 nm and less than or equal to 200 nm, preferably greater than or equal to 3 nm and less than or equal to 100 nm, further preferably greater than or equal to 3 nm and less than or equal to 50 nm.

Components of the transistor 10 will be described in detail below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like; a compound semiconductor substrate made of silicon germanium or the like; an SOI substrate; or the like can be used. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 10 may be provided directly on the flexible substrate. Further alternatively, a separation layer may be provided between the substrate 11 and the transistor 10. The separation layer can be used when part or the whole of a semiconductor device formed over the separation layer is separated from the substrate 11 and transferred onto another substrate. In such a case, the transistor 10 can be transferred to a substrate having low heat resistance or a flexible substrate as well.

The gate electrode 13 can be formed using a metal element selected from aluminum, chromium, copper, tantalum, titanium, molybdenum, and tungsten; an alloy containing any of these metal elements as a component; an alloy containing these metal elements in combination; or the like. Furthermore, one or more metal elements selected from manganese and zirconium may be used. The gate electrode 13 may have a single-layer structure or a stacked-layer structure of two or more layers. Examples of the structure of the gate electrode 13 include a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, and a three-layer structure in which a titanium film, an aluminum film, and a titanium film are stacked in this order. Alternatively, an alloy film or a nitride film which contains aluminum and one or more elements selected from titanium, tantalum, tungsten, molybdenum, chromium, neodymium, and scandium may be used.

The gate electrode 13 can also be formed using a light-transmitting conductive material such as indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

The gate insulating film 15 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, a gallium oxide film, a Ga—Zn-based metal oxide film, and a silicon nitride film.

The gate insulating film 15 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 15 is greater than or equal to 5 nm and less than or equal to 400 nm, preferably greater than or equal to 10 nm and less than or equal to 300 nm, further preferably greater than or equal to 50 nm and less than or equal to 250 nm.

The pair of electrodes 19 and 20 is formed with a single-layer structure or a stacked-layer structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; and the like can be given. Note that a transparent conductive material containing indium oxide, tin oxide, or zinc oxide may be used.

The gate insulating film 28 includes the oxide insulating film 23 in contact with the oxide semiconductor film 17, the oxide insulating film 25 in contact with the oxide insulating film 23, and the nitride insulating film 27 in contact with the oxide insulating film 25. The gate insulating film 28 preferably includes at least an oxide insulating film containing oxygen at higher proportion than the stoichiometric composition. Here, as the oxide insulating film 23, an oxide insulating film through which oxygen passes is formed. As the oxide insulating film 25, an oxide insulating film containing oxygen at higher proportion than the stoichiometric composition is formed. As the nitride insulating film 27, a nitride insulating film that blocks hydrogen and oxygen is formed. Although the gate insulating film 28 has a three-layer structure here, the gate insulating film 28 can have a single layer structure, a two-layer structure, or a stacked-layer structure including four or more layers as appropriate. Note that in these cases, at least an oxide insulating film containing oxygen at higher proportion than the stoichiometric composition is preferably included.

The oxide insulating film 23 is an oxide insulating film through which oxygen passes. Thus, oxygen released from the oxide insulating film 25 provided over the oxide insulating film 23 can be moved to the oxide semiconductor film 17 through the oxide insulating film 23. Moreover, the oxide insulating film 23 also serves as a film which relieves damage to the oxide semiconductor film 17 at the time of forming the oxide insulating film 25 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23. Note that in this specification, "silicon oxynitride film" refers to a film that contains more oxygen than nitrogen, and "silicon nitride oxide film" refers to a film that contains more nitrogen than oxygen.

It is preferable that the number of defects in the oxide insulating film 23 be small and typically, the spin density of a signal that appears at $g=2.001$ due to a dangling bond of silicon be lower than $3\times10^{17}$ spins/cm$^3$. The spin density is measured by electron spin resonance (ESR) spectroscopy. This is because if the density of defects in the oxide insulating film 23 is high, oxygen is bonded to the defects and the amount of oxygen that passes through the oxide insulating film 23 is decreased.

Furthermore, it is preferable that the number of defects at the interface between the oxide insulating film 23 and the oxide semiconductor film 17 be small, typically the spin density of a signal that appears at a g value (due to defects in the oxide semiconductor film 17) of greater than or equal to 1.89 and less than or equal to 1.96 be lower than $1\times10^{17}$ spins/cm$^3$, further preferably lower than or equal to the lower limit of detection by ESR spectroscopy.

Note that in the oxide insulating film 23, all oxygen having entered the oxide insulating film 23 from the outside moves to the outside in some cases. Alternatively, some oxygen having entered the oxide insulating film 23 from the outside remains in the oxide insulating film 23 in some cases. Furthermore movement of oxygen occurs in the oxide insulating film 23 in some cases in such a manner that oxygen enters the oxide insulating film 23 from the outside and oxygen contained in the oxide insulating film 23 is moved to the outside of the oxide insulating film 23.

The oxide insulating film 25 is formed in contact with the oxide insulating film 23. The oxide insulating film 25 is formed using an oxide insulating film which contains oxygen at higher proportion than the stoichiometric composition. Part of oxygen is released by heating from the oxide insulating film containing oxygen at higher proportion than the stoichiometric composition. The oxide insulating film in which the oxygen content is higher than that in the stoichiometric composition is an oxide insulating film that releases oxygen the amount of which (converted into the number of oxygen atoms) is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of a film surface in the TDS analysis is preferably higher than or equal to 100° C. and lower than or equal to 700° C. or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used for the oxide insulating film 25.

It is preferable that the amount of defects in the oxide insulating film 25 be small; as a typical example, the spin density of a signal that appears at $g=2.001$ originating from a dangling bond of silicon is preferably lower than $1.5\times10^{18}$ spins/cm$^3$, further preferably lower than or equal to $1\times10^{18}$ spins/cm$^3$ by ESR measurement. Note that the oxide insulating film 25 is provided more apart from the oxide semiconductor film 17 than the oxide insulating film 23 is; thus, the oxide insulating film 25 may have higher defect density than the oxide insulating film 23.

The nitride insulating film 27 has an effect of blocking at least hydrogen and oxygen. Preferably, the nitride insulating film 27 has an effect of blocking oxygen, hydrogen, water, an alkali metal, an alkaline earth metal, or the like. It is possible to prevent outward diffusion of oxygen from the oxide semiconductor film 17 and entry of hydrogen, water, or the like into the oxide semiconductor film 17 from the outside by providing the nitride insulating film 27 over the gate insulating film 28.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, aluminum oxide, aluminum oxynitride, gallium oxide, gallium oxynitride, yttrium oxide, yttrium oxynitride, hafnium oxide, and hafnium oxynitride can be given.

A light-transmitting conductive film is used for the electrode 32. The light-transmitting conductive film is formed using an indium tin oxide, an indium zinc oxide, an indium oxide containing tungsten oxide, an indium zinc oxide containing tungsten oxide, an indium oxide containing titanium oxide, an indium tin oxide containing titanium oxide, an indium tin oxide containing silicon oxide, or the like.

Next, a method for manufacturing the transistor 10 in FIGS. 1A to 1C is described with reference to FIGS. 6A to 6D, FIGS. 7A and 7B, and FIGS. 8A to 8C. Note that in FIGS. 6A to 6D, FIGS. 7A and 7B, and FIGS. 8A to 8C, cross-sectional views in the channel length direction along the dashed-dotted line A-B in FIG. 1A and cross-sectional views in the channel width direction along the dashed-dotted line C-D in FIG. 1A are illustrated.

The films included in the transistor 10 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

Figure 6A:
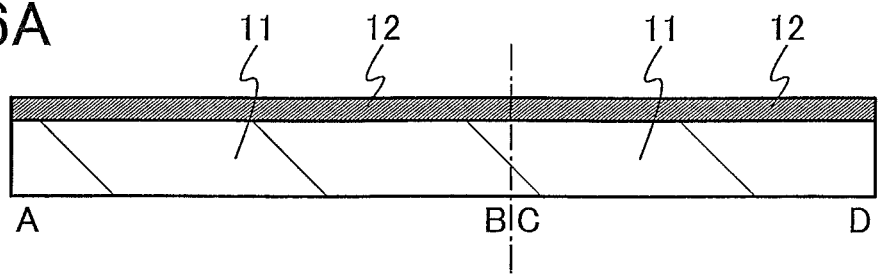
FIGS. 6A to 6D are cross-sectional views illustrating one mode of a method for manufacturing the transistor.
Figure 6B:
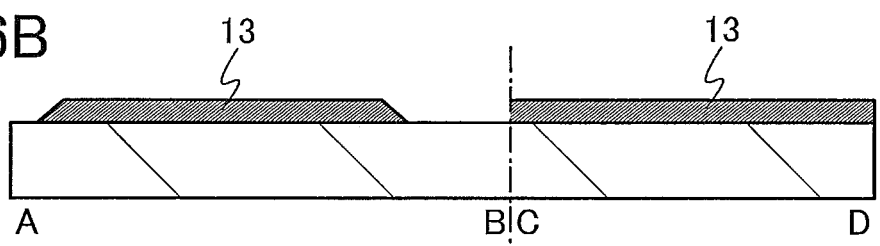

As illustrated in FIG. 6A, a conductive film 12 to be the gate electrode 13 is formed over the substrate 11.

Here, a glass substrate is used as the substrate 11.

The conductive film 12 is formed by a sputtering method, a vacuum evaporation method, a PLD method, a thermal CVD method, or the like.

Alternatively, a tungsten film can be formed with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

As the conductive film 12, a 100-nm-thick tungsten film is formed by a sputtering method.

Then, a mask is formed over the conductive film 12 by a photolithography process using a first photomask. Next, the conductive film 12 is partly etched using the mask to form the gate electrode 13. Then, the mask is removed (see FIG. 6B).

The conductive film 12 can be partly etched by one of or both wet etching and dry etching.

Here, a mask is formed by a photolithography process and the conductive film 12 is dry-etched using the mask to form the gate electrode 13.

Note that the gate electrode 13 may be formed by an electrolytic plating method, a printing method, an ink-jet method, or the like instead of the above formation method.

Figure 6C:
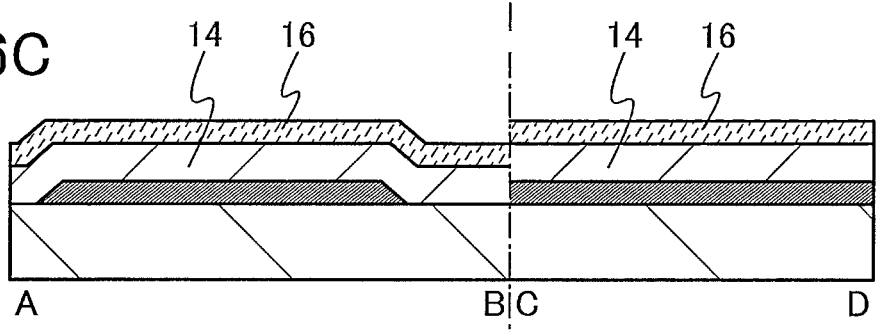
Figure 6D:
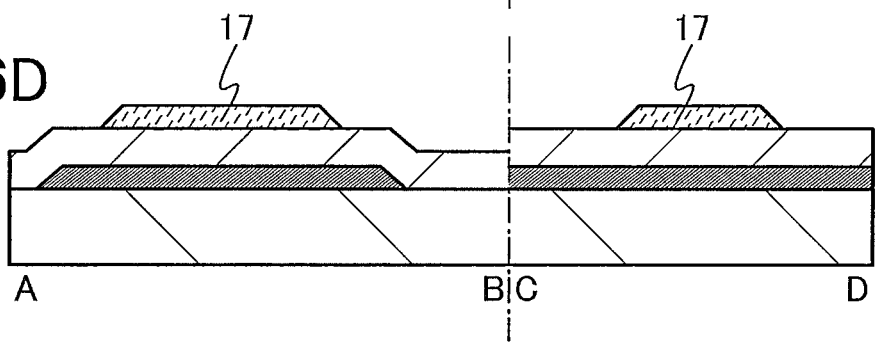

Next, as illustrated in FIG. 6C, an insulating film 14 to be the gate insulating film 15 is formed over the substrate 11 and the gate electrode 13, and an oxide semiconductor film 16 to be the oxide semiconductor film 17 is formed over the insulating film 14.

The insulating film 14 is formed by a sputtering method, a CVD method, a vacuum evaporation method, a PLD method, a thermal CVD method, or the like.

In the case where a silicon oxide film, a silicon oxynitride film, or a silicon nitride oxide film is formed as the insulating film 14, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the insulating film 14, a metal organic chemical vapor deposition (MOCVD) method can be employed.

In the case where a hafnium oxide film is formed as the insulating film 14 by the thermal CVD method such as a MOCVD method or an ALD method, two kinds of gases, i.e., ozone ($O_3$) as an oxidizer and a source material gas which is obtained by vaporizing liquid containing a solvent and a hafnium precursor compound (a hafnium alkoxide solution, typically tetrakis(dimethylamide)hafnium (TDMAH)) are used. Note that the chemical formula of tetrakis (dimethylamide)hafnium is $Hf[N(CH_3)_2]_4$. Examples of another material liquid include tetrakis(ethylmethylamide) hafnium.

In the case where an aluminum oxide film is formed as the insulating film 14 by the thermal CVD method such as the MOCVD method or the ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the insulating film 14 by the thermal CVD method such as the MOCVD method or the ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

The oxide semiconductor film 16 can be formed by a sputtering method, a pulsed laser deposition method, a laser ablation method, a thermal CVD method, or the like.

In the case where the oxide semiconductor film 16 is formed by a sputtering method, a power supply device for generating plasma can be an RF power supply device, an AC power supply device, a DC power supply device, or the like as appropriate.

As a sputtering gas, a rare gas (argon as a typical example), an oxygen gas, or a mixed gas of a rare gas and oxygen is used as appropriate. In the case of using the mixed gas of a rare gas and oxygen, the proportion of oxygen to a rare gas is preferably increased.

Furthermore, a target may be appropriately selected in accordance with the composition of the oxide semiconductor film 16 to be formed.

It is preferable that the oxide semiconductor film 16 be formed while the substrate is heated. The oxide semiconductor film 16 is preferably formed while the substrate temperature is set to 120° C. or higher and lower than 600° C., further preferably 150° C. or higher and lower than 450° C., still further preferably 150° C. or higher and lower than 350° C., yet still further preferably 150° C. or higher and lower than 250° C., in which case the oxide semiconductor film 16 becomes a CAAC-OS film including a plurality of crystal parts.

To make the oxide semiconductor film 16 intrinsic or substantially intrinsic, besides the high vacuum evacuation of the chamber, a highly purification of a sputtering gas is also needed. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film 16 can be prevented as much as possible.

For example, in the case where an oxide semiconductor film, e.g., an $InGaZnO_X$ (X>0) film is formed using a deposition apparatus employing ALD, an $In(CH_3)_3$ gas and an $O_3$ gas are sequentially introduced two or more times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an $InGaO_2$ layer, an $InZnO_2$ layer, a GaInO layer, a ZnInO layer, or a GaZnO layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ may be used. Instead of a $Ga(CH_3)_3$ gas, a $Ga(C_2H_5)_3$ gas may be used. Furthermore, a $Zn(CH_3)_2$ gas may be used.

Here, a 35-nm-thick In—Ga—Zn oxide film is formed as the oxide semiconductor film 16 by a sputtering method using an In—Ga—Zn oxide target (In:Ga:Zn=3:1:2). Note that the substrate temperature is set to 170° C., and an argon gas containing 50 vol % of oxygen is used as a sputtering gas.

Then, after a mask is formed over the oxide semiconductor film 16 by a photolithography process using a second photomask, the oxide semiconductor film 16 is partly etched using the mask. Thus, the oxide semiconductor film 17 subjected to element isolation is formed. After that, the mask is removed (see FIG. 6D).

The oxide semiconductor film 16 can be partly etched by one of or both wet etching and dry etching.

Here, the mask is formed by a photolithography process and the oxide semiconductor film 16 is wet-etched using the mask to form the oxide semiconductor film 17.

Then, heat treatment is performed at a temperature higher than 350° C. and lower than or equal to 650° C., preferably higher than or equal to 450° C. and lower than or equal to 600° C. Consequently, it is possible to obtain the oxide semiconductor film 17 in which the proportion of CAAC is 70% or more and less than 100%, preferably 80% or more and less than 100%, further preferably 90% or more and less than 100%, still further preferably 95% or more and 98% or less when an observation area is changed one-dimensionally within a range of 300 nm in observation with a transmission electron diffraction measurement apparatus. Furthermore, it is possible to obtain the oxide semiconductor film 17 having a low content of hydrogen, water, and the like. That is, an oxide semiconductor film with a low impurity concentration and a low density of defect states can be formed.

Note that the heat treatment may be performed in a period between the formation of the oxide semiconductor film 16 and the photolithography process using the second photomask.

Figure 7A:
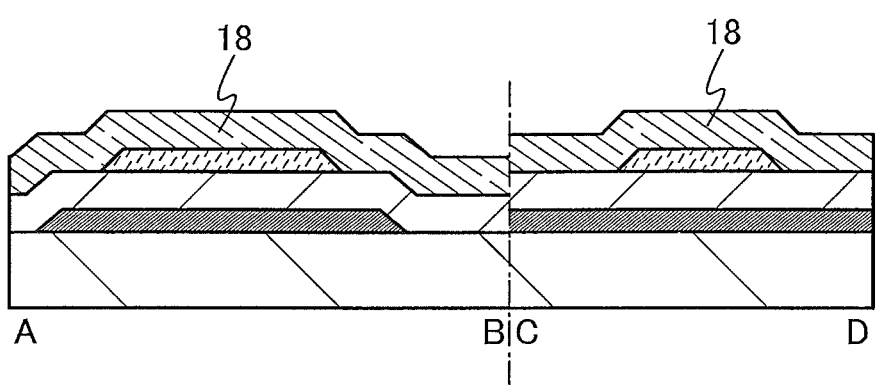
FIGS. 7A and 7B are cross-sectional views illustrating one mode of the method for manufacturing the transistor.

Next, as illustrated in FIG. 7A, a conductive film 18 to be the pair of electrodes 19 and 20 is formed.

The conductive film 18 is formed by a sputtering method, a vacuum evaporation method, a PLD method, a thermal CVD method, or the like.

Here, a 50-nm-thick tungsten film and a 300-nm-thick copper film are sequentially stacked by a sputtering method to form the conductive film 18.

Next, a mask is formed over the conductive film 18 by a photolithography process using a third photomask. Then, the conductive film 18 is etched using the mask, so that the pair of electrodes 19 and 20 is formed. After that, the mask is removed (see FIG. 7B).

Here, the mask is formed over the conductive film 18 by the photolithography process. Then, the tungsten film and the copper film are etched using the mask to form the pair of electrodes 19 and 20. Note that in the case where the copper film is etched by a wet etching method first and then the tungsten film is etched by a dry etching method using $SF_6$, fluoride is formed on the surface of the copper film. By the fluoride, diffusion of copper elements from the copper film is reduced and thus the copper concentration in the oxide semiconductor film 17 can be reduced.

Figure 8A:
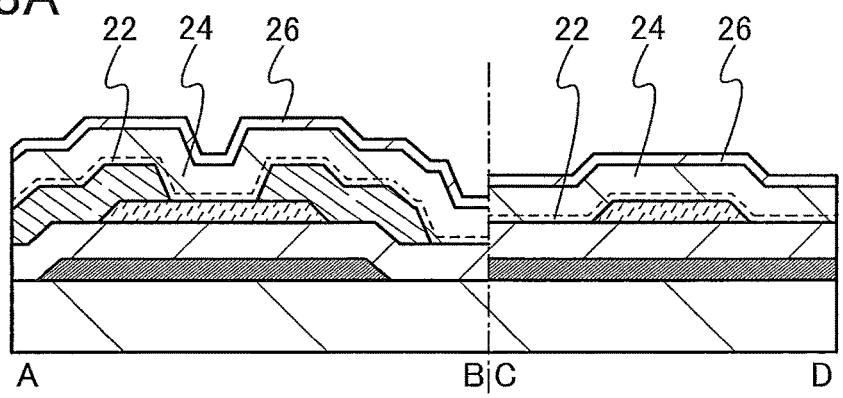
FIGS. 8A to 8C are cross-sectional views illustrating one mode of the method for manufacturing the transistor.

Next, as illustrated in FIG. 8A, an oxide insulating film 22 to be the oxide insulating film 23 and an oxide insulating film 24 to be the oxide insulating film 25 are formed over the oxide semiconductor film 17 and the pair of electrodes 19 and 20.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor film 17; accordingly, oxygen vacancies in the oxide semiconductor film 17 can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which permeates oxygen can be formed as the oxide insulating film 22. Further, by providing the oxide insulating film 22, damage to the oxide semiconductor film 17 can be reduced in a step of forming the oxide insulating film 25 which is formed later.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 22, a dense and hard oxide insulating film which is permeated by oxygen, typically, a silicon oxide film or a silicon oxynitride film having an etching rate lower than or equal to 10 nm/min, preferably lower than or equal to 8 nm/min when etching is performed at 25° C. using hydrofluoric acid of 0.5 wt % can be formed.

In the case where hydrogen, water, and the like are contained in the oxide semiconductor film 17, the hydrogen, water, and the like can be removed in this step because the oxide insulating film 22 is formed while heating is performed. Hydrogen contained in the oxide semiconductor film 17 is bonded to an oxygen radical formed in plasma to form water. Since the substrate is heated in the step of forming the oxide insulating film 22, water formed by bonding of oxygen and hydrogen is released from the oxide semiconductor film 17. That is, when the oxide insulating film 22 is formed by a plasma CVD method, the amount of water and hydrogen contained in the oxide semiconductor film 17 can be reduced.

Time for heating in a state where the oxide semiconductor film 17 is exposed can be shortened because heating is performed in a step of forming the oxide insulating film 22. Thus, the amount of oxygen released from the oxide semiconductor film by heat treatment can be reduced. That is, oxygen vacancies in the oxide semiconductor film 17 can be reduced.

Furthermore, by setting the pressure in the treatment chamber to be greater than or equal to 100 Pa and less than or equal to 250 Pa, damage to the oxide semiconductor film 17 can be reduced when the oxide insulating film 22 is formed, so that oxygen vacancies contained in the oxide semiconductor film 17 can be reduced. In particular, when the film formation temperature of the oxide insulating film 22 or the oxide insulating film 24 which is formed later is set to be high, typified by a temperature higher than 220° C., part of oxygen contained in the oxide semiconductor film 17 is released and oxygen vacancies are easily formed. In addition, when the film formation conditions for reducing the amount of defects in the oxide insulating film 24 which is formed later are used to increase reliability of the transistor, the amount of released oxygen is easily reduced. Thus, it is difficult to reduce oxygen vacancies in the oxide semiconductor film 17 in some cases. However, by setting the pressure in the treatment chamber to be greater than or equal to 100 Pa and less than or equal to 250 Pa to reduce damage to the oxide semiconductor film 17 at the time of forming the oxide insulating film 22, oxygen vacancies in the oxide semiconductor film 17 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor film 17 can be reduced; thus, the negative shift in the threshold voltage of the transistor can be inhibited.

Here, as the oxide insulating film 22, a 50-nm-thick silicon oxynitride film is formed by a plasma CVD method in which silane at a flow rate of 30 sccm and dinitrogen monoxide at a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which permeates oxygen can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 22 is provided over the oxide semiconductor film 17. Accordingly, in the step of forming the oxide insulating film 24, the oxide insulating film 22 serves as a protective film of the oxide semiconductor film 17. Consequently, the oxide insulating film 24 can be formed using the high-frequency power having a high power density while damage to the oxide semiconductor film 17 is reduced.

Here, as the oxide insulating film 24, a 400-nm-thick silicon oxynitride film is formed by a plasma CVD method in which silane at a flow rate of 200 sccm and dinitrogen monoxide at a flow rate of 4000 sccm are used as the source gas, the pressure in the reaction chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, preferably 1 ppm or less, further preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 24 can be moved to the oxide semiconductor film 17, so that oxygen vacancies contained in the oxide semiconductor film 17 can be further reduced.

In the case where the oxide insulating film 22 and the oxide insulating film 24 contain water, hydrogen, or the like, water, hydrogen, or the like contained in the oxide insulating film 22 and the oxide insulating film 24 is moved to the oxide semiconductor film 17 by heat treatment performed after a nitride insulating film 26 that blocks water, hydrogen, and the like is formed, so that defects are generated in the oxide semiconductor film 17. However, when the heat treatment is performed prior to formation of the nitride insulating film 26, water, hydrogen, or the like contained in the oxide insulating film 22 and the oxide insulating film 24 can be released; thus, variation in electrical characteristics of the transistor 10 can be reduced, and change in threshold voltage can be inhibited.

Note that when the oxide insulating film 24 is formed over the oxide insulating film 22 while being heated, oxygen can be moved to the oxide semiconductor film 17 to reduce the oxygen vacancies in the oxide semiconductor film 17; thus, the heat treatment needs not to be performed.

Here, heat treatment is performed at 350° C. for one hour in an atmosphere of nitrogen and oxygen.

Furthermore, when the pair of electrodes 19 and 20 is formed, the oxide semiconductor film 17 is damaged by the etching of the conductive film, so that oxygen vacancies are generated on the back channel side (the side of the oxide semiconductor film 17 which is opposite to the side facing to the gate electrode 13) of the oxide semiconductor film 17. However, with the use of the oxide insulating film containing oxygen at a higher proportion than the stoichiometric composition as the oxide insulating film 24, the oxygen vacancies generated on the back channel side can be reduced by heat treatment. As a result, the reliability of the transistor 10 can be improved.

Next, the nitride insulating film 26 to be the nitride insulating film 27 is formed by a sputtering method, a CVD method, a thermal CVD method, a vacuum evaporation method, a PLD method, or the like.

Note that in the case where the nitride insulating film 26 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 26, a deposition gas containing silicon, nitrogen, and ammonia are preferably used as a source gas. As the source gas, ammonia whose amount is smaller than the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Thus, in a source gas, the flow ratio of the nitrogen to the ammonia is set to be preferably greater than or equal to 5 and less than or equal to 50, more preferably greater than or equal to 10 and less than or equal to 50.

Here, in the reaction chamber of a plasma CVD apparatus, a 50-nm-thick silicon nitride film is formed as the nitride insulating film 26 by a plasma CVD method in which silane at a flow rate of 50 sccm, nitrogen at a flow rate of 5000 sccm, and ammonia at a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 cm², and the power per unit area (power density) into which the supplied power is converted is $1.7 \times 10^{-1}$ W/cm².

Through the above-described steps, the oxide insulating film 22, the oxide insulating film 24, and the nitride insulating film 26 can be formed.

Next, heat treatment may be performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

Next, a mask is formed over the nitride insulating film 26 by a photolithography process using a fourth photomask, and then each of the oxide insulating film 22, the oxide insulating film 24, and the nitride insulating film 26 is partly etched using the mask to form the oxide insulating film 23, the oxide insulating film 25, and the nitride insulating film 27. Note that the oxide insulating film 23, the oxide insulating film 25, and the nitride insulating film 27 have an opening 41 as illustrated in the cross-sectional view along A-B of FIG. 8B.

Figure 8B:
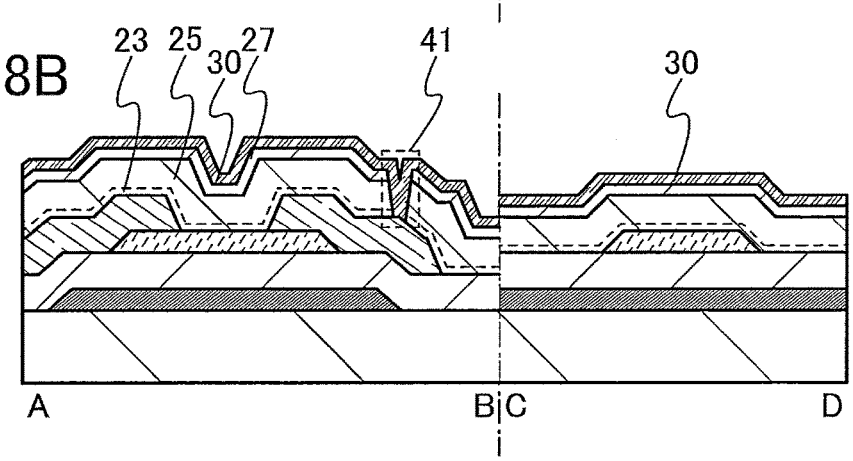
Figure 8C:
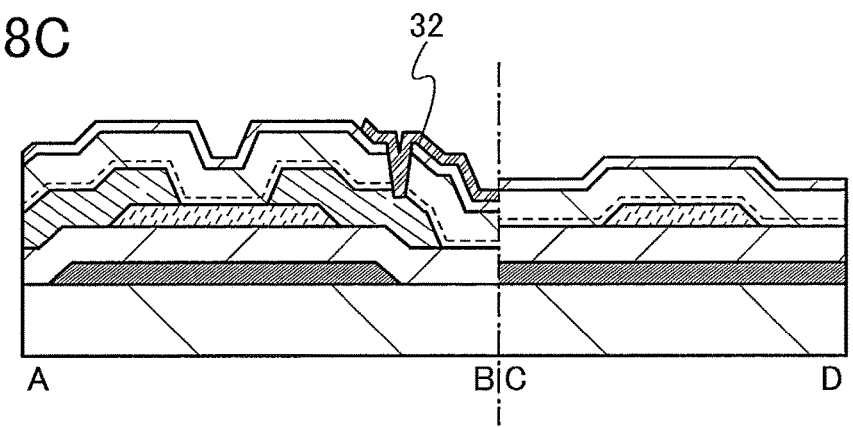

Then, as illustrated in FIG. 8B, a conductive film 30 to be the electrode 32 is formed.

The conductive film 30 is formed by a sputtering method, a CVD method, an evaporation method, or the like.

Here, a 100-nm-thick ITO film is formed as the conductive film 30 by a sputtering method.

Then, a mask is formed over the conductive film 30 by a photolithography process using a fifth photomask. Next, the conductive film 30 is partly etched using the mask to form the electrode 32. After that, the mask is removed.

Through the above process, the transistor 10 can be manufactured. Including the oxide semiconductor film with a high proportion of CAAC, the transistor 10 has excellent electrical characteristics and high reliability.

Modification Example 1

Figure 38A:
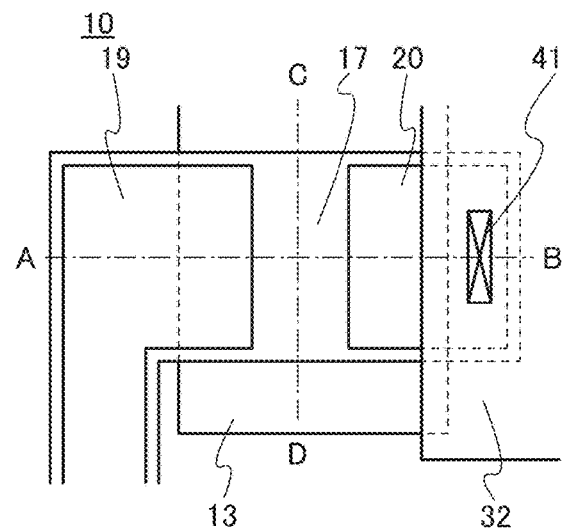
FIGS. 38A to 38C are a top view and cross-sectional views illustrating one mode of a transistor.
Figure 38C:
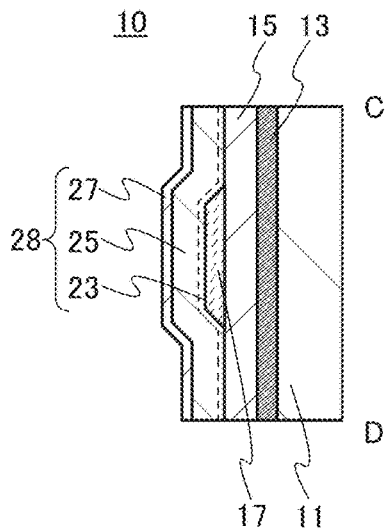
Figure 38B:
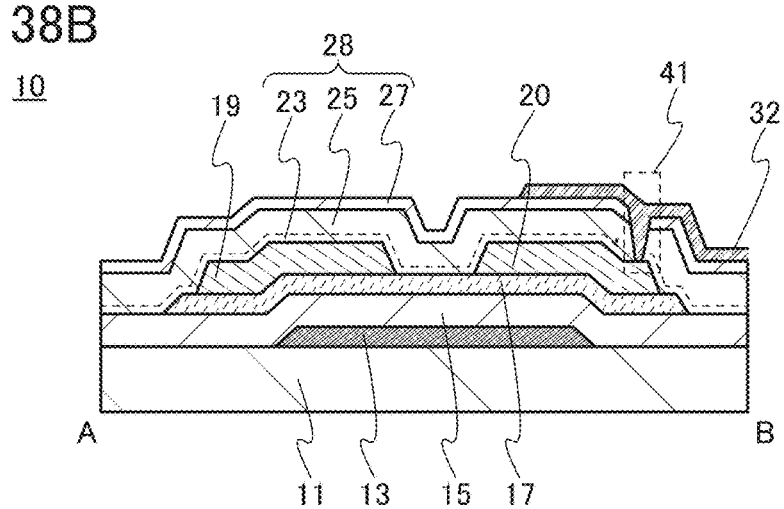

In the method for manufacturing the transistor 10, formation of the pair of electrodes 19 and 20 the oxide semiconductor film 17 with the use of a half-tone mask (alternatively, a gray-tone mask, a phase-shift mask, or the like) can reduce the number of masks and the number of process steps. In this case, a resist mask for forming the pair of electrodes 19 and 20 is formed by performing ashing on a resist mask for forming the oxide semiconductor film 17, for example. For this reason, the oxide semiconductor film 17 is provided under the entire region of the pair of electrodes 19 and 20. FIG. 38A is a plan view of the transistor 10 in FIGS. 1A to 1C that is manufactured with the use of a half-tone mask, and FIGS. 38B and 38C are cross-sectional views thereof. Note that the oxide semiconductor film and the pair of electrodes can be formed with the use of a half-tone mask also in other embodiments.

Modification Example 2

Figure 39A:
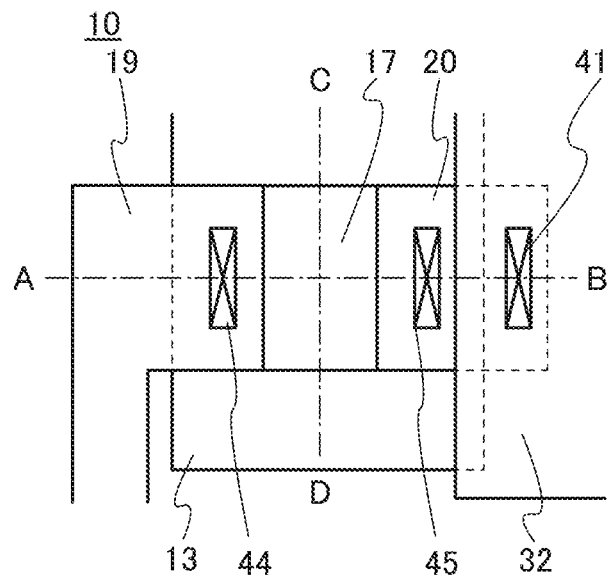
FIGS. 39A to 39C are a top view and cross-sectional views illustrating one mode of a transistor.
Figure 39C:
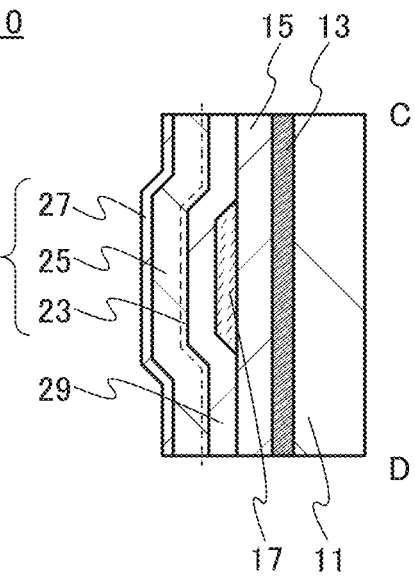
Figure 39B:
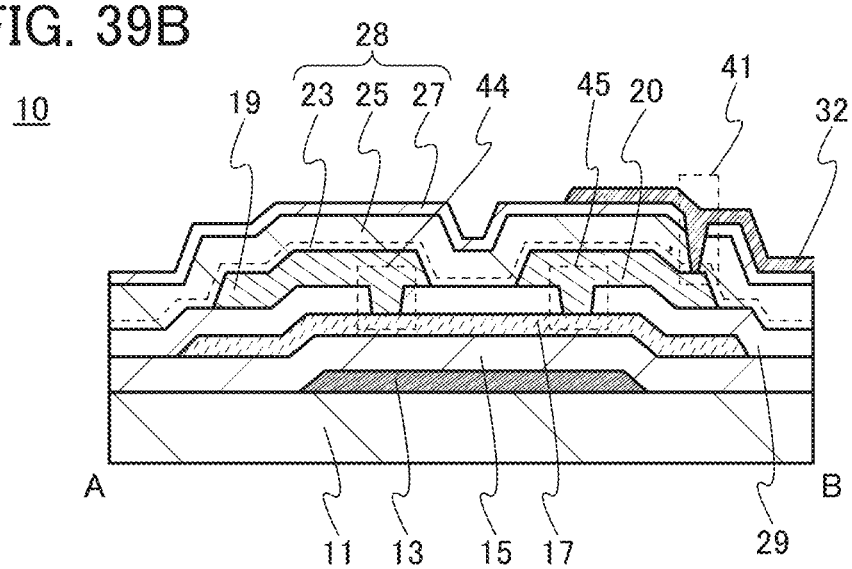

In the method for manufacturing the transistor 10, an insulating film 29 may be provided between the oxide semiconductor film 17 and the pair of electrodes 19 and 20. In this case, as illustrated in FIGS. 39A to 39C, the oxide semiconductor film 17 is connected to the pair of electrodes 19 and 20 in an opening 44 and an opening 45. The insulating film 29 can be formed using a material similar to that of the gate insulating film 15, the oxide insulating film 25, or the nitride insulating film 27. Note that the insulating film 29 may be provided only over a channel region of the oxide semiconductor film 17.

Modification Example 3

A transistor including the oxide semiconductor film 17 and the pair of electrodes 19 and 20 different from those in the transistor 10 in this embodiment will be described. Note that this embodiment can be applied to other transistors as appropriate.

As for the pair of electrodes 19 and 20 provided in the transistor, it is possible to use a conductive material which is easily bonded to oxygen, such as tungsten, titanium, aluminum, copper, molybdenum, chromium, or tantalum, or an alloy thereof. Thus, oxygen contained in the oxide semiconductor film 17 and the conductive material contained in the pair of electrodes 19 and 20 are bonded to each other, so that an oxygen deficient region is formed in the oxide semiconductor film 17. Furthermore, in some cases, part of constituent elements of the conductive material that forms the pair of electrodes 19 and 20 is mixed into the oxide semiconductor film 17. Consequently, low-resistance regions are formed in the vicinity of regions of the oxide semiconductor film 17 which are in contact with the pair of electrodes 19 and 20. The low-resistance regions are in contact with the pair of electrodes 19 and 20 and are formed between the gate insulating film 15 and the pair of electrodes 19 and 20. Since the low-resistance regions have high conductivity, contact resistance between the oxide semiconductor film 17 and the pair of electrodes 19 and 20 can be reduced, and thus, the on-state current of the transistor can be increased.

Note that end portions of the low-resistance regions may be substantially aligned with the end portions of the pair of electrodes 19 and 20. Alternatively, the end portions of the low-resistance regions may overlap with a region between the end portions of the pair of electrodes 19 and 20. In the case where the low-resistance regions are formed in the oxide semiconductor film 17, a channel length is the distance between the low-resistance regions at the interface between the gate insulating film 28 and the oxide semiconductor film 17.

Furthermore, the pair of electrodes 19 and 20 may have a stacked-layer structure including the conductive material which is easily bonded to oxygen and a conductive material which is not easily bonded to oxygen, such as titanium nitride, tantalum nitride, or ruthenium. With such a stacked-layer structure, oxidization of the pair of electrodes 19 and 20 can be prevented at the interface between the oxide insulating film 23 and the pair of electrodes 19 and 20, so that an increase in the resistance of the pair of electrodes 19 and 20 can be inhibited.

<Deposition Model>

Examples of deposition models of a CAAC-OS film and an nc-OS film are described below.

FIG. 46A is a schematic view of the inside of a deposition chamber where a CAAC-OS film is deposited by a sputtering method.

A target 5130 is attached to a backing plate. A plurality of magnets are provided to face the target 5130 with the backing plate positioned therebetween. The plurality of magnets generate a magnetic field. A sputtering method in which the disposition rate is increased by utilizing a magnetic field of magnets is referred to as a magnetron sputtering method.

The target 5130 has a polycrystalline structure in which a cleavage plane exists in at least one crystal grain.

Figure 47A:
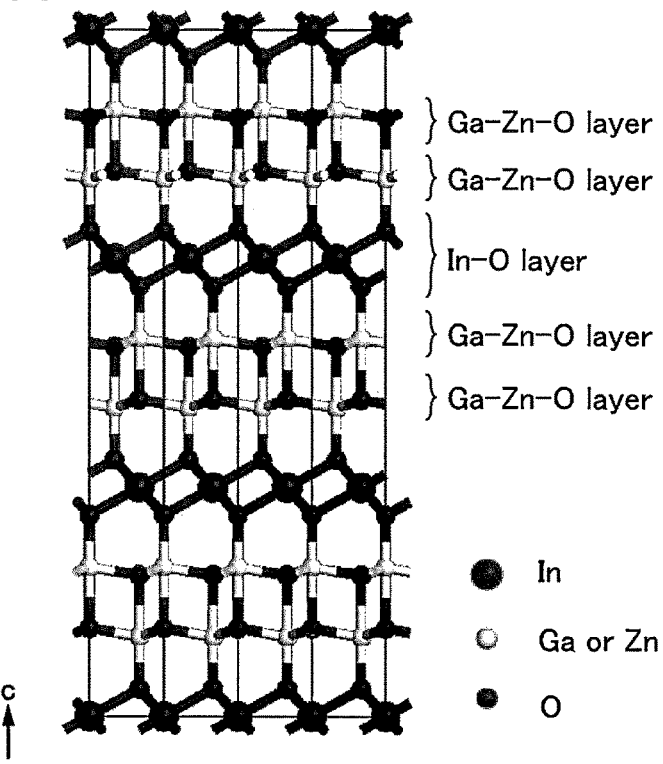
FIGS. 47A to 47C show an InGaZnO$_4$ crystal and a pellet.

A cleavage plane of the target 5130 including an In—Ga—Zn oxide is described as an example. FIG. 47A shows a structure of an InGaZnO$_4$ crystal included in the target 5130. Note that FIG. 47A shows a structure of the case where the InGaZnO$_4$ crystal is observed from a direction parallel to the b-axis when the c-axis is in an upward direction.

FIG. 47A indicates that oxygen atoms in a Ga—Zn—O layer are positioned close to those in an adjacent Ga—Zn—O layer. The oxygen atoms have negative electric charge, whereby the two Ga—Zn—O layers repel each other. As a result, the InGaZnO$_4$ crystal has a cleavage plane between the two adjacent Ga—Zn—O layers.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

The ion 5101 is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 47B:
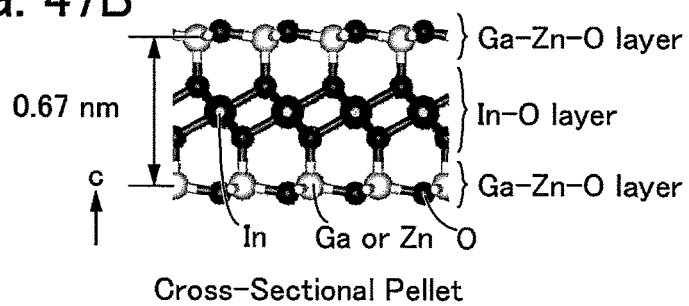
Figure 47C:
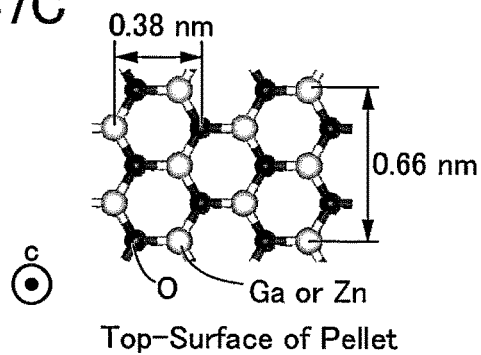

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 45. For example, in the case where the ion 5101 collides with the target 5130 including an In—Ga—Zn oxide, the pellet 5100 that includes three layers of a Ga—Zn—O layer, an In—O layer, and a Ga—Zn—O layer as shown in FIG. 47B is ejected. Note that FIG. 47C shows the structure of the pellet 5100 observed from a direction parallel to the c-axis. Therefore, the pellet 5100 has a nanometer-sized sandwich structure including two Ga—Zn—O layers and an In—O layer.

The pellet 5100 may receive a charge when passing through the plasma, so that side surfaces thereof are negatively or positively charged. The pellet 5100 includes an oxygen atom on its side surface, and the oxygen atom may be negatively charged. In this manner, when the side surfaces are charged with the same polarity, electric charges repel each other, and accordingly, the pellet 5100 can maintain a flat-plate shape. In the case where a CAAC-OS film is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxide atom, or the like when passing through plasma. A difference in size between (2) and (1) in FIG. 45 corresponds to the amount of growth in plasma. Here, in the case where the temperature of the substrate 5120 is at around room temperature, the pellet 5100 does not grow anymore; thus, an nc-OS is formed (see FIG. 46B). An nc-OS film can be deposited when the substrate 5120 has a large size because a temperature at which the deposition of an nc-OS film is carried out is approximately room temperature. Note that in order that the pellet 5100 grows in plasma, it is effective to increase deposition power in sputtering. High deposition power can stabilize the structure of the pellet 5100.

As shown in FIGS. 46A and 46B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to increase a force applied to the pellet 5100, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 46A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS film might be filled; thus, the CAAC-OS film has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS film.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS film does not have a structure like a board of a single crystal oxide semiconductor but has arrangement with a group of pellets 5100 (nanocrystals) like stacked bricks or blocks. Furthermore, a grain boundary does not exist therebetween. Therefore, even when deformation such as shrink occurs in the CAAC-OS film owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target is sputtered with an ion, in addition to the pellets, zinc oxide or the like may be ejected. The zinc oxide is lighter than the pellet and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 48A to 48D are cross-sectional schematic views.

Figure 48A:
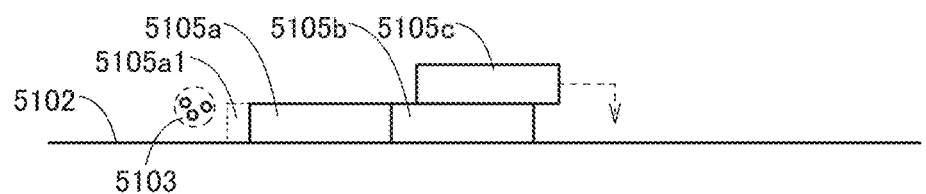
FIGS. 48A to 48D are schematic views showing a deposition model of a CAAC-OS film.

As illustrated in FIG. 48A, a pellet 5105*a* and a pellet 5105*b* are deposited over the zinc oxide layer 5102. Here, side surfaces of the pellet 5105*a* and the pellet 5105*b* are in contact with each other. In addition, a pellet 5105*c* is deposited over the pellet 5105*b*, and then glides over the pellet 5105*b*. Furthermore, a plurality of particles 5103 ejected from the target together with the zinc oxide are crystallized by heating of the substrate 5120 to form a region 5105*a*1 on another side surface of the pellet 5105*a*. Note that the plurality of particles 5103 may contain oxygen, zinc, indium, gallium, or the like.

Figure 48B:
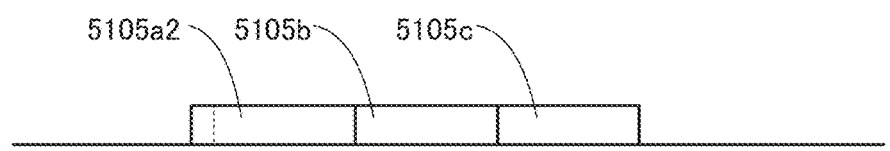

Then, as illustrated in FIG. 48B, the region 5105*a*1 grows to part of the pellet 5105*a* to form a pellet 5105*a*2. In addition, a side surface of the pellet 5105*c* is in contact with another side surface of the pellet 5105*b*.

Figure 48C:
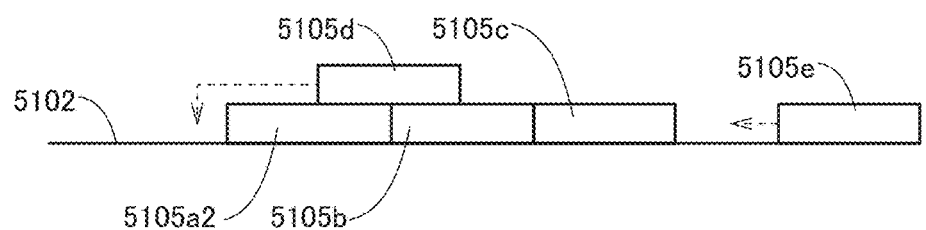

Next, as illustrated in FIG. 48C, a pellet 5105*d* is deposited over the pellet 5105*a*2 and the pellet 5105*b*, and then glides over the pellet 5105*a*2 and the pellet 5105*b*. Furthermore, a pellet 5105*e* glides toward another side surface of the pellet 5105*c* over the zinc oxide layer 5102.

Figure 48D:
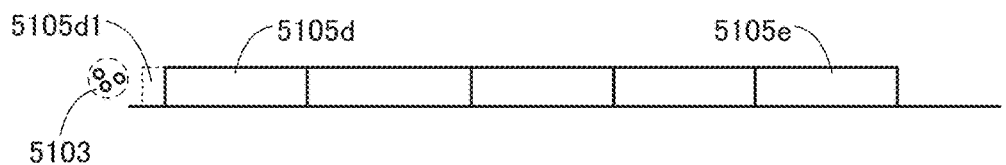

Then, as illustrated in FIG. 48D, the pellet 5105*d* is placed so that a side surface of the pellet 5105*d* is in contact with a side surface of the pellet 5105*a*2. Furthermore, a side surface of the pellet 5105*e* is in contact with another side surface of the pellet 5105*c*. A plurality of particles 5103 ejected from the target together with the zinc oxide are crystallized by heating of the substrate 5120 to form a region 5105*d*1 on another side surface of the pellet 5105*d*.

As described above, deposited pellets are placed to be in contact with each other and then growth is caused at side surfaces of the pellets, whereby a CAAC-OS film is formed over the substrate 5120. Therefore, each pellet of the CAAC-OS film is larger than that of the nc-OS film. A difference in size between (3) and (2) in FIG. 45 corresponds to the amount of growth after deposition.

When spaces between pellets 5100 are extremely small, the pellets may form a large pellet. The large pellet has a single crystal structure. For example, the size of the large pellet may be greater than or equal to 10 nm and less than or equal to 200 nm, greater than or equal to 15 nm and less than or equal to 100 nm, or greater than or equal to 20 nm and less than or equal to 50 nm, when seen from the above. Therefore, when a channel formation region of a transistor is smaller than the large pellet, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS film can be deposited even when a formation surface does not have a crystal structure, which is different from film deposition by epitaxial growth. For example, even when the top surface (formation surface) of the substrate 5120 has an amorphous structure (e.g., the top surface is formed of amorphous silicon oxide), a CAAC-OS film can be formed.

In addition, it is found that in formation of the CAAC-OS film, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS film can be obtained.

In the case where the top surface of the substrate 5120 has unevenness, a CAAC-OS film in which n layers (n is a natural number) in each of which the pellets 5100 are arranged along the unevenness are stacked is formed. Since the substrate 5120 has unevenness, a gap is easily generated between the pellets 5100 in the CAAC-OS film in some cases. Note that owing to intermolecular force, the pellets 5100 are arranged so that a gap between the pellets is as small as possible even on the unevenness surface. Therefore, even when the formation surface has unevenness, a CAAC-OS film with high crystallinity can be obtained.

As a result, laser crystallization is not needed for formation of a CAAC-OS film, and a uniform film can be formed even over a large-sized glass substrate or the like.

Since a CAAC-OS film is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS film with high crystallinity can be formed even on a formation surface with an amorphous structure.

Note that the structures, methods, and the like described in this embodiment can be used as appropriate in combination with any of the structures, methods, and the like described in the other embodiments.

Embodiment 2

In this embodiment, a semiconductor device of one embodiment of the present invention and a method for manufacturing the semiconductor device will be described with reference to drawings. Note that a transistor in this embodiment is different from that in Embodiment 1 in that two gate electrodes are included with an oxide semiconductor film provided therebetween.

Figure 9A:
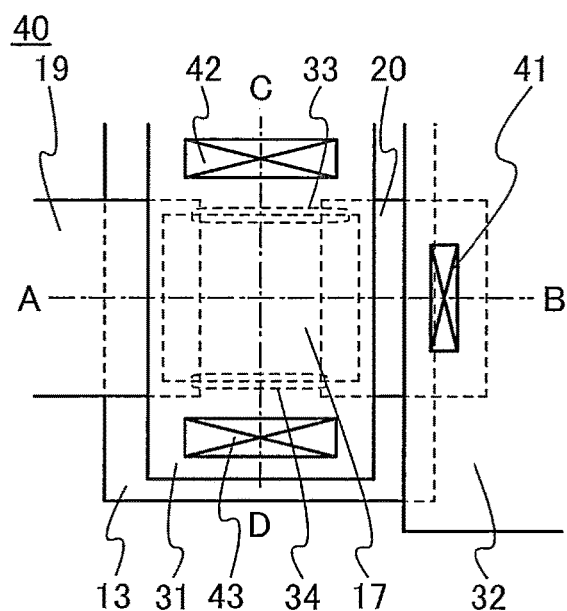
FIGS. 9A to 9C are a top view and cross-sectional views illustrating one embodiment of a transistor.
Figure 9C:
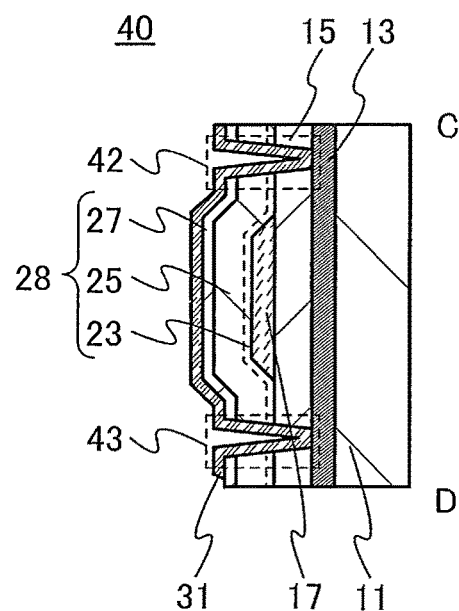
Figure 9B:
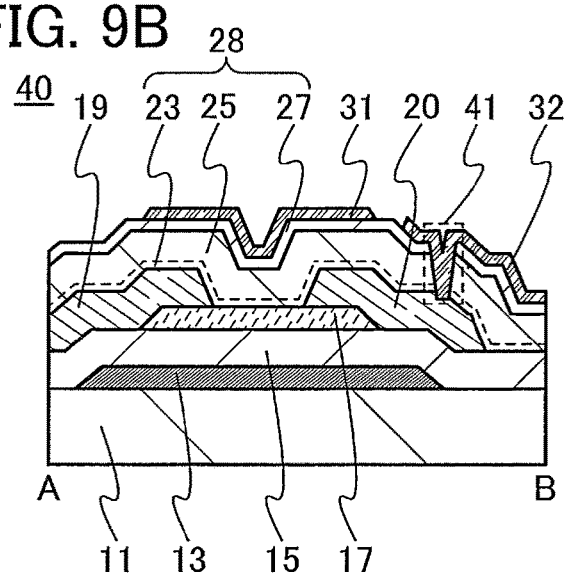

FIGS. 9A to 9C are a top view and cross-sectional views of a transistor 40 included in a semiconductor device. FIG. 9A is a top view of the transistor 40, FIG. 9B is a cross-sectional view taken along dashed line A-B in FIG. 9A, and FIG. 9C is a cross-sectional view taken along dashed line C-D in FIG. 9A. Note that in FIG. 9A, the substrate 11, the gate insulating film 15, the oxide insulating film 23, the oxide insulating film 25, the nitride insulating film 27, and the like are omitted for simplicity.

The transistor 40 illustrated in FIGS. 9B and 9C is a channel-etched transistor including the gate electrode 13 provided over the substrate 11; the gate insulating film 15 formed over the substrate 11 and the gate electrode 13; the oxide semiconductor film 17 overlapping with the gate electrode 13 with the gate insulating film 15 provided therebetween; and the pair of electrodes 19 and 20 in contact with the oxide semiconductor film 17. The transistor 40 further includes an insulating film 28 that is composed of the oxide insulating film 23, the oxide insulating film 25, and the nitride insulating film 27 and is over the insulating film 15, the oxide semiconductor film 17, and the pair of electrodes 19 and 20; and a gate electrode 31 formed over the gate insulating film 28. The gate electrode 31 is connected to the gate electrode 13 in an opening 42 and an opening 43 that are provided in the gate insulating film 15 and the gate insulating film 28. In addition, the electrode 32 in contact with one of the pair of electrodes 19 and 20 (here, the electrode 20) is formed over the nitride insulating film 27. Note that the electrode 32 serves as a pixel electrode.

In the channel width direction of the transistor 40 in this embodiment, the oxide semiconductor film 17 is provided between the gate electrode 13 and the gate electrode 31 with the gate insulating film 15 provided between the gate electrode 13 and the oxide semiconductor film 17 and with the gate insulating film 28 provided between the gate electrode 31 and the oxide semiconductor film 17. As illustrated in FIG. 9A, the gate electrode 31 overlaps with end portions of the oxide semiconductor film 17 with the gate insulating film 28 provided therebetween, when seen from the above. The channel length is preferably 0.5 µm or more and 6.5 µm or less, further preferably more than 1 µm and 2.5 µm or less.

A plurality of openings are provided in the gate insulating film 15 and the gate insulating film 28. As a typical example, as illustrated in FIG. 9B, the opening 41 that reaches one of the pair of electrodes 19 and 20 is provided. Furthermore, as illustrated in FIG. 9C, the openings 42 and 43 are provided with the oxide semiconductor film 17 provided therebetween in the channel width direction. That is, the openings 42 and 43 are provided on outer sides of the side surfaces of the oxide semiconductor film 17. In the opening 41, one of the pair of electrodes 19 and 20 (here, the electrode 20) is connected to the electrode 32. In the openings 42 and 43, the gate electrode 13 is connected to the gate electrode 31. This means that the gate electrode 13 and the gate electrode 31 surround the oxide semiconductor film 17 in the channel width direction with the gate insulating film 15 provided between the oxide semiconductor film 17 and the gate electrode 13 and with the gate insulating film 28 provided between the oxide semiconductor film 17 and the gate electrode 31. Furthermore, in the channel width direction, the gate electrode 31 in the openings 42 and 43 and each of the side surfaces of the oxide semiconductor film 17 are provided so that the gate insulating film 28 is positioned therebetween.

The gate electrode 13 and the gate electrode 31 are included, the potentials of the gate electrode 13 and the gate electrode 31 are set equal to each other, the side surfaces of the oxide semiconductor film 17 face the gate electrode 31, and the gate electrode 13 and the gate electrode 31 surround the oxide semiconductor film 17 in the channel width direction with the gate insulating film 15 provided between the oxide semiconductor film 17 and the gate electrode 13 and with the gate insulating film 28 provided between the oxide semiconductor film 17 and the gate electrode 31; thus, carriers flow not only at the interfaces between the oxide semiconductor film 17 and the gate insulating films 15 and 28 but also in a wide region in the oxide semiconductor film 17, which results in an increase in the number of carriers that move in the transistor 40. As a result, the on-state current of the transistor 40 is increased, and the field-effect mobility is increased to greater than or equal to 10 $cm^2/V \cdot s$ or to greater than or equal to 20 $cm^2/V \cdot s$, for example. Note that here, the field-effect mobility is not an approximate value of the mobility as the physical property of the oxide semiconductor film but is an index of current drive capability and the apparent field-effect mobility of a saturation region of the transistor. Note that an increase in field-effect mobility becomes significant when the channel length (also referred to as L length) of the transistor is more than or equal to 0.5 µm and less than or equal to 6.5 µm, preferably more than 1 µm and less than 2.5 µm. With a short channel length more than or equal to 0.5 µm and less than or equal to 6.5 µm, the channel width can also be short. For this reason, the area of the transistor can be reduced even when a plurality of connection portions of the gate electrode 13 and the gate electrode 31 are provided.

Defects are formed at an end portion of the oxide semiconductor film 17 processed by etching or the like because of damage due to the processing, and the end portion of the oxide semiconductor film 17 is polluted by attachment of impurities, or the like. For this reason, in the case where only one of the gate electrode 13 and the gate electrode 31 is formed in the transistor, even when the oxide semiconductor film 17 is intrinsic or substantially intrinsic, the end portions of the oxide semiconductor film 17 are easily activated to be n-type regions (low-resistance regions) by application of stress such as an electric field. In the case where the n-type end portions overlap with regions between the pair of electrodes 19 and 20, which are surrounded by the dashed lines 33 and 34 in FIG. 9A, for example, the n-type regions serve as carrier paths, resulting in formation of a parasitic channel. Consequently, the drain current of the transistor is gradually increased at voltages near the threshold voltage, and the threshold voltage is shifted in the negative direction. However, the transistor illustrated in FIG. 9C includes the gate electrode 13 and the gate electrode 31 having the same potentials, and in the channel width direction, the gate electrode 31 and each of the side surfaces of the gate electrode 31 and the oxide semiconductor film 17 are provided so that the gate insulating film 28 is positioned therebetween, whereby an electric field from the gate electrode 31 also affects the side surfaces of the oxide semiconductor film 17. As a result, a parasitic channel is inhibited from being generated at the end portions of the oxide semiconductor film 17. Thus, the drain current of the transistor is not gradually increased at voltages near the threshold voltage and the transistor has excellent electrical characteristics.

Each of the gate electrode 13 and the gate electrode 31 has a function of blocking an external electric field; thus, fixed charges between the substrate 11 and the gate electrode 13 and over the gate electrode 31 do not affect the oxide semiconductor film 17. Thus, degradation due to a stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

The gate electrode 31 and the electrode 32 in Embodiment 1 can be formed at the same time with the use of the same material.

Next, a method for manufacturing the transistor 40 in FIGS. 9A to 9C is described with reference to FIGS. 6A to 6D, FIGS. 7A and 7B, FIG. 8A, and FIGS. 10A to 10C. Note that in FIGS. 6A to 6D, FIGS. 7A and 7B, FIG. 8A, and FIGS. 10A to 10C, cross-sectional views in the channel length direction along the dashed-dotted line A-B in FIG. 9A and cross-sectional views in the channel width direction along the dashed-dotted line C-D in FIG. 9A are illustrated.

In this embodiment, as in Embodiment 1, through steps of FIGS. 6A to 6D, FIGS. 7A and 7B, and FIGS. 8A to 8C, the gate electrode 13, the insulating film 14, the oxide semiconductor film 17, the pair of electrodes 19 and 20, the oxide insulating film 22, the oxide insulating film 24, and the nitride insulating film 26 are formed over the substrate 11. In the steps, a photolithography process is performed using the first to third photomasks.

Next, heat treatment may be performed. The heat treatment is performed typically at a temperature of higher than or equal to 150° C. and lower than or equal to 400° C., preferably higher than or equal to 300° C. and lower than or equal to 400° C., further preferably higher than or equal to 320° C. and lower than or equal to 370° C.

Next, a mask is formed over the nitride insulating film 26 by a photolithography process using a fourth photomask, and then each of the insulating film 14, the oxide insulating film 22, the oxide insulating film 24, and the nitride insulating film 26 is partly etched using the mask, so that the gate insulating film 15 and the gate insulating film 28 including the oxide insulating film 23, the oxide insulating film 25, and the nitride insulating film 27 are formed. As illustrated in the cross-sectional view along line A-B in FIG. 10A, the opening 41 is provided in the gate insulating film 28. Furthermore, as illustrated in the cross-sectional view along line C-D in FIG. 10A, the openings 42 and 43 are provided in the gate insulating film 15 and the gate insulating film 28.

Figure 10A:
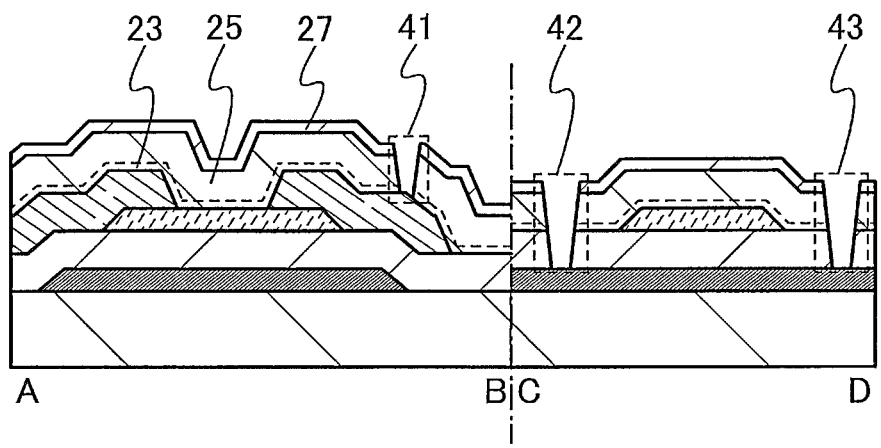
FIGS. 10A to 10C are cross-sectional views illustrating one mode of a method for manufacturing the transistor.
Figure 10B:
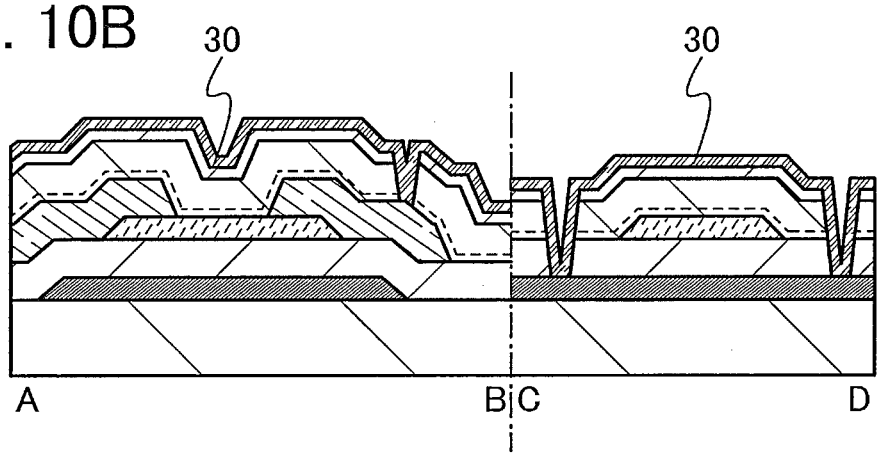

Next, as illustrated in FIG. 10B, the conductive film 30 to be the gate electrode 31 and the electrode 32 is formed.

Then, a mask is formed over the conductive film 30 by a photolithography process using a fifth photomask. Next, the conductive film 30 is partly etched using the mask to form the gate electrode 31 and the electrode 32. After that, the mask is removed.

Figure 10C:
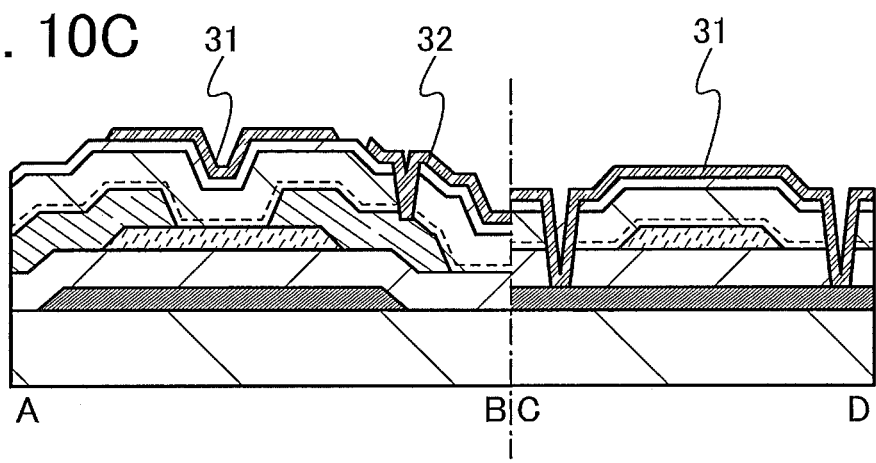

Note that as illustrated in FIG. 10C, in the channel width direction, the gate electrode 31 is formed so that the gate electrode 31 in the openings, which is provided in the gate insulating film 15 and the gate insulating film 28, and each of the side surfaces of the oxide semiconductor film 17 are provided so that the gate insulating film 28 is positioned therebetween.

Through the above steps, the transistor 40 can be manufactured.

In the transistor described in this embodiment, in the channel width direction, the gate electrode 31 faces the side surfaces of the oxide semiconductor film 17 in the openings 42 and 43 provided in the gate insulating film 15 and the gate insulating film 28, so that the electric field of the gate electrode 31 influences the end portions of the oxide semiconductor film 17; thus, a parasitic channel is inhibited from being generated in the end portions of the oxide semiconductor film 17. As a result, a transistor which has excellent electrical characteristics such as a sharp increase in the drain current at the threshold voltage is obtained. The electric field of the gate electrode 31 also influences the side surfaces of the oxide semiconductor film 17 and carriers flow in a wide region in the oxide semiconductor film 17, so that the field-effect mobility and the on-state current of the transistor are increased.

Through the above steps, it is possible to obtain a semiconductor device which includes a transistor having an oxide semiconductor film and has favorable electrical characteristics. Furthermore, the semiconductor device including the transistor having the oxide semiconductor film can have high reliability.

Note that the structures, methods, and the like described in this embodiment can be used as appropriate in combination with any of the structures, methods, and the like described in the other embodiments.

Modification Example 1

A transistor with a structure different from those in FIGS. 1A to 1C and FIGS. 9A to 9C is described with reference to FIGS. 11A to 11C. Unlike other transistors described in Embodiment 2, a transistor 50 illustrated in FIGS. 11A to 11C has a structure in which, in the channel width direction, the gate electrode 13 and a gate electrode 51 are connected to each other on an outer side of one side surface of the oxide semiconductor film 17, and the gate electrode 13 and the gate electrode 51 face each other on an outer side of the other side surface of the oxide semiconductor film 17, with the gate insulating film 15 and the gate insulating film 28 positioned therebetween.

Figure 11A:
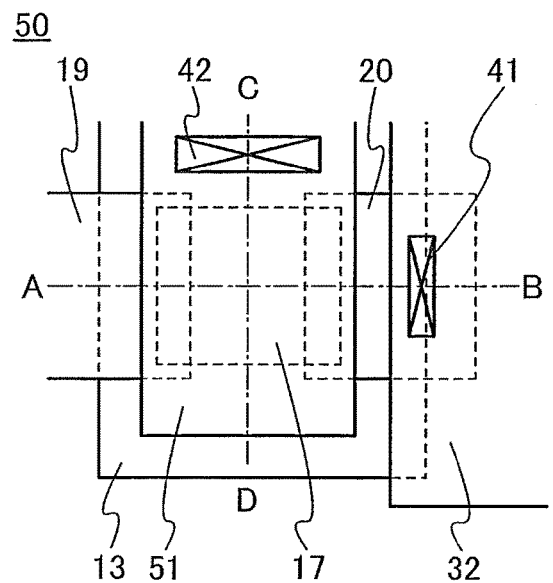
FIGS. 11A to 11C are a top view and cross-sectional views illustrating one mode of a transistor.
Figure 11C:
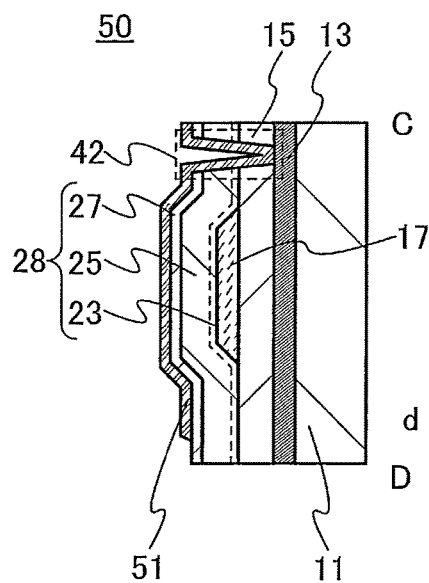
Figure 11B:
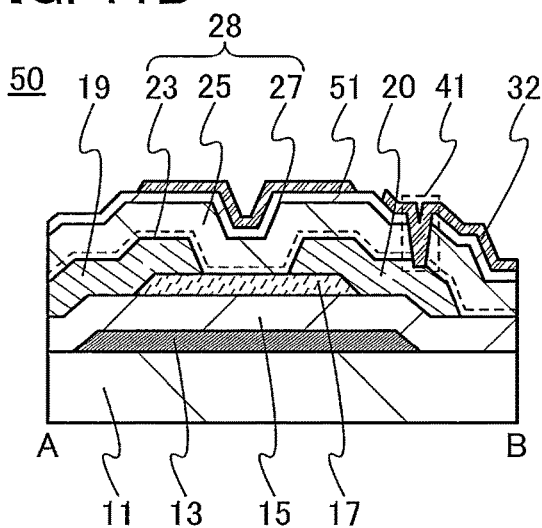

FIGS. 11A to 11C are a top view and cross-sectional views of the transistor 50 included in a semiconductor device. FIG. 11A is a top view of the transistor 50, FIG. 11B is a cross-sectional view taken along dashed-dotted line A-B in FIG. 11A, and FIG. 11C is a cross-sectional view taken along dashed-dotted line C-D in FIG. 11A. Note that in FIG. 11A, the substrate 11, the gate insulating film 15, the oxide insulating film 23, the oxide insulating film 25, the nitride insulating film 27, and the like are omitted for simplicity.

The transistor 50 illustrated in FIGS. 11A to 11C is a channel-etched transistor. In the transistor 50, the oxide insulating film 23, the oxide insulating film 25, and the nitride insulating film 27 serve as the gate insulating film 28, and the gate electrode 51 is formed over the nitride insulating film 27. The gate electrode 51 is connected to the gate electrode 13 in the opening 42 provided in the gate insulating film 15 and the gate insulating film 28. In addition, the electrode 32 in contact with one of the pair of electrodes 19 and 20 (here, the electrode 20) is formed over the gate insulating film 28. Note that the electrode 32 serves as a pixel electrode.

The gate electrode 51 and the electrode 32 described in Embodiment 1 can be formed at the same time with the use of the same material.

In the transistor 50 described in this embodiment, the oxide semiconductor film 17 is provided between the gate electrode 13 and the gate electrode 51. As illustrated in FIG. 11A, the gate electrode 51 overlaps with the end portions of the oxide semiconductor film 17 with the gate insulating film 28 provided therebetween, when seen from the above.

In addition, as illustrated in FIG. 11C, in the opening 42 provided in the gate insulating film 15 and the gate insulating film 28 on an outer side of one side surface of the oxide semiconductor film 17, the gate electrode 51 is connected to the gate electrode 13. The gate electrode 51 in the opening 42 and the side surface of the oxide semiconductor film 17 are provided so that the gate insulating film 28 is positioned therebetween. The gate electrode 51 and the gate electrode 13 are not connected to each other on an outer side of the other side surface of the oxide semiconductor film 17. End portions of the gate electrode 51 are positioned on the outer sides of the side surfaces of the oxide semiconductor film 17.

Next, a manufacturing process of the transistor 50 will be described.

Through steps of FIGS. 6A to 6D, FIGS. 7A and 7B, and FIGS. 8A to 8C, the gate electrode 13, the insulating film 14, the oxide semiconductor film 17, the pair of electrodes 19 and 20, the oxide insulating film 23, the oxide insulating film 24, and the nitride insulating film 26 are formed over the substrate 11. In the steps, a photolithography process is performed using the first to third photomasks.

Next, after a mask is formed over the nitride insulating film 26 by a photolithography process using a fourth photomask, the insulating film 14, the oxide insulating film 23, the oxide insulating film 24, and the nitride insulating film 26 are partly etched to form the opening 41 illustrated in FIGS. 11A and 11B and the gate insulating film 15 is further partly etched to form the opening 42 illustrated in FIGS. 11A and 11C.

Subsequently, the conductive film 30 is formed as in the step of FIG. 10A. Then, after a mask is formed over the conductive film 30 by a photolithography process using a fifth photomask, the conductive film 30 is partly etched to form the gate electrode 51 and the electrode 32 illustrated in FIGS. 11A to 11C.

Through the above steps, the transistor 50 can be manufactured.

Modification Example 2

A transistor having a structure different from those in FIGS. 1A to 1C, FIGS. 9A to 9C, and FIGS. 11A to 11C will be described with reference to FIGS. 12A to 12C. Unlike other transistors described in Embodiments 1 and 2, a transistor 60 illustrated in FIGS. 12A to 12C has a structure in which the gate electrode 13 and a gate electrode 64 are connected to each other through a conductive film 62.

Figure 12A:
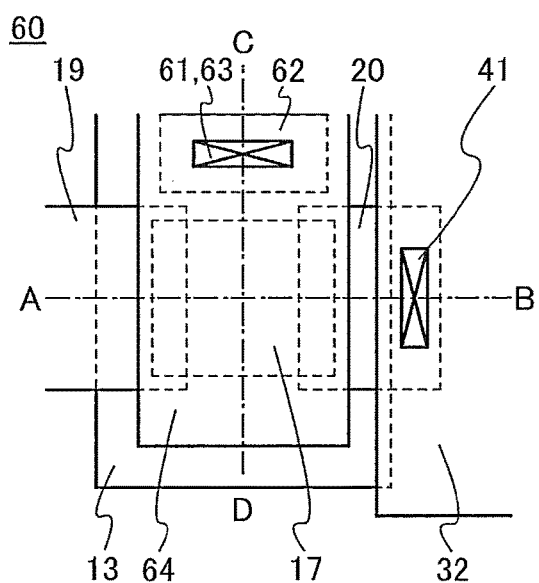
FIGS. 12A to 12C are a top view and cross-sectional views illustrating one mode of a transistor.
Figure 12C:
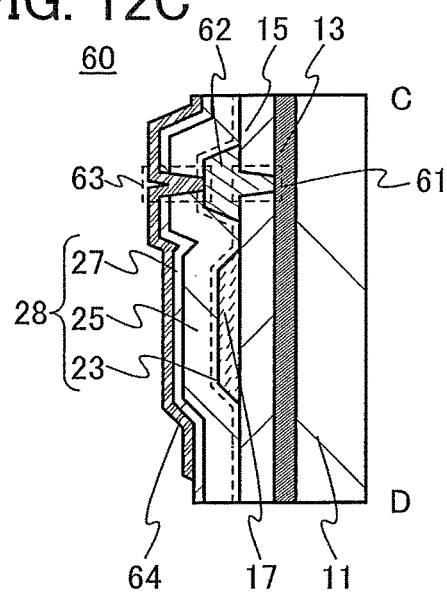
Figure 12B:
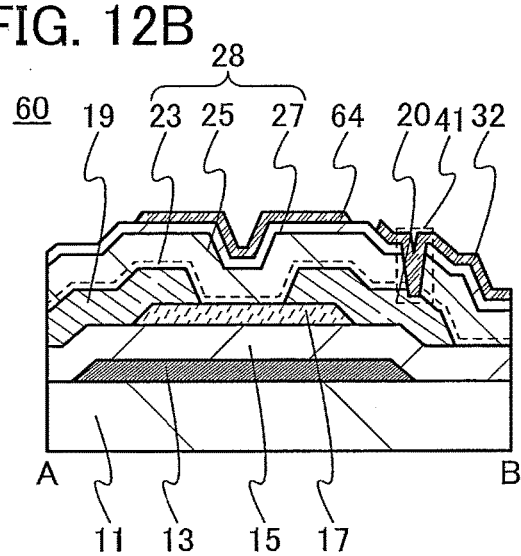

FIGS. 12A to 12C are a top view and cross-sectional views of the transistor 60 included in a semiconductor device. FIG. 12A is a top view of the transistor 60, FIG. 12B is a cross-sectional view taken along dashed-dotted line A-B of FIG. 12A, and FIG. 12C is a cross-sectional view taken along dashed-dotted line C-D of FIG. 12A. Note that in FIG. 12A, the substrate 11, the gate insulating film 15, the oxide insulating film 23, the oxide insulating film 25, the nitride insulating film 27, and the like are omitted for simplicity.

The transistor 60 illustrated in FIGS. 12B and 12C is a channel-etched transistor. In the transistor 60, the oxide insulating film 23, the oxide insulating film 25, and the nitride insulating film 27 serve as the gate insulating film 28, and the gate electrode 64 is formed over the nitride insulating film 27. The gate electrode 64 is connected to the gate electrode 13 through the conductive film 62. In addition, the electrode 32 in contact with one of the pair of electrodes 19 and 20 (here, the electrode 20) is formed over the gate insulating film 28. Note that the electrode 32 serves as a pixel electrode.

The conductive film 62 can be formed using a material and a formation method similar to those of the pair of electrodes 19 and 20 described in Embodiment 1, as appropriate. The conductive film 62 and the pair of electrodes 19 and 20 are formed at the same time. The gate electrode 64 and the electrode 32 described in Embodiment 1 can be formed at the same time with the use of the same material.

Furthermore, in the transistor 60 described in this embodiment, the oxide semiconductor film 17 is provided between the gate electrode 13 and the gate electrode 64. In addition, as illustrated in FIG. 12A, the gate electrode 64 overlaps with the end portions of the oxide semiconductor film 17 with the gate insulating film 28 provided therebetween, when seen from the above.

Furthermore, as illustrated in FIG. 12C, the conductive film 62 is connected to the gate electrode 13 through an opening 61 provided in the gate insulating film 15. The gate electrode 64 is connected to the conductive film 62 through an opening 63 provided in the gate insulating film 28. That is, the gate electrode 13 and the gate electrode 64 are electrically connected to each other through the conductive film 62. In addition, the conductive film 62 having the same potential as the gate electrode 13 and the gate electrode 64 faces the side surface of the oxide semiconductor film 17.

Note that although the transistor 60 has a structure in which the gate electrode 13 and the gate electrode 64 are connected to each other through the conductive film 62 on an outer side of only one side surface of the oxide semiconductor film 17 in the channel width direction as illustrated in FIG. 12C, the gate electrode 13 and the gate electrode 64 may be connected to each other through the conductive film 62 on the outer sides of both side surfaces of the oxide semiconductor film 17.

Next, a manufacturing process of the transistor 60 will be described.

Through steps of FIGS. 6A to 6D, the gate electrode 13, the insulating film 14, and the oxide semiconductor film 17 are formed over the substrate 11. In the steps, a photolithography process is performed using the first and second photomasks.

Then, after a mask is formed over the insulating film 14 by a photolithography process using a third photomask, the insulating film 14 is partly etched to form the opening 61 illustrated in FIGS. 12A and 12C.

Figure 7B:
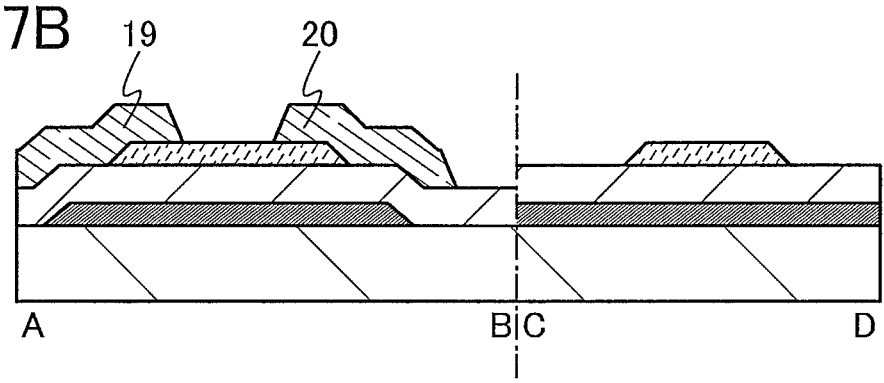

Next, as in the steps of FIGS. 7A and 7B, a mask is formed over the conductive film 18 by a photolithography process using a fourth photomask and then, the conductive film 18 is partly etched to form the pair of electrodes 19 and 20 and the conductive film 62.

Subsequently, the oxide insulating film 23, the oxide insulating film 24, and the nitride insulating film 26 are formed as in the step of FIG. 8A. Next, after a mask is formed over the nitride insulating film 26 by a photolithography process using a fifth photomask, the nitride insulating film 26 is partly etched to form the openings 41 and 63 illustrated in FIGS. 12A and 12C.

Subsequently, the conductive film 30 is formed as in the step of FIG. 10B. Then, after a mask is formed over the conductive film 30 by a photolithography process using a sixth photomask, the conductive film 30 is partly etched to form the gate electrode 64 and the electrode 32 illustrated in FIGS. 12A to 12C.

Through the above steps, the transistor 60 can be manufactured.

Modification Example 3

A transistor having a structure different from those in FIGS. 1A to 1C, FIGS. 9A to 9C, FIGS. 11A to 11C, and FIGS. 12A to 12C will be described with reference to FIGS. 13A to 13C. In a transistor 80 illustrated in FIGS. 13A to 13C, the electrode 92 connected to one of the pair of electrodes 19 and 20 is provided over the nitride insulating film 87. Unlike the other transistors described in Embodiments 1 and 2, the transistor 80 includes an oxide insulating film 83 and an oxide insulating film 85, which are each separated for each transistor, over the oxide semiconductor film 17 and the pair of electrodes 19 and 20.

FIGS. 13A to 13C are a top view and cross-sectional views of the transistor 80 included in a semiconductor device. FIG. 13A is a top view of the transistor 80, FIG. 13B is a cross-sectional view taken along dashed-dotted line A-B in FIG. 13A, and FIG. 13C is a cross-sectional view taken along dashed-dotted line C-D in FIG. 13A. Note that in FIG. 13A, the substrate 11, the gate insulating film 15, the oxide insulating film 83, the oxide insulating film 85, the nitride insulating film 87, and the like are omitted for simplicity.

The transistor 80 illustrated in FIGS. 13B and 13C is a channel-etched transistor including the gate electrode 13 over the substrate 11; the gate insulating film 15 formed over the substrate 11 and the gate electrode 13; the oxide semiconductor film 17 overlapping with the gate electrode 13 with the gate insulating film 15 positioned therebetween; the pair of electrodes 19 and 20 in contact with the oxide semiconductor film 17; a gate insulating film 88 including the oxide insulating film 83, the oxide insulating film 85, and a nitride insulating film 87 over the gate insulating film 15, the oxide semiconductor film 17, and the pair of electrodes 19 and 20; and a gate electrode 91 over the gate insulating film 88. The gate electrode 91 is connected to the gate electrode 13 through an opening 94 provided in the gate insulating film 15 and the nitride insulating film 87. In addition, the electrode 92 in contact with one of the pair of electrodes 19 and 20 (here, the electrode 20) is formed over the nitride insulating film 87. The electrode 92 is connected to the electrode 20 through an opening 93 provided in the nitride insulating film 87. Note that the electrode 92 serves as a pixel electrode.

The gate insulating film 15 includes the nitride insulating film 15a and the oxide insulating film 15b. The oxide insulating film 15b is formed in a region overlapping with the oxide semiconductor film 17, the pair of electrodes 19 and 20, or the oxide insulating film 83.

The nitride insulating film 15a is formed using a silicon nitride film. For the oxide insulating film 15b, any of the oxides listed for the gate insulating film 15 in Embodiment 1 can be used as appropriate. The nitride insulating film 15a and the oxide insulating film 15b each can be formed by any of the listed methods for forming the insulating film 14 as appropriate. The oxide insulating film 83 can be formed using a material and a formation method similar to those of the oxide insulating film 23 described in Embodiment 1, as appropriate. The oxide insulating film 85 can be formed using a material and a formation method similar to those of the oxide insulating film 25 described in Embodiment 1, as appropriate. The nitride insulating film 87 can be formed using a material and a formation method similar to those of the nitride insulating film 27 described in Embodiment 1, as appropriate. The gate electrode 91 and the electrode 92 can be formed using a material and a formation method similar to those of the gate electrode 31 and the electrode 32 described in Embodiment 1, as appropriate.

The oxide insulating film 83 and the oxide insulating film 85 are separated for each transistor. In addition, the oxide insulating film 83 and the oxide insulating film 85 each overlap with the oxide semiconductor film 17. Specifically, in the channel length direction in FIG. 13B, end portions of the oxide insulating films 83 and 85 are positioned over the pair of electrodes 19 and 20, whereas in the channel width direction in FIG. 13C, end portions of the oxide insulating films 83 and 85 are positioned on the outer sides of the side surfaces of the oxide semiconductor film 17. The nitride insulating film 87 is formed so as to cover top surfaces and side surfaces of the oxide insulating films 83 and 85, and is in contact with the nitride insulating film 15a. Note that in the channel length direction, the end portions of the oxide insulating films 83 and 85 may be positioned over the nitride insulating film 15a instead of over the pair of electrodes 19 and 20.

In the channel width direction in FIG. 13C, the gate electrode 91 and each of the side surfaces of the oxide semiconductor film 17 are provided so that side surfaces of the oxide insulating films 83 and 85 are positioned therebetween.

Furthermore, in the channel width direction of the transistor 80 described in this embodiment, the oxide semiconductor film 17 is provided between the gate electrode 13 and the gate electrode 91 with the gate insulating film 15 provided between the gate electrode 13 and the oxide semiconductor film 17 and with the gate insulating film 88 provided between the gate electrode 91 and the oxide semiconductor film 17. In addition, as illustrated in FIG. 13A, the gate electrode 91 overlaps with end portions of the oxide semiconductor film 17 with the gate insulating film 88 provided therebetween, when seen from the above.

As illustrated in FIG. 13C, the gate electrode 91 is connected to the gate electrode 13 through the opening 94 provided in the gate insulating film 15 and the nitride insulating film 87 on an outer side of one side surface of the oxide semiconductor film 17. The gate electrode 91 and the side surface of the oxide semiconductor film 17 are positioned so that the side surfaces of the oxide insulating films 83, 85 and the nitride insulating film 87 are positioned therebetween. The gate electrode 91 and the gate electrode 13 are not connected to each other on an outer side of the other side surface of the oxide semiconductor film 17. End portions of the gate electrode 91 are positioned on outer sides of the side surfaces of the oxide semiconductor film 17.

Note that although the transistor 80 has a structure in which the gate electrode 13 and the gate electrode 91 are connected to each other on an outer side of only one side surface of the oxide semiconductor film 17 in the channel width direction as illustrated in FIG. 13C, the gate electrode 13 and the gate electrode 91 may be connected to each other on the outer sides of both side surfaces of the oxide semiconductor film 17 in the channel width direction.

In the transistor 80 described in this embodiment, the oxide semiconductor film 17 and the oxide insulating film 85 are surrounded by the nitride insulating film 15a and the nitride insulating film 87. The nitride insulating film 15a and the nitride insulating film 87 have a small oxygen diffusion coefficient and have a barrier property against oxygen; therefore, part of oxygen included in the oxide insulating film 85 can be moved to the oxide semiconductor film 17, so that the amount of oxygen vacancy in the oxide semiconductor film 17 can be reduced. In addition, the nitride insulating film 15a and the nitride insulating film 87 have a barrier property against water, hydrogen, and the like; therefore, water, hydrogen, and the like can be prevented from entering the oxide semiconductor film 17 from the outside. As a result, the transistor 80 becomes a highly reliable transistor.

Next, a manufacturing process of the transistor 80 will be described.

In the manufacturing process of the transistor 80, the gate electrode 13, a nitride insulating film 14a, an oxide insulating film 14b, the oxide semiconductor film 17, and the pair of electrodes 19 and 20 are formed over the substrate 11 through steps similar to those in FIGS. 6A to 6D and FIGS. 7A and 7B. In the steps, a photolithography process is performed using the first to third photomasks.

Figure 14A:
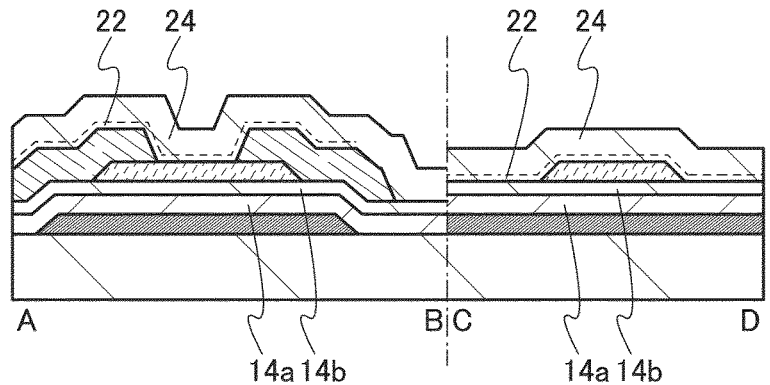
FIGS. 14A to 14D are cross-sectional views illustrating one mode of a method for manufacturing the transistor.

Then, the oxide insulating film 22 and the oxide insulating film 24 are formed as illustrated in FIG. 14A. Subsequently, oxygen contained in the oxide insulating film 24 is partly transferred to the oxide semiconductor film 17 by heat treatment; thus, the amount of oxygen vacancy contained in the oxide semiconductor film 17 can be reduced.

Figure 14B:
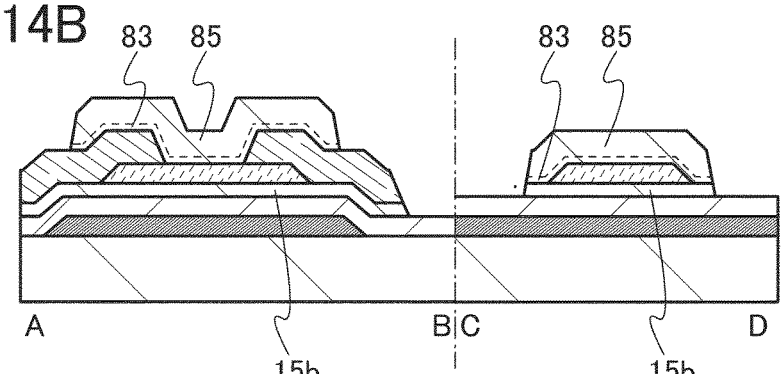

Next, a mask is formed over the oxide insulating film 24 by a photolithography process using a fourth photomask and then, the oxide insulating film 22 and the oxide insulating film 24 are partly etched to form the oxide insulating films 83 and 85 which are separated for each transistor. Note that the oxide insulating film 14b is partly etched in the etching of the oxide insulating film 83. As a result, the oxide insulating film 15b that is etched is formed as illustrated in FIG. 14B. In other words, the gate insulating film 15 which includes a step in a later step is formed.

Figure 14C:
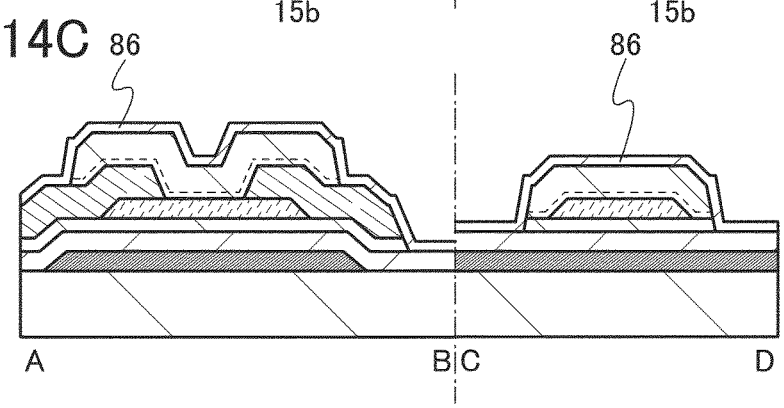

After that, a nitride insulating film 86 illustrated in FIG. 14C is formed. In this step, in the cross-sectional view along line C-D in the channel width direction, the nitride insulating film 14a and the nitride insulating film 86 are in contact with each other. That is, the oxide semiconductor film 17 and the oxide insulating film 85 are surrounded by the nitride insulating film 15a and the nitride insulating film 86.

Figure 14D:
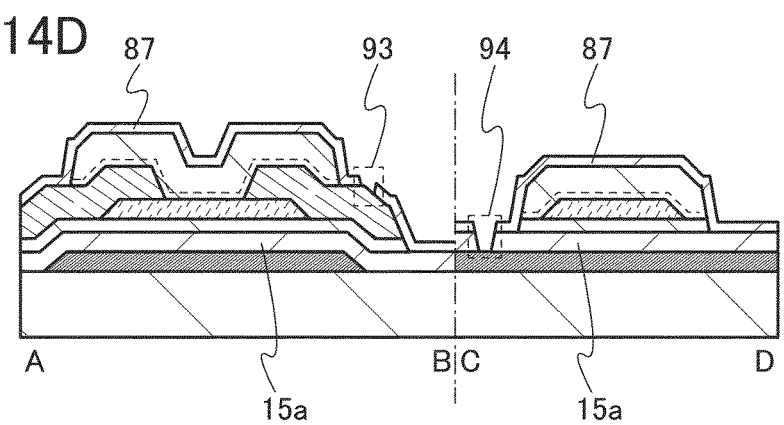

Next, after a mask is formed over the nitride insulating film 86 by a photolithography process using a fifth photomask, the nitride insulating film 86 is partly etched to form the opening 93. In addition, the nitride insulating film 14a and the nitride insulating film 86 are partly etched to form the nitride insulating film 15a and the nitride insulating film 87 in addition to the opening 94 (see FIG. 14D).

Figure 15A:
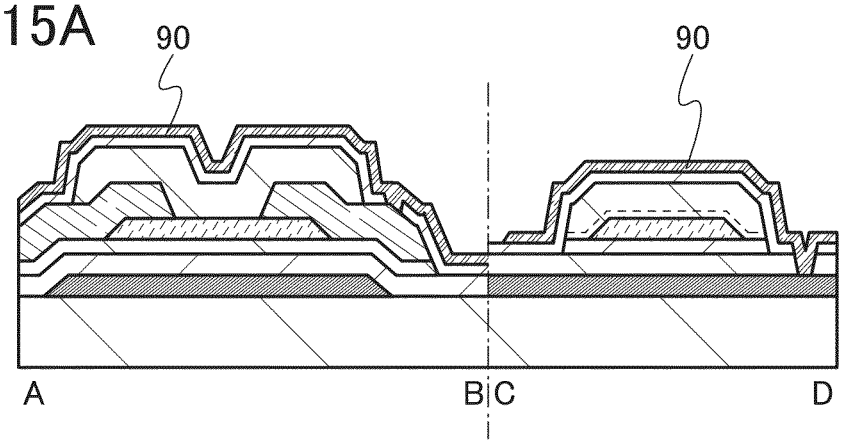
FIGS. 15A and 15B are cross-sectional views illustrating one mode of the method for manufacturing the transistor.

After that, a conductive film 90 to be the gate electrode 91 and the electrode 92 is formed as illustrated in FIG. 15A. The conductive film 90 can be formed in a manner similar to that of the conductive film 30 described in Embodiment 1.

Then, a mask is formed over the conductive film 90 by a photolithography process using a sixth photomask. Next, the conductive film 90 is partly etched using the mask to form the gate electrode 91 and the electrode 92. After that, the mask is removed (see FIG. 15B).

Figure 15B:
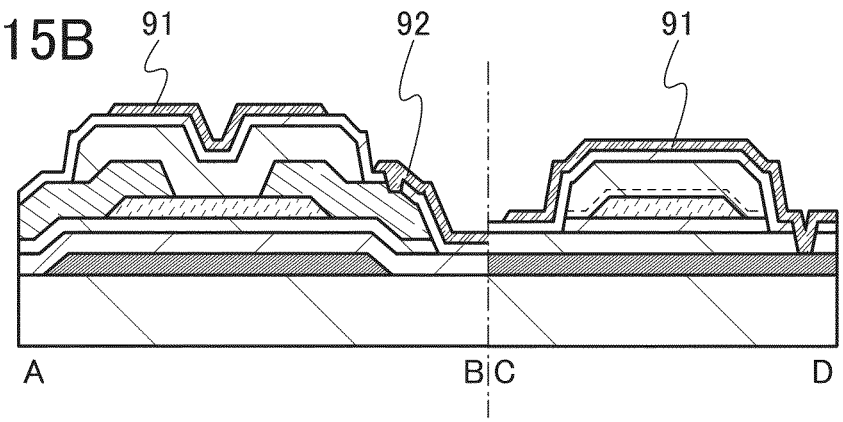

Note that as illustrated in FIG. 15B, in the channel width direction, the gate electrode 91 is formed so that the gate electrode 91 and each of the side surfaces of the oxide semiconductor film 17 are provided so that the side surfaces of the oxide insulating films 83 and 85 and the nitride insulating film 87 are positioned therebetween.

After that, heat treatment may be performed. The oxide insulating film 85 is formed using an oxide insulating film containing oxygen at higher proportion than the stoichiometric composition. Furthermore, the nitride insulating film 15a and the nitride insulating film 87 each have a high barrier property against oxygen. Accordingly, the heat treatment can reduce diffusion of oxygen contained in the oxide insulating film 85 to the outside. In addition, diffusion of oxygen contained in the oxide semiconductor film 17 to the outside can be also reduced. As a result, oxygen vacancies in the oxide semiconductor film 17 can be reduced. Furthermore, the nitride insulating film 15a and the nitride insulating film 87 each have a high barrier property against hydrogen, water, and the like, which can prevent diffusion of hydrogen, water, and the like from the outside into the oxide semiconductor film 17. Thus, hydrogen, water, and the like in the oxide semiconductor film 17 can be reduced. As a result, a highly reliable transistor can be manufactured.

Through the above steps, the transistor 80 can be manufactured.

Modification Example 4

In the transistor described in this embodiment, as in the transistor illustrated in FIGS. 38A to 38C, formation of the pair of electrodes 19 and 20 the oxide semiconductor film 17 with the use of a half-tone mask (alternatively, a gray-tone mask, a phase-shift mask, or the like) can reduce the number of masks and the number of process steps. FIG. 40A is a plan view of the transistor in FIGS. 9A to 9C that is manufactured with the use of a half-tone mask, and FIGS. 40B and 40C are cross-sectional views thereof.

Embodiment 3

In this embodiment, a semiconductor device of one embodiment of the present invention with a structure different from those in the above embodiments will be described with reference to FIGS. 16A and 16B.

Figure 16A:
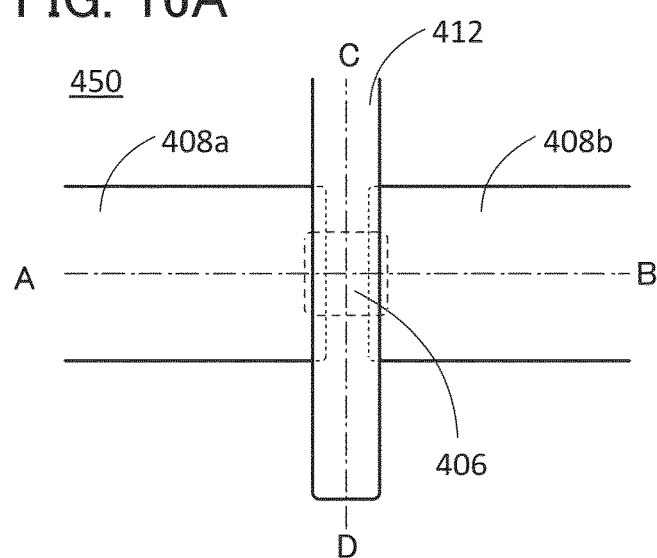
FIGS. 16A and 16B are a top view and a cross-sectional view illustrating one mode of a transistor.
Figure 16B:
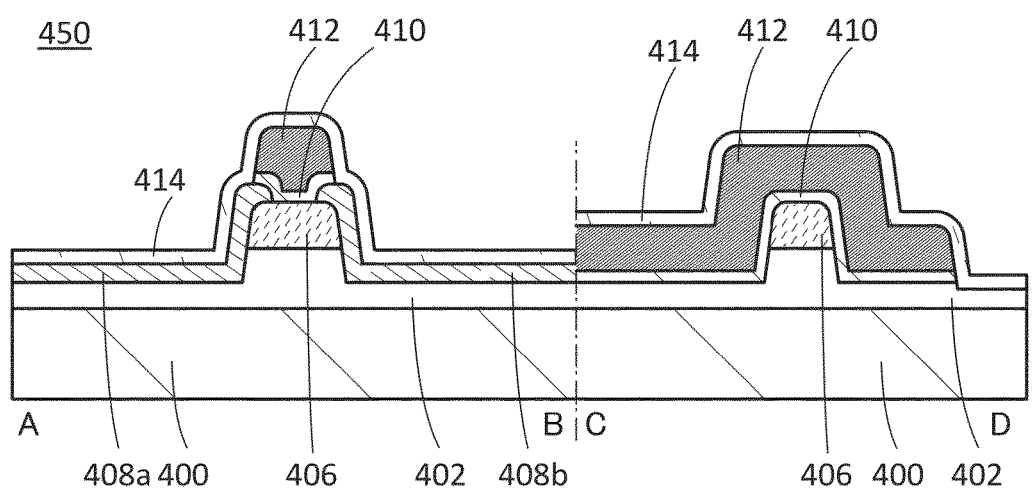

FIGS. 16A and 16B are a top view and cross-sectional views of a transistor 450 included in a semiconductor device. FIG. 16A is a top view of the transistor 450, FIG. 16B illustrates a cross-sectional view taken along dashed-dotted line A-B of FIG. 16A and a cross-sectional view taken along dashed-dotted line C-D of FIG. 16A. Note that in FIG. 16B, a substrate 400, an insulating film 402, an insulating film 414, and the like are omitted for simplicity.

The transistor 450 illustrated in FIGS. 16A and 16B includes the insulating film 402 that is over the substrate 400 and has a projecting portion; an oxide semiconductor film 406 over the projecting portion of the insulating film 402; a pair of electrodes 408a and 408b in contact with side surfaces and a top surface of the oxide semiconductor film 406; a gate insulating film 410 that is in contact with the oxide semiconductor film 406 over the pair of electrodes 408a and 408b; and a gate electrode 412 that is in contact with a top surface of the gate insulating film 410 and faces the side surfaces and the top surface of the oxide semiconductor film 406. Note that the insulating film 414 over the pair of electrodes 408a and 408b and the gate electrode 412 may be regarded as a component of the transistor 450.

As illustrated in FIG. 16B, in the transistor 450, the pair of electrodes 408a and 408b are in contact with the side surfaces of the oxide semiconductor film 406 in which a channel is formed. In the cross section in the channel width direction, the gate electrode 412 faces the top surface and the side surfaces of the oxide semiconductor film 406, and the oxide semiconductor film 406 can be electrically surrounded by an electric field of the gate electrode 412. Here, a structure of the transistor in which a channel (or the oxide semiconductor film 406 in which the channel is formed) is electrically surrounded by the electric field of the gate electrode 412 is called a surrounded channel (s-channel) structure. In the transistor 450 having the s-channel structure, a channel can be formed in the entire oxide semiconductor film 406 (bulk). In the s-channel structure, a large amount of current can flow between a source and a drain of a transistor, which makes it possible to obtain a high on-state current.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Note that a channel length refers to the distance between a source (a source region or a source electrode) and a drain (a drain region or a drain electrode) in a region where a semiconductor film and a gate electrode overlap with each other in a top view. That is, the channel length in FIG. 16A is the distance between the pair of electrodes 408a and 408b in a region where the oxide semiconductor film 406 overlaps with the gate electrode 412. A channel width refers to a length of a region where a source faces and is parallel to a drain and where a semiconductor film and a gate electrode overlap with each other. Accordingly, in FIG. 16A, a channel width is a length of a portion where the electrodes 408a and 408b face each other and where the oxide semiconductor film 406 and the gate electrode 412 overlap with each other.

Components of the transistor 450 are described in detail below. Note that the description of the substrate 11, the oxide semiconductor film 17, the gate insulating film 15, and the gate electrode 13 can be referred to for detailed description of the substrate 400, the oxide semiconductor film 406, the gate insulating film 410, and the gate electrode 412, respectively, which are included in the transistor 450; therefore, the detailed description is omitted. The oxide semiconductor film 406 includes a region; with a transmission electron diffraction measurement apparatus, a diffraction pattern with luminescent spots indicating alignment is observed in 70% or more and less than 100%, preferably 80% or more and less than 100% of the region (i.e., the proportion of CAAC in the region is 70% or more and less than 100%, preferably 80% or more and less than 100%) when an observation area is changed one-dimensionally within a range of 300 nm.

Note that the gate insulating film 410 included in the transistor 450 is formed by processing in a self-aligned manner with the use of the gate electrode 412 as a mask. However, one embodiment of the present invention is not limited thereto; top surfaces of the pair of electrodes 408a and 408b may be covered with the gate insulating film 410.

In the transistor 450, the insulating film 402 may be formed of, for example, a single layer or a stack of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. The insulating film 402 can have a function of supplying oxygen to the oxide semiconductor film 406 in which a channel is formed as well as a function of preventing diffusion of impurities from the substrate 400. For this reason, the insulating film 402 is preferably an insulating film containing oxygen and further preferably, the insulating film 402 is an insulating film containing oxygen in which the oxygen content is higher than that in the stoichiometric composition. When the insulating film 402 has a stacked-layer structure, at least a region in contact with the oxide semiconductor film 406 is preferably formed using an insulating film containing oxygen. For example, the insulating film 402 may have a stacked-layer structure including a silicon nitride film and a silicon oxynitride film in which the silicon oxynitride film is in contact with the oxide semiconductor film 406.

When an element other than the transistor 450 is formed over the substrate 400, the insulating film 402 also serves as an interlayer insulating film. In that case, a surface of the insulating film 402 may be planarized. For example, the insulating film 402 may be subjected to planarization treatment such as chemical mechanical polishing (CMP) treatment.

The projecting portion of the insulating film 402 is formed in the following manner: in a step of etching the oxide semiconductor film 406 on and in contact with the insulating film 402 to process the oxide semiconductor film 406 into an island shape, a region of the insulating film 402 that is exposed from the island-shaped oxide semiconductor film 406 is etched to have a reduced thickness. Note that depending on the etching condition of the oxide semiconductor film 406, the insulating film 402 does not have the projecting portion in some cases.

As the pair of electrodes 408a and 408b, a conductive film capable of extracting oxygen from the oxide semiconductor film is preferably used. As an example of the conductive film capable of extracting oxygen from the oxide semiconductor film, a conductive film containing aluminum, titanium, chromium, nickel, molybdenum, tantalum, tungsten, or the like can be given.

By the conductive film capable of extracting oxygen from the oxide semiconductor film, oxygen in the oxide semiconductor film 406 is released to form oxygen vacancies in the oxide semiconductor film 406 in some cases. Oxygen is more likely to be extracted as the temperature is higher. Since the manufacturing process of the transistor involves some heat treatment steps, oxygen vacancies are likely to be formed in a region of the oxide semiconductor film 406, which is in contact with the pair of electrodes 408a and 408b. Furthermore, hydrogen enters sites of oxygen vacancies by heating, and thus the oxide semiconductor film 406 becomes n-type in some cases. Thus, due to the pair of electrodes 408a and 408b, the resistance of regions where the oxide semiconductor film 406 is in contact with the pair of electrodes 408a and 408b is reduced, so that the on-state resistance of the transistor 450 can be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive film capable of appropriately extracting oxygen from the oxide semiconductor film 406 may be used as a source electrode and a drain electrode. As the conductive film capable of appropriately extracting oxygen, a conductive film containing nickel, molybdenum, or tungsten can be used, for example.

Furthermore, in the case where a transistor with an extremely short channel length (less than or equal to 40 nm, or less than or equal to 30 nm) is manufactured, a conductive film which is less likely to extract oxygen from the oxide semiconductor film 406 may be used as the pair of electrodes 408a and 408b. As an example of the conductive film which is less likely to extract oxygen from the oxide semiconductor film 406, a conductive film containing tantalum nitride, titanium nitride, or ruthenium can be given. Note that two or more kinds of conductive films may be stacked.

When the transistor 450 has an extremely short channel length, end portions of the pair of electrodes 408a and 408b, which are formed by etching a conductive film, might be rounded (have curved surfaces). Furthermore, at the time of etching the conductive film, a region of the insulating film 402 that is exposed from the pair of electrodes 408a and 408b is etched to have a reduced thickness in some cases.

As the insulating film 414 provided over the transistor 450, an insulating film having oxygen permeability lower than those of the oxide semiconductor film 406 and the gate insulating film 410 (having a barrier property to oxygen) is preferably provided. Providing the insulating film 414 with the barrier property to oxygen in contact with the gate insulating film 410 makes it possible to inhibit release of oxygen from the gate insulating film 410 and the oxide semiconductor film 406 in contact with the gate insulating film 410. Examples of such an insulating film include an aluminum oxide film, a silicon nitride film, and a silicon nitride oxide film.

To inhibit entry of hydrogen into the oxide semiconductor film 406, the concentration of hydrogen contained in the insulating film 414 is preferably reduced. Specifically, the concentration of hydrogen in the insulating film 414 is preferably lower than $5\times10^{19}$ atoms/cm$^3$, more preferably lower than $5\times10^{18}$ atoms/cm$^3$. An aluminum oxide film has a barrier property to hydrogen in addition to a barrier property to oxygen. Thus, it is preferable to use an aluminum oxide film as the insulating film 414. Alternatively, the insulating film 414 may have a stacked-layer structure. When having a stacked-layer structure, the insulating film 414 preferably includes an insulating film that is in contact with the pair of electrodes 408a and 408b and the gate electrode 412 and has a barrier property to oxygen.

The structures, methods, and the like described in this embodiment can be combined as appropriate with any of the structures, methods, and the like described in the other embodiments.

Embodiment 4

In this embodiment, a semiconductor device including a transistor in which the number of defects in an oxide semiconductor film can be smaller as compared to Embodiments 1 to 3 is described with reference to drawings. The transistor described in this embodiment is different from any of the transistors in Embodiments 1 to 3 in that a multilayer film including a plurality of oxide semiconductor films is provided.

Figure 17A:
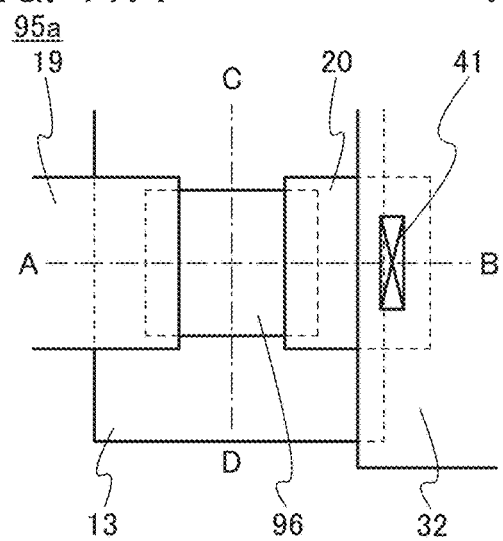
FIGS. 17A to 17D are a top view and cross-sectional views illustrating one mode of a transistor.
Figure 17C:
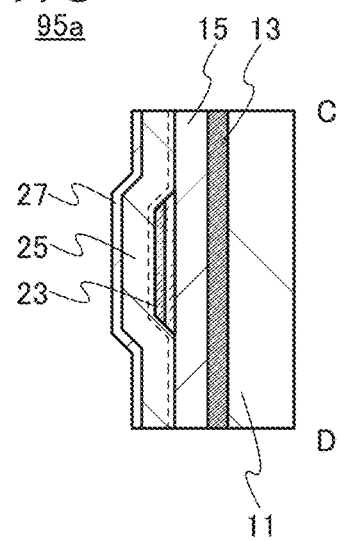
Figure 17B:
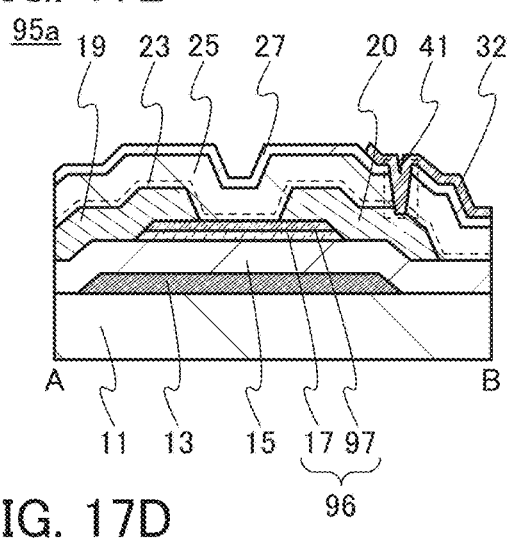

FIGS. 17A to 17C are a top view and cross-sectional views of a transistor 95a included in a semiconductor device. FIG. 17A is a top view of the transistor 95a, FIG. 17B is a cross-sectional view taken along dashed-dotted line A-B in FIG. 17A, and FIG. 17C is a cross-sectional view taken along dashed-dotted line C-D in FIG. 17A. Note that in FIG. 17A, the substrate 11, the gate insulating film 15, the oxide insulating film 23, the oxide insulating film 25, the nitride insulating film 27, and the like are omitted for simplicity.

The transistor 95a illustrated in FIG. 17A includes a multilayer film 96 overlapping with the gate electrode 13 with the gate insulating film 15 provided therebetween, and the pair of electrodes 19 and 20 in contact with the multilayer film 96. The oxide insulating film 23, the oxide insulating film 25, and the nitride insulating film 27 are stacked over the gate insulating film 15, the multilayer film 96, and the pair of electrodes 19 and 20. The oxide insulating film 23, the oxide insulating film 25, and the nitride insulating film 27 are stacked over the gate insulating film 15, the multilayer film 96, and the pair of electrodes 19 and 20.

In the transistor 95a described in this embodiment, the multilayer film 96 includes the oxide semiconductor film 17 and an oxide semiconductor film 97. That is, the multilayer film 96 has a two-layer structure. Furthermore, part of the oxide semiconductor film 17 serves as a channel region. In addition, the oxide insulating film 23 is formed in contact with the multilayer film 96, and the oxide insulating film 25 is formed in contact with the oxide insulating film 23. That is, the oxide semiconductor film 97 is provided between the oxide semiconductor film 17 and the oxide insulating film 23.

The oxide semiconductor film 97 contains one or more elements that form the oxide semiconductor film 17. Thus, interface scattering is unlikely to occur at the interface between the oxide semiconductor film 17 and the oxide semiconductor film 97. Thus, the transistor can have high field-effect mobility because the movement of carriers is not hindered at the interfaces.

The oxide semiconductor film 97 is formed using a metal oxide film containing at least In or Zn. Typical examples of the metal oxide film include an In—Ga oxide film, an In—Zn oxide film, and an In-M-Zn oxide film (M represents Al, Ti, Ga, Y, Zr, Sn, La, Ce, or Nd). The conduction band minimum of the oxide semiconductor film 97 is closer to a vacuum level than that of an oxide semiconductor film 17 is;

as a typical example, the energy difference between the conduction band minimum of the oxide semiconductor film 97 and the conduction band minimum of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 97 and the electron affinity of the oxide semiconductor film 17 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 97 preferably contains In because carrier mobility (electron mobility) can be increased.

When the oxide semiconductor film 97 contains a larger amount of Al, Ti, Ga, Y, Zr, Sn, La, Ce, or Nd than the amount of In in an atomic ratio, any of the following effects may be obtained: (1) the energy gap of the oxide semiconductor film 97 is widened; (2) the electron affinity of the oxide semiconductor film 97 decreases; (3) impurity diffusion from the outside is suppressed; (4) an insulating property of the oxide semiconductor film 97 increases as compared to that of the oxide semiconductor film 17; and (5) an oxygen vacancy is less likely to be generated because Al, Ti, Ga, Y, Zr, Sn, La, Ce, or Nd is a metal element that is strongly bonded to oxygen.

In the case where the oxide semiconductor film 97 is an In-M-Zn oxide film, the proportion of In and the proportion of M, not taking Zn and O into consideration, are less than 50 atomic % and greater than 50 atomic %, respectively, and preferably less than 25 atomic % and greater than 75 atomic %, respectively.

Furthermore, in the case where each of the oxide semiconductor films 17 and 97 contains an In-M-Zn oxide (M represents Al, Ti, Ga, Y, Zr, Sn, La, Ce, or Nd), the proportion of M atoms (M represents Al, Ti, Ga, Y, Zr, Sn, La, Ce, or Nd) in the oxide semiconductor film 97 is higher than that in the oxide semiconductor film 17. As a typical example, the proportion of M in the oxide semiconductor film 17 is 1.5 or more times, preferably twice or more, further preferably three or more times as high as that in the oxide semiconductor film 17.

Furthermore, in the case where each of the oxide semiconductor films 17 and 97 contains an In-M-Zn oxide (M represents Al, Ti, Ga, Y, Zr, Sn, La, Ce, or Nd), when In:M:Zn=$x_1$:$y_1$:$z_1$ [atomic ratio] is satisfied in the oxide semiconductor film 97 and In:M:Zn=$x_2$:$y_2$:$z_2$ [atomic ratio] is satisfied in the oxide semiconductor film 17, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 17 contains an In-M-Zn oxide (M is Al, Ti, Ga, Y, Zr, Sn, La, Ce, or Nd) and a target having the atomic ratio of metal elements of In:M:Zn=$x_1$:$y_1$:$z_1$ is used for forming the oxide semiconductor film 17, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 17 is easily formed. Typical examples of the atomic ratio of the metal elements of the target are In:M:Zn=1:1:1 and In:M:Zn=3:1:2.

In the case where the oxide semiconductor film 97 contains an In-M-Zn oxide (M is Al, Ti, Ga, Y, Zr, Sn, La, Ce, or Nd) and a target having the atomic ratio of metal elements of In:M:Zn=$x_2$:$y_2$:$z_2$ is used for forming the oxide semiconductor film 97, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 97 is easily formed. Typical examples of the atomic ratio of the metal elements of the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, and the like.

Note that the proportion of each metal element in the atomic ratio of each of the oxide semiconductor films 17 and 97 varies within a range of ±40% of that in the above atomic ratio as an error.

The oxide semiconductor film 97 can relieve damage to the oxide semiconductor film 17 at the time of forming the oxide insulating film 25 later. Thus, the oxide insulating film 25 may be formed over the oxide semiconductor film 97 without the oxide insulating film 23.

The thickness of the oxide semiconductor film 97 is greater than or equal to 3 nm and less than or equal to 100 nm, preferably greater than or equal to 3 nm and less than or equal to 50 nm.

Like the oxide semiconductor film 17, the oxide semiconductor film 97 may have a non-single-crystal structure, for example. The non-single crystal structure includes a c-axis aligned crystalline oxide semiconductor (CAAC-OS), a polycrystalline structure, a microcrystalline structure which is described later, or an amorphous structure, for example. Like the oxide semiconductor film 17 in Embodiment 1, the oxide semiconductor film 97 is preferably an oxide semiconductor film with a high proportion of CAAC. The oxide semiconductor film with a high proportion of CAAC has a low impurity concentration and a low density of defect states, and thus makes it possible to provide a transistor with excellent electrical characteristics. In the oxide semiconductor film with a high proportion of CAAC, which has c-axis alignment, a grain boundary is not found and the c-axes are aligned in a direction parallel to a normal vector of a formation surface or a normal vector of a top surface. Therefore, the use of the oxide semiconductor film with a high proportion of CAAC as the oxide semiconductor film 97 can inhibit metal elements contained in the pair of electrodes 19 and 20 from being diffused into the oxide semiconductor film 17.

The oxide semiconductor film 97 may have an amorphous structure, for example. An amorphous oxide semiconductor film, for example, has disordered atomic arrangement and no crystalline component. Alternatively, an amorphous oxide film, for example, has an absolutely amorphous structure and no crystal part.

Note that the oxide semiconductor films 17 and 97 may each be a mixed film including two or more of a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

Figure 17D:
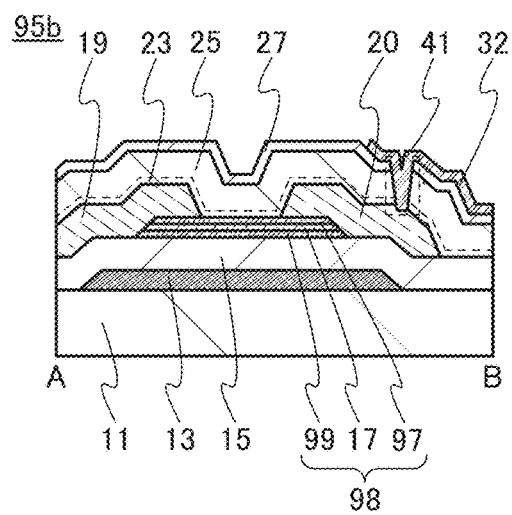

Note that as in a transistor 95*b* illustrated in FIG. 17D, a multilayer film 98 may be included instead of the multilayer film 96.

An oxide semiconductor film 99, the oxide semiconductor film 17, and the oxide semiconductor film 97 are stacked in this order in the multilayer film 98. That is, the multilayer film 98 has a three-layer structure. Furthermore, the oxide semiconductor film 17 serves as a channel region.

The gate insulating film 15 is in contact with the oxide semiconductor film 99. In other words, the oxide semiconductor film 99 is provided between the gate insulating film 15 and the oxide semiconductor film 17.

Furthermore, the oxide semiconductor film 97 is in contact with the oxide insulating film 23. That is, the oxide semiconductor film 97 is provided between the oxide semiconductor film 17 and the oxide insulating film 23.

The oxide semiconductor film 99 can be formed using a material and a formation method similar to those of the oxide semiconductor film 97.

It is preferable that the thickness of the oxide semiconductor film 99 be smaller than that of the oxide semiconductor film 17. When the thickness of the oxide semiconductor film 99 is greater than or equal to 1 nm and less than or equal to 5 nm, preferably greater than or equal to 1 nm and less than or equal to 3 nm, the amount of change in the threshold voltage of the transistor can be reduced.

Note that in the transistor 95*b*, as in the transistor 95*a*, the oxide semiconductor film 97 also serve as a film that relieves damage to the oxide semiconductor film 17 at the time of forming the oxide insulating film 25 later. Thus, the oxide insulating film 25 may be formed over the oxide semiconductor film 97 without the oxide insulating film 23.

In the transistors described in this embodiment, the oxide semiconductor film 97 is provided between the oxide insulating film 23 and the oxide semiconductor film 17. Thus, if carrier traps are formed between the oxide insulating film 23 and the oxide semiconductor film 97 by impurities and defects, electrons flowing in the oxide semiconductor film 17 are less likely to be captured by the carrier traps because there is a distance between the region where the carrier traps are formed and the oxide semiconductor film 17. Accordingly, the amount of on-state current of the transistor can be increased, and the field-effect mobility can be increased. When the electrons are captured by the carrier traps, the electrons behave as negative fixed charges. As a result, the threshold voltage of the transistor is changed. However, by the distance between the region where the carrier traps are formed and the oxide semiconductor film 17, capture of the electrons by the carrier traps can be reduced, and accordingly change in the threshold voltage can be reduced.

The oxide semiconductor film 97 can block impurities from the outside, and accordingly, the amount of impurities that are transferred from the outside to the oxide semiconductor film 17 can be reduced. Furthermore, an oxygen vacancy is less likely to be formed in the oxide semiconductor film 97. Consequently, the impurity concentration and oxygen vacancies in the oxide semiconductor film 17 can be reduced.

The oxide semiconductor film 99 is provided between the gate insulating film 15 and the oxide semiconductor film 17, and the oxide semiconductor film 97 is provided between the insulating film 17 and the oxide semiconductor film 23. Thus, it is possible to reduce the concentration of silicon or carbon in the vicinity of the interface between the oxide semiconductor film 99 and the oxide semiconductor film 17, in the oxide semiconductor film 17, or in the vicinity of the interface between the oxide semiconductor film 97 and the oxide semiconductor film 17.

The transistor 95*b* having such a structure includes very few defects in the multilayer film 98 including the oxide semiconductor film 17; thus, the electrical characteristics, typified by the on-state current and the field-effect mobility, of these transistors can be improved. Further, in a BT stress test and a BT photostress test that are examples of a stress test, the amount of change in threshold voltage is small, and thus, reliability is high.

<Band Structure of Transistor>

Next, band structures of the multilayer film 96 included in the transistor 95*a* illustrated in FIGS. 17A to 17C, and the multilayer film 98 included in the transistor 95*b* illustrated in FIG. 17D are described with reference to FIGS. 18A and 18B.

Here, for example, an In—Ga—Zn oxide having an energy gap of 3.15 eV is used for the oxide semiconductor film 17, and an In—Ga—Zn oxide having an energy gap of 3.5 eV is used for the oxide semiconductor film 97. The energy gaps can be measured using a spectroscopic ellipsometer (UT-300 manufactured by HORIBA JOBIN YVON SAS).

The energy difference between the vacuum level and the valence band maximum (also called ionization potential) of the oxide semiconductor film 17 and the energy difference between the vacuum level and the valence band maximum of the oxide semiconductor film 97 were 8 eV and 8.2 eV, respectively. Note that the energy difference between the vacuum level and the valence band maximum can be measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 17 and the energy gap therebetween of the oxide semiconductor film 97 are 4.85 eV and 4.7 eV, respectively.

Figure 18A:
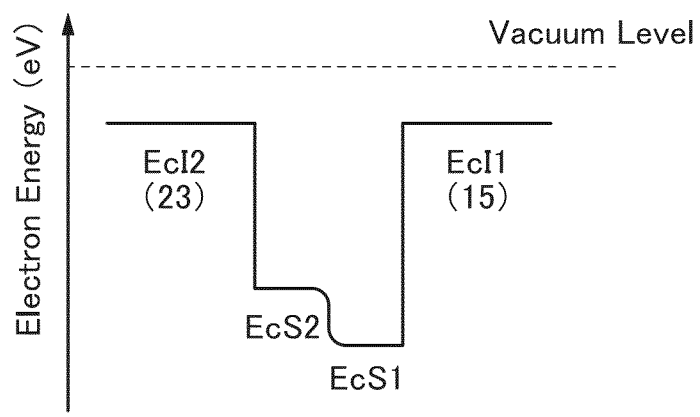
FIGS. 18A and 18B are diagrams each illustrating a band structure of the transistor.

FIG. 18A schematically illustrates a part of the band structure of the multilayer film 96. Here, the case where silicon oxide films are used for the gate insulating film 15 and the oxide insulating film 23 and the silicon oxide films are provided in contact with the multilayer film 96 is described. In FIG. 18A, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 97; and EcI2 denotes the energy of the conduction band minimum of the silicon oxide film. Furthermore, EcI1 and EcI2 correspond to the gate insulating film 15 and the oxide insulating film 23 in FIG. 17B, respectively.

As illustrated in FIG. 18A, there is no energy barrier between the oxide semiconductor films 17 and 97, and the energy of the conduction band minimum gradually changes therebetween. In other words, the energy of the conduction band minimum is continuously changed. This is because the multilayer film 96 contains an element contained in the oxide semiconductor film 17 and oxygen is transferred between the oxide semiconductor films 17 and 97, so that a mixed layer is formed.

As shown in FIG. 18A, the oxide semiconductor film 17 in the multilayer film 96 serves as a well and a channel region of the transistor including the multilayer film 96 is formed in the oxide semiconductor film 17. Note that since the energy of the conduction band minimum of the multilayer film 96 is continuously changed, it can be said that the oxide semiconductor films 17 and 97 are continuous.

Although trap levels due to impurities or defects might be generated in the vicinity of the interface between the oxide semiconductor film 97 and the oxide insulating film 23 as shown in FIG. 18A, the oxide semiconductor film 17 can be distanced from the trap levels owing to the existence of the oxide semiconductor film 97. However, when the energy difference between EcS1 and EcS2 is small, an electron in the oxide semiconductor film 17 might reach the trap level across the energy difference. When the electron is captured by the trap level, a negative fixed charge is generated at the interface with the insulating film, whereby the threshold voltage of the transistor shifts in the positive direction. Thus, it is preferable that the energy difference between EcS1 and EcS2 be 0.1 eV or more, further preferably 0.15 eV or more, because change in the threshold voltage of the transistor is reduced and stable electrical characteristics are obtained.

Figure 18B:
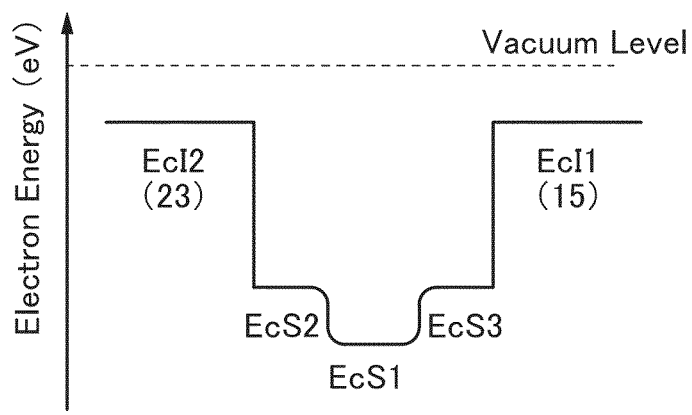

FIG. 18B schematically illustrates a part of the band structure of the multilayer film 98. Here, the case where silicon oxide films are used for the gate insulating film 15 and the oxide insulating film 23 and the silicon oxide films are in contact with the multilayer film 98 is described. In FIG. 18B, EcI1 denotes the energy of the conduction band minimum of the silicon oxide film; EcS1 denotes the energy of the conduction band minimum of the oxide semiconductor film 17; EcS2 denotes the energy of the conduction band minimum of the oxide semiconductor film 97; EcS3 denotes the energy of the conduction band minimum of the oxide semiconductor film 99; and EcI2 denotes the energy of the conduction band minimum of the silicon oxide film. Furthermore, EcI1 and EcI2 correspond to the gate insulating film 15 and the oxide insulating film 23 in FIG. 17D, respectively.

As illustrated in FIG. 18B, there is no energy barrier between the oxide semiconductor films 99, 17, and 97, and the conduction band minimums thereof smoothly vary. In other words, the conduction band minimums are continuous. This is because the multilayer film 98 contains an element contained in the oxide semiconductor film 17 and oxygen is transferred between the oxide semiconductor films 17 and 99 and between the oxide semiconductor films 17 and 97, so that a mixed layer is formed.

As shown in FIG. 18B, the oxide semiconductor film 17 in the multilayer film 98 serves as a well and a channel region of the transistor including the multilayer film 98 is formed in the oxide semiconductor film 17. Note that since the energy of the conduction band minimum of the multilayer film 98 is continuously changed, it can be said that the oxide semiconductor films 99, 17, and 97 are continuous.

Although trap levels due to impurities or defects might be generated in the vicinity of the interface between the multilayer film 98 and the oxide insulating film 23 and in the vicinity of the interface between the multilayer film 98 and the gate insulating film 15, as illustrated in FIG. 18B, the oxide semiconductor film 17 can be distanced from the region where the trap levels are generated owing to the existence of the oxide semiconductor films 97 and 99. However, when the energy difference between EcS1 and EcS2 and the energy difference between EcS1 and EcS3 are small, electrons in the oxide semiconductor film 17 might reach the trap level across the energy difference. When the electrons are captured by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because change in the threshold voltage of the transistor is reduced and stable electrical characteristics are obtained.

Modification Example 1

In the transistors 95a and 95b described in this embodiment, a metal oxide represented by an In-M oxide (M is Al, Ti, Ga, Y, Sn, Zr, La, Ce, Nd, or Hf) can be used instead of the oxide semiconductor film 97. To prevent the oxide semiconductor film 97 from serving as part of a channel formation region, a material with sufficiently low conductivity is used. Alternatively, a material whose electron affinity (an energy difference between a vacuum level and a conduction band minimum) is smaller than that of the oxide semiconductor film 17 and whose conduction band minimum differs from the conduction band minimum of the oxide semiconductor film 17 (in which a band offset is formed between the conduction band minimums of the oxide semiconductor films 17 and 97) is used as the oxide semiconductor film 97. Furthermore, to inhibit generation of a difference between threshold voltages (hysteresis) due to the value of the drain voltage, it is preferable to use a metal oxide film whose conduction band minimum is closer to the vacuum level than the conduction band minimum of the oxide semiconductor film 17 is by more than 0.2 eV, preferably 0.5 eV or more.

When an atomic ratio of M to In (M/In) is increased, the energy gap of the metal oxide film is increased and the electron affinity thereof can be small. Thus, when the atomic ratio of In to M in the metal oxide film is x:y, y/(x+y) is preferably more than or equal to 0.75 and less than or equal to 1, further preferably more than or equal to 0.78 and less than or equal to 1, still further preferably more than or equal to 0.80 and less than or equal to 1 in order to form a conduction band offset between the metal oxide film and the oxide semiconductor film 17 and inhibit a channel from being formed in the metal oxide film. Note that an element other than indium, M, and oxygen that are main components may be mixed in the metal oxide film as an impurity. In that case, the impurity preferably accounts for less than or equal to 0.1% of the metal oxide film.

The structures, methods, and the like described in this embodiment can be used as appropriate in combination with any of the structures, methods, and the like described in the other embodiments.

Embodiment 5

In this embodiment, a semiconductor device that is one embodiment of the present invention is described with reference to drawings. Note that in this embodiment, a display device is described as an example of a semiconductor device of one embodiment of the present invention.

Figure 19A:
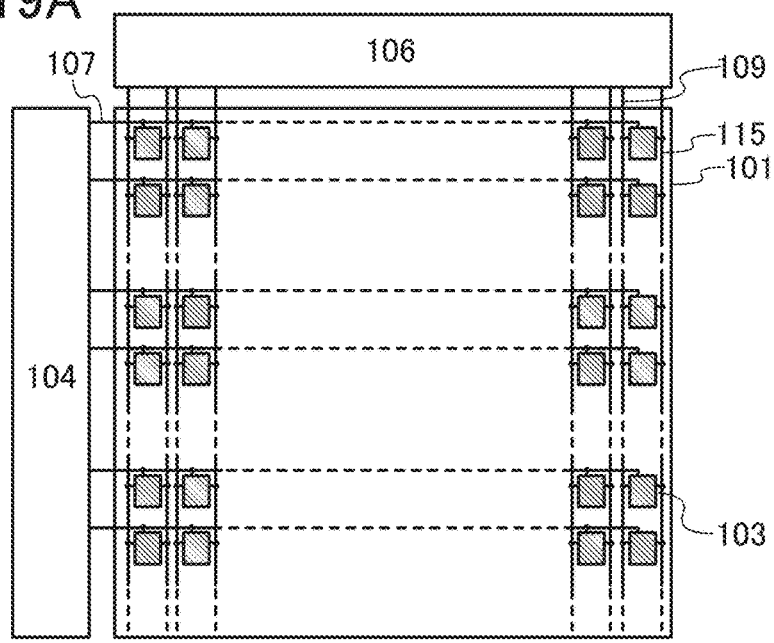
FIGS. 19A to 19C are a block diagram and circuit diagrams illustrating one mode of a semiconductor device.

FIG. 19A illustrates an example of a semiconductor device. The semiconductor device in FIG. 19A includes a pixel portion 101, a scan line driver circuit 104, a signal line driver circuit 106, m scan lines 107 that are arranged parallel or substantially parallel and whose potentials are controlled by the scan line driver circuit 104, and n signal lines 109 that are arranged parallel or substantially parallel and whose potentials are controlled by the signal line driver circuit 106. The pixel portion 101 includes a plurality of pixels 103 arranged in a matrix. Furthermore, capacitor lines 115 arranged parallel or substantially parallel are provided along the signal lines 109. Note that the capacitor lines 115 may be arranged parallel or substantially parallel along the scan lines 107. The scan line driver circuit 104 and the signal line driver circuit 106 are collectively referred to as a driver circuit portion in some cases.

Each of the scan lines 107 is electrically connected to the n pixels 103 in the corresponding row among the pixels 103 arranged in m rows and n columns in the pixel portion 101. Each of the signal lines 109 is electrically connected to the m pixels 103 in the corresponding column among the pixels 103 arranged in m rows and n columns. Note that m and n are each an integer of 1 or more. Each of the capacitor lines 115 is electrically connected to the n pixels 103 in the corresponding row among the pixels 103 arranged in m rows and n columns. Note that in the case where the capacitor lines 115 are arranged parallel or substantially parallel along the signal lines 109, each of the capacitor lines 115 is electrically connected to the m pixels 103 in the corresponding column among the pixels 103 arranged in m rows and n columns.

Figure 19B:
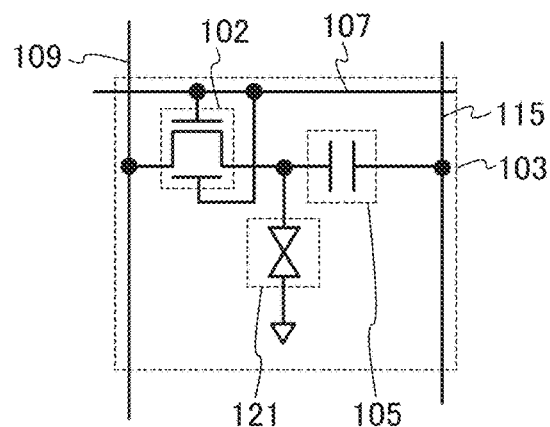
Figure 19C:
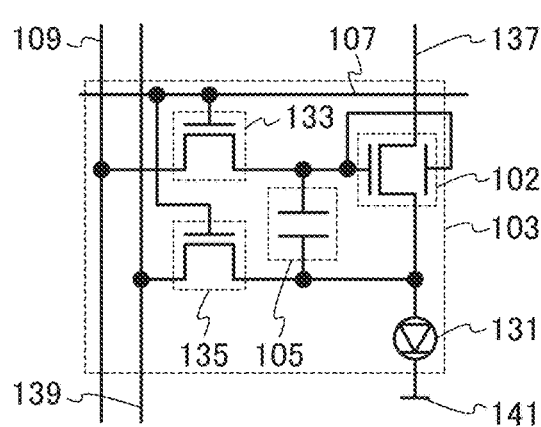

FIGS. 19B and 19C each illustrate an example of a circuit configuration that can be used for the pixels 103 in the display device illustrated in FIG. 19A.

The pixel 103 illustrated in FIG. 19B includes a liquid crystal element 121, a transistor 102, and a capacitor 105.

The potential of one of a pair of electrodes of the liquid crystal element 121 is set according to the specifications of the pixels 103 as appropriate. The alignment state of the liquid crystal element 121 depends on written data. A common potential may be applied to one of the pair of electrodes of the liquid crystal element 121 included in each of the plurality of pixels 103. Further, the potential supplied to one of a pair of electrodes of the liquid crystal element 121 in the pixel 103 in one row may be different from the potential supplied to one of a pair of electrodes of the liquid crystal element 121 in the pixel 103 in another row.

The liquid crystal element 121 is an element that controls transmission or non-transmission of light utilizing an optical modulation action of liquid crystal. Note that optical modulation action of a liquid crystal is controlled by an electric field applied to the liquid crystal (including a horizontal electric field, a vertical electric field, and an oblique electric field). Note that the following can be used for the liquid crystal element 121: a nematic liquid crystal, a cholesteric liquid crystal, a smectic liquid crystal, a thermotropic liquid crystal, a lyotropic liquid crystal, a ferroelectric liquid crystal, an anti-ferroelectric liquid crystal, and the like.

As examples of a driving method of the display device including the liquid crystal element 121, any of the following modes can be given: a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, a transverse bend alignment (TBA) mode, and the like. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 103 illustrated in FIG. 19B, one of a source electrode and a drain electrode of the transistor 102 is electrically connected to the signal line 109, and the other is electrically connected to the other of the pair of electrodes of the liquid crystal element 121. A gate electrode of the transistor 102 is electrically connected to the scan line 107. The transistor 102 has a function of controlling whether to write a data signal by being turned on or off. Note that the transistor described in any of Embodiments 1 to 4 can be used as the transistor 102.

In the pixel 103 illustrated in FIG. 19B, one of a pair of electrodes of the capacitor 105 is electrically connected to the capacitor line 115 to which a potential is supplied, and the other is electrically connected to the other of the pair of electrodes of the liquid crystal element 121. The potential of the capacitor line 115 is set in accordance with the specifications of the pixel 103 as appropriate. The capacitor 105 serves as a storage capacitor for storing written data.

For example, in the display device including the pixel 103 in FIG. 19B, the pixels 103 are sequentially selected row by row by the scan line driver circuit 104, whereby the transistors 102 are turned on and a data signal is written.

When the transistors 102 is turned off, the pixels 103 in which the data have been written are brought into a holding state. This operation is sequentially performed row by row; thus, an image is displayed.

The pixel 103 illustrated in FIG. 19C includes a transistor 133 for switching a display element, the transistor 102 for controlling driving of a pixel, a transistor 135, the capacitor 105, and a light-emitting element 131.

One of a source electrode and a drain electrode of the transistor 133 is electrically connected to the signal line 109 to which a data signal is supplied. A gate electrode of the transistor 133 is electrically connected to the scan line 107 to which a gate signal is supplied.

The transistor 133 has a function of controlling whether to write data of a data signal by being turned on or off.

One of source and drain electrodes of the transistor 102 is electrically connected to a wiring 137 serving as an anode line. The other of the source and drain electrodes of the transistor 102 is electrically connected to one of electrodes of the light-emitting element 131. A gate electrode of the transistor 102 is electrically connected to the other of the source and drain electrodes of the transistor 133 and one of electrodes of the capacitor 105.

The transistor 102 has a function of controlling current flowing in the light-emitting element 131 by being turned on or off. Note that the transistor described in any of Embodiments 1 to 4 can be used as the transistor 102.

One of source and drain electrodes of the transistor 135 is connected to a wiring 139 to which a data reference potential is supplied. The other of the source and drain electrodes of the transistor 135 is electrically connected to the one of the electrodes of the light-emitting element 131 and the other of the electrodes of the capacitor 105. A gate electrode of the transistor 135 is electrically connected to a scan line 107 to which a gate signal is supplied.

The transistor 135 has a function of controlling current flowing in the light-emitting element 131. For example, in the case where internal resistance of the light-emitting element 131 is increased by degradation or the like, by monitoring current flowing in the wiring 139 that is connected to the one of the source and drain electrodes of the transistor 135, current flowing in the light-emitting element 131 can be corrected. A potential that is supplied to the wiring 139 can be 0 V, for example.

The one of the electrodes of the capacitor 105 is electrically connected to the other of the source and drain electrodes of the transistor 133 and the gate electrode of the transistor 102. The other of the electrodes of the capacitor 105 is electrically connected to the other of the source and drain electrodes of the transistor 135 and the one of the electrodes of the light-emitting element 131.

In the configuration of the pixel 103 in FIG. 19C, the capacitor 105 serves as a storage capacitor storing written data.

The one of the electrodes of the light-emitting element 131 is electrically connected to the other of the source and drain electrodes of the transistor 135, the other of the electrodes of the capacitor 105, and the other of the source and drain electrodes of the transistor 102. The other of the electrodes of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to organic EL elements; an inorganic EL element including an inorganic material can be used.

A high power supply potential VDD is supplied to one of the wirings 137 and 141, and a low power supply potential VSS is supplied to the other. In the configuration illustrated in FIG. 19C, a high power supply potential VDD is supplied to the wiring 137 and a low power supply potential VSS is supplied to the wiring 141.

In the display device including the pixel 103 in FIG. 19C, the pixels 103 are sequentially selected row by row by the scan line driver circuit 104, whereby transistors 133 are turned on and a data signal is written.

When the transistor 133 is turned off, the pixel 103 in which the data have been written is brought into a holding state. The transistor 133 is connected to the capacitor 105, and thus written data can be stored for a long period. The amount of current flowing between the source and drain electrodes of the transistor 102 is controlled by the transistor 133. The light-emitting element 131 emits light with a luminance corresponding to the amount of flowing current. This operation is sequentially performed row by row; thus, an image is displayed.

Figure 20:
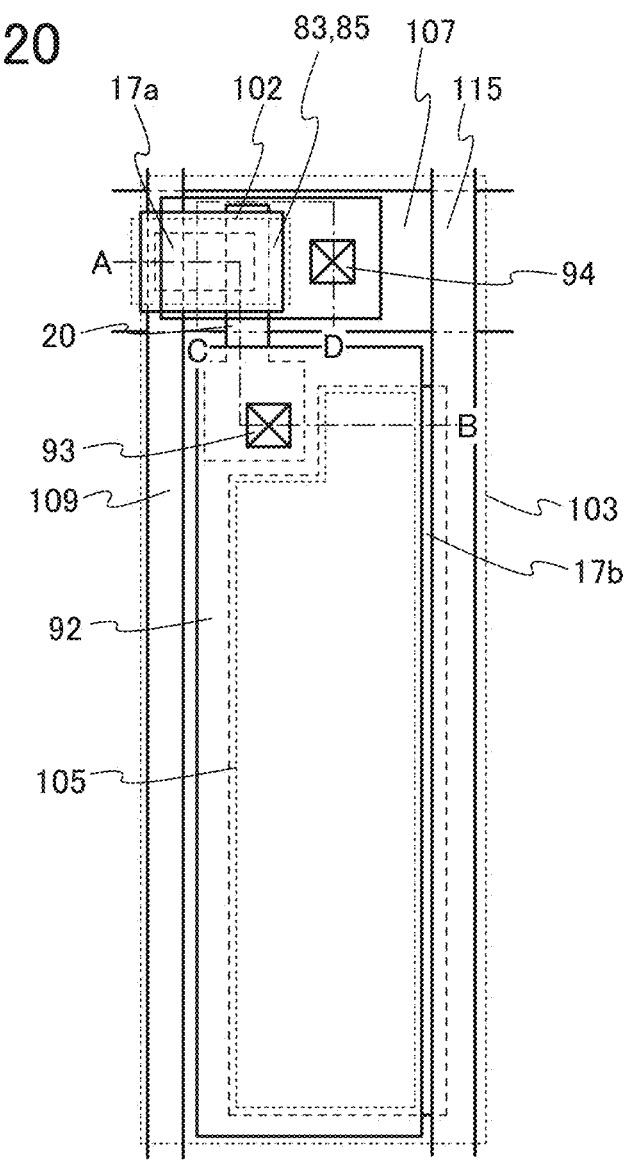
FIG. 20 is a top view illustrating one mode of a semiconductor device.

Next, a specific configuration of an element substrate included in the display device is described. Here, a specific example of a liquid crystal display device including a liquid crystal element in the pixel 103 is described. FIG. 20 is a top view of the pixel 103 illustrated in FIG. 19B.

FIG. 20 is a top view of a pixel included in the VA mode liquid crystal display device. In the FIG. 20, the scan line 107 extends in a direction substantially perpendicular to the signal line 109. The capacitor line 115 extends in a direction parallel to the signal line 109. Note that the scan line 107 is electrically connected to the scan line driver circuit 104 (see FIG. 19A), and the signal line 109 and the capacitor line 115 are electrically connected to the signal line driver circuit 106 (see FIG. 19A).

The transistor 102 is provided in a region where the scan line 107 and the signal line 109 cross each other. The transistor 102 can have a structure similar to that of the transistor 80 described in Embodiment 2. Note that a region of the scan line 107 which overlaps with an oxide semiconductor film 17*a* functions as the gate electrode of the transistor 102, which is represented as the gate electrode 13 in FIG. 21, FIGS. 22A to 22D, and FIGS. 23A to 23C.

Furthermore, a region of the signal line 109 which overlaps with the oxide semiconductor film 17*a* functions as the source electrode or the drain electrode of the transistor 102, which is represented as the electrode 19 in FIG. 21, FIGS. 22A to 22D, and FIGS. 23A to 23C. In addition, in FIG. 20, the whole of the oxide semiconductor film 17*a* overlaps the scan line 107 when seen from the above. Thus, the scan line 107 functions as a light-blocking film for blocking light from a light source such as a backlight. For this reason, the oxide semiconductor film 17*a* included in the transistor is not irradiated with light, so that a variation in the electrical characteristics of the transistor can be suppressed.

The electrode 20 is connected to the electrode 92 in the opening 93. The electrode 92 is formed using a light-transmitting conductive film and functions as a pixel electrode.

The capacitor 105 is connected to the capacitor line 115. The capacitor 105 is formed using a metal oxide film 17*b* formed over a gate insulating film, a dielectric film provided over the transistor 102, and the electrode 92. The dielectric film is formed of a nitride insulating film. The metal oxide film 17*b*, the nitride insulating film, and the electrode 92 each have a light-transmitting property; therefore, the capacitor 105 has a light-transmitting property.

Thanks to the light-transmitting property of the capacitor 105, the capacitor 105 can be formed large (covers a large area) in the pixel 103. Thus, a semiconductor device having charge capacity increased while improving the aperture ratio, for example, to 50% or more, preferably 55% or more, further preferably 60% or more can be obtained. For example, in a semiconductor device with high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. As a typical example, the capacitor 105 can be favorably used in a high-resolution semiconductor device with a pixel density of 200 ppi or more, 300 ppi or more, or 500 ppi or more.

Furthermore, according to one embodiment of the present invention, the aperture ratio can be improved even in a display device with high resolution, which makes it possible to use light from a light source such as a backlight efficiently, so that power consumption of the display device can be reduced.

Figure 21:
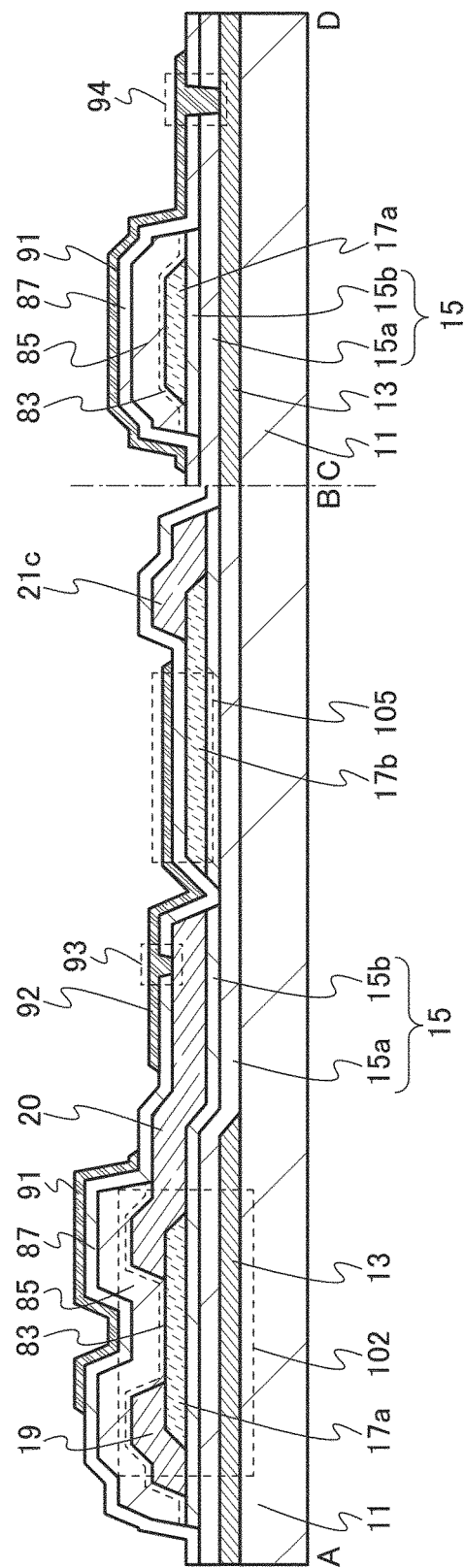
FIG. 21 is a cross-sectional view illustrating one mode of a semiconductor device.

Next, FIG. 21 is a cross-sectional view along dashed dotted lines A-B and C-D in FIG. 20. Note that the cross-sectional view along the dashed dotted line A-B shows a cross section of the transistor 102 in the channel length direction, a cross section of a connection portion between the transistor 102 and the electrode 92 functioning as a pixel electrode, and a cross section of the capacitor 105; the cross-sectional view along the dashed dotted line C-D shows a cross section of the transistor 102 in the channel width direction and a cross section of a connection portion between the gate electrode 13 and the gate electrode 91.

The transistor 102 illustrated in FIG. 21 is a channel-etched transistor, including the gate electrode 13 provided over the substrate 11, the gate insulating film 15 formed over the substrate 11 and the gate electrode 13, the oxide semiconductor film 17*a* overlapping the gate electrode 13 with the gate insulating film 15 positioned therebetween, and the pair of electrodes 19 and 20 in contact with the oxide semiconductor film 17*a*. The oxide insulating film 83 is formed over the gate insulating film 15, the oxide semiconductor film 17a, and the pair of electrodes 19 and 20, and the oxide insulating film 85 is formed over the oxide insulating film 83. The nitride insulating film 87 is formed over the gate insulating film 15, the oxide semiconductor film 17a, the oxide insulating film 83, the oxide insulating film 85, and the electrodes 19 and 20. The electrode 92 and the gate electrode 91 that are in contact with one of the pair of electrodes 19 and 20 (here, the electrode 20) are formed over the nitride insulating film 87. Note that the electrode 92 serves as a pixel electrode.

The gate insulating film 15 includes the nitride insulating film 15a and the oxide insulating film 15b. The oxide insulating film 15b is formed in a region overlapping with the oxide semiconductor film 17a, the pair of electrodes 19 and 20, or the oxide insulating film 83.

As shown in the cross-sectional view along the line C-D, the gate electrode 91 is connected to the gate electrode 13 in the opening 94 provided in the nitride insulating film 15a and the nitride insulating film 87. That is, the gate electrode 13 has the same potential as the gate electrode 91.

The oxide insulating film 83 and the oxide insulating film 85 which are isolated from each other are formed over the transistor 102 described in this embodiment. The isolated oxide insulating films 83 and 85 overlap with the oxide semiconductor film 17a. In the cross-sectional view along the line C-D in the channel width direction, end portions of the oxide insulating film 83 and the oxide insulating film 85 are positioned on the outer side of the oxide semiconductor film 17a. In the channel width direction, on the outer side of each of one side surface and the other side surface of the oxide semiconductor film 17a, the gate electrode 91 and the side surface of the oxide semiconductor film 17a are positioned so that the oxide insulating film 83, the oxide insulating film 85, and the nitride insulating film 87 are positioned therebetween. Furthermore, the nitride insulating film 87 is formed to cover top surfaces and side surfaces of the oxide insulating film 83 and the oxide insulating film 85 and in contact with the nitride insulating film 15a.

In the transistor 102 described in this embodiment, the oxide semiconductor film 17a and the oxide insulating film 85 are surrounded by the nitride insulating film 15a and the nitride insulating film 87. The nitride insulating film 15a and the nitride insulating film 87 each have a small oxygen diffusion coefficient and have a barrier property against oxygen. Thus, part of oxygen contained in the oxide insulating film 85 can be moved to the oxide semiconductor film 17a, so that oxygen vacancies in the oxide semiconductor film 17a can be reduced. In addition, the nitride insulating film 15a and the nitride insulating film 87 each have a small diffusion coefficient of water, hydrogen, and the like and have a barrier property against water, hydrogen, and the like, which can prevent diffusion of water, hydrogen, and the like from the outside into the oxide semiconductor film 17a. For these reason, the transistor 102 has high reliability.

The capacitor 105 includes the metal oxide film 17b formed over the gate insulating film 15, the nitride insulating film 87, and the electrode 92. The metal oxide film 17b in the capacitor 105 is formed at the same time as the oxide semiconductor film 17a and has increased conductivity by containing an impurity. Alternatively, the metal oxide film 17b is formed at the same time as the oxide semiconductor film 17a and has increased conductivity by containing an impurity and including oxygen vacancy which is generated owing to plasma damage.

The oxide semiconductor film 17a and the metal oxide film 17b include the same metal elements. The oxide semiconductor film 17a and the metal oxide film 17b are formed over the gate insulating film 15 and have different impurity concentrations. Specifically, the metal oxide film 17b has a higher impurity concentration than the oxide semiconductor film 17a. For example, the concentration of hydrogen contained in the oxide semiconductor film 17a is lower than $5 \times 10^{19}$ atoms/cm$^3$, preferably lower than $5 \times 10^{18}$ atoms/cm$^3$, further preferably lower than $1 \times 10^{18}$ atoms/cm$^3$, still further preferably lower than $5 \times 10^{17}$ atoms/cm$^3$, yet still further preferably lower than $1 \times 10^{16}$ atoms/cm$^3$. The concentration of hydrogen contained in the metal oxide film 17b is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The concentration of hydrogen contained in the metal oxide film 17b is greater than or equal to 2 times, preferably greater than or equal to 10 times that in the oxide semiconductor film 17a.

By exposing an oxide semiconductor film formed concurrently with the oxide semiconductor film 17a to plasma, the oxide semiconductor film can be damaged, so that an oxygen vacancy can be formed. For example, when a film is formed over the oxide semiconductor film by a plasma CVD method or a sputtering method, the oxide semiconductor film is exposed to plasma, thereby forming an oxygen vacancy. Alternatively, in etching process for forming the oxide insulating film 83 and the oxide insulating film 85, the oxide semiconductor film is exposed to plasma, thereby forming an oxygen vacancy. Further alternatively, the oxide semiconductor film is exposed to plasma of, for example, hydrogen, a rare gas, ammonia, a mixed gas of oxygen and hydrogen, thereby forming an oxygen vacancy. As a result, the conductivity of the oxide semiconductor film is increased, so that the oxide semiconductor film becomes the metal oxide film 17b.

That is, the metal oxide film 17b can also be referred to as an oxide semiconductor film having high conductivity. Furthermore, the metal oxide film 17b can also be referred to as a metal oxide film having high conductivity.

The nitride insulating film 87 contains hydrogen, that is, an insulating film that can release hydrogen. The nitride insulating film 87 preferably has a hydrogen concentration of $1 \times 10^{22}$ atoms/cm$^3$ or higher. When hydrogen in the nitride insulating film 87 is diffused into the oxide semiconductor film formed concurrently with the oxide semiconductor film 17a, hydrogen is bonded to oxygen and electrons serving as carriers are generated in the oxide semiconductor film. When the nitride insulating film 87 is formed by a plasma CVD method or a sputtering method, the oxide semiconductor film is exposed to plasma and oxygen vacancies are generated in the oxide semiconductor film. When hydrogen contained in the nitride insulating film 87 enters the oxygen vacancies, electrons serving as carriers are generated. As a result, the conductivity of the oxide semiconductor film is increased, so that the oxide semiconductor film becomes the metal oxide film 17b.

The metal oxide film 17b has lower resistivity than the oxide semiconductor film 17a. The resistivity of the film 17b having conductivity is preferably greater than or equal to $1 \times 10^{-8}$ times and less than $1 \times 10^{-1}$ times the resistivity of the oxide semiconductor film 17a; as a typical example, the resistivity of the film 17b having conductivity is greater than or equal to $1 \times 10^{-3}$ Ωcm and less than $1 \times 10^4$ Ωcm, preferably greater than or equal to $1 \times 10^{-3}$ Ωcm and less than $1 \times 10^{-1}$ Ωcm.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

Next, a method for manufacturing the transistor 102 and the capacitor 105 illustrated in FIG. 21 will be described with reference to FIGS. 22A to 22D and FIGS. 23A to 23C.

Figure 22:
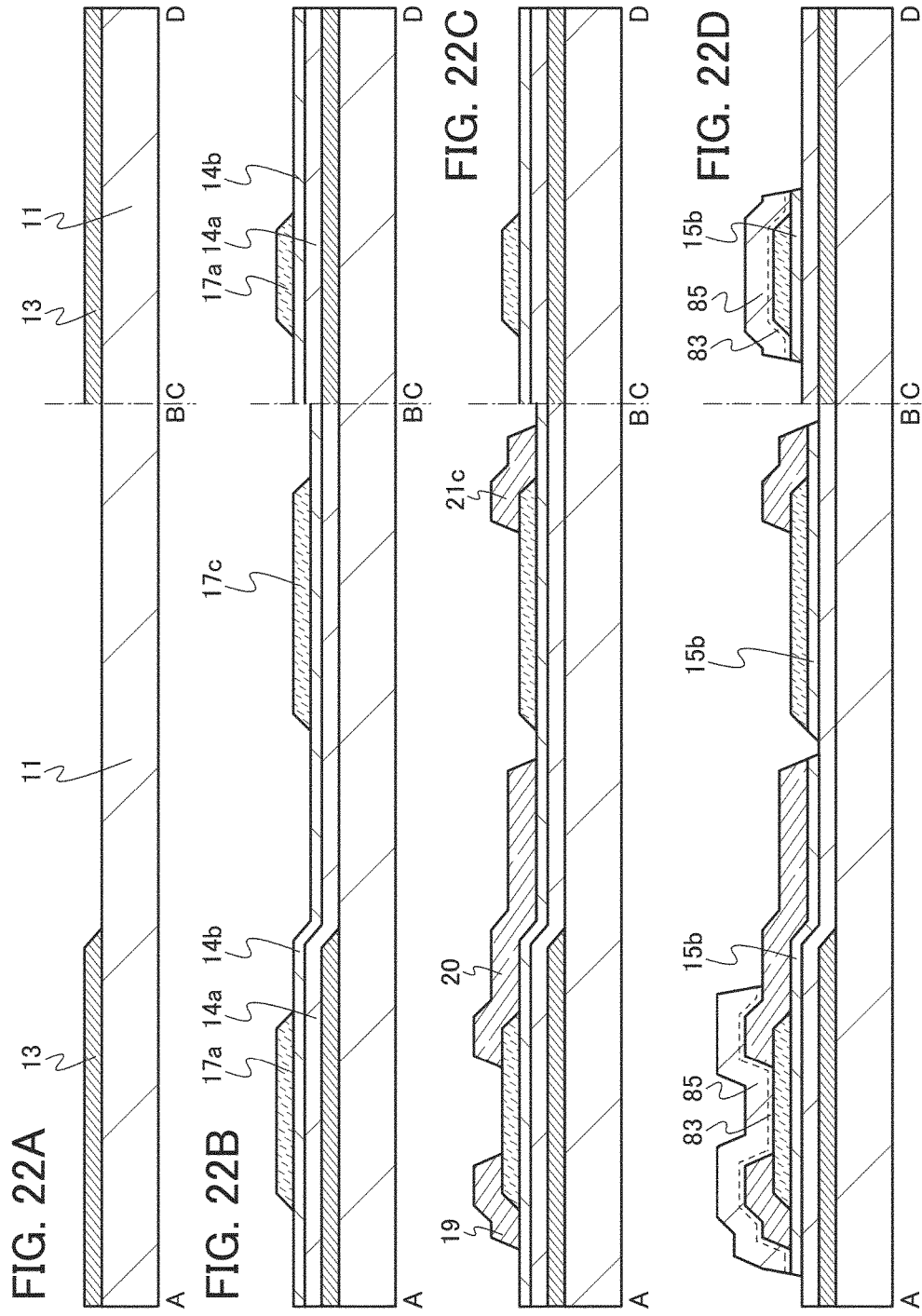
FIGS. 22A to 22D are cross-sectionals views illustrating one mode of a method for manufacturing the semiconductor device.

As illustrated in FIG. 22A, the gate electrode 13 is formed over the substrate 11. The gate electrode 13 can be formed by a photolithography process using a first photomask.

Next, as illustrated in FIG. 22B, the nitride insulating film 14a to be the nitride insulating film 15a and the oxide insulating film 14b to be the oxide insulating film 15b are formed over the gate electrode 13. Subsequently, the oxide semiconductor film 17a and an oxide semiconductor film 17c to be the metal oxide film 17b are formed over the oxide insulating film 14b. The oxide semiconductor films 17a and 17c can be formed by a photolithography process using a second photomask.

Then, heat treatment is performed at a temperature higher than 350° C. and lower than a strain point of the substrate, preferably higher than or equal to 450° C. and lower than or equal to 600° C. Consequently, it is possible to obtain the oxide semiconductor films 17a and 17c in each of which the proportion of CAAC is 70% or more and less than 100%, preferably 80% or more and less than 100%, further preferably 90% or more and less than 100%, still further preferably 95% or more and 98% or less when an observation area is changed one-dimensionally within a range of 300 nm in observation with a transmission electron diffraction measurement apparatus. Furthermore, it is possible to obtain the oxide semiconductor films 17a and 17c each having a low content of hydrogen, water, and the like. That is, an oxide semiconductor film with a low impurity concentration and a low density of defect states can be formed.

Then, as illustrated in FIG. 22C, the pair of electrodes 19 and 20 and a conductive film 21c serving as a capacitor line are formed. The pair of electrodes 19 and 20 and the conductive film 21c can be formed by a photolithography process using a third photomask.

After that, as illustrated in FIG. 22D, the oxide insulating films 83 and 85 are formed. The oxide insulating films 83 and 85 can be formed by a photolithography process using a fourth photomask.

As illustrated in the cross-sectional view along the line C-D in FIG. 22D, in the channel width direction, the oxide insulating films 83 and 85 are formed so that end portions of the oxide insulating films 83 and 85 are positioned on outer sides of the side surfaces of the oxide semiconductor film 17a. Note that the oxide insulating film 14b is partly etched by etching for forming the oxide insulating film 83, so that the oxide insulating film 15b is formed. As a result, the nitride insulating film 14a is exposed. Furthermore, the oxide semiconductor film 17c is damaged by plasma in this etching step; thus, oxygen vacancies are formed in the oxide semiconductor film 17c.

Next, heat treatment is performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C.

By the heat treatment, part of oxygen contained in the oxide insulating film 85 can be moved to the oxide semiconductor film 17a, so that oxygen vacancies in the oxide semiconductor film 17a can be repaired. Thus, oxygen vacancies contained in the oxide semiconductor film 17a can be further reduced.

Figure 23:
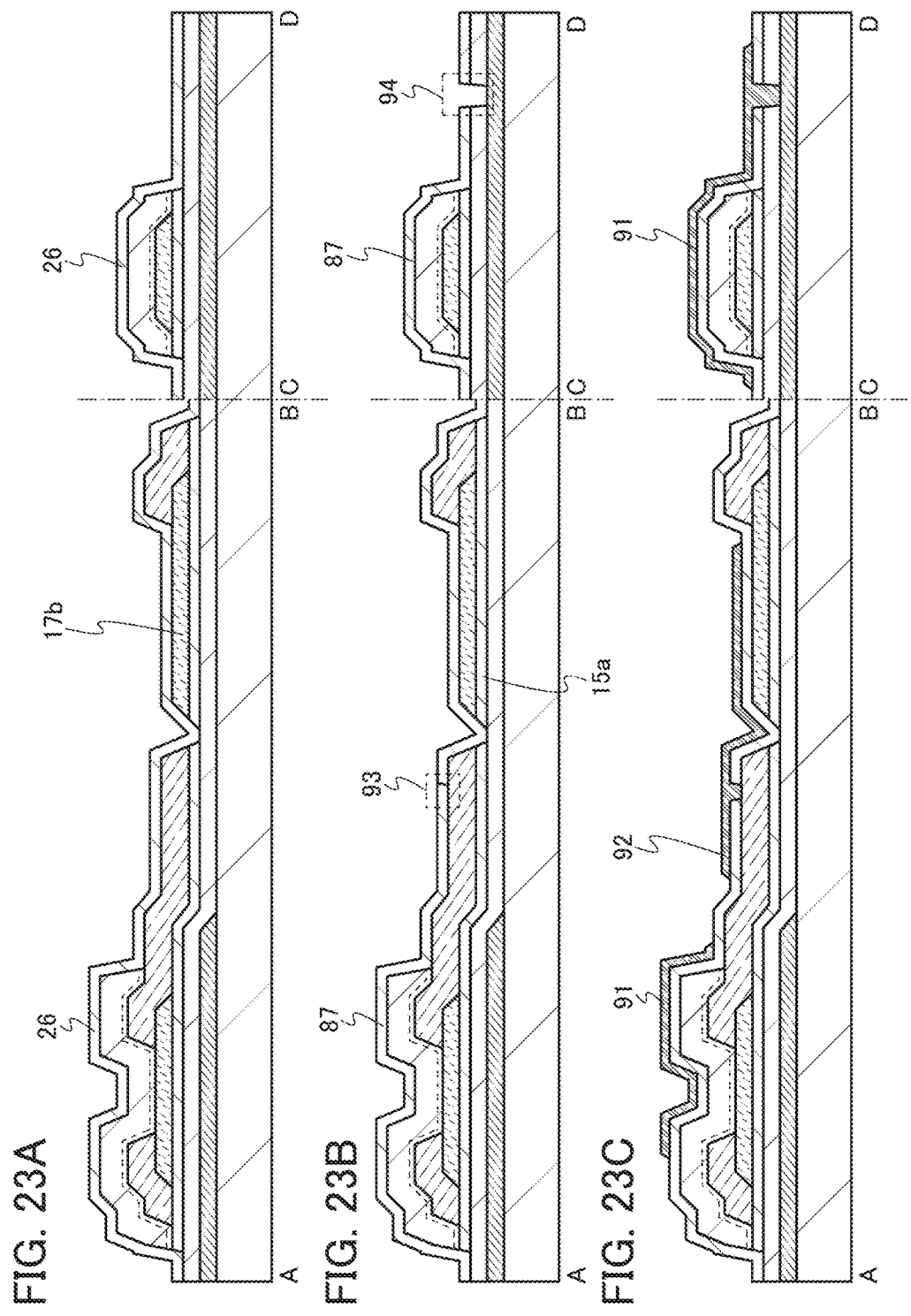
FIGS. 23A to 23C are cross-sectionals views illustrating one mode of a method for manufacturing the semiconductor device.

Then, as illustrated in FIG. 23A, the nitride insulating film 26 to be the nitride insulating film 87 is formed.

The nitride insulating film 26 is formed by a sputtering method, a CVD method, or the like, so that the oxide semiconductor film 17c is exposed to plasma; thus, oxygen vacancies in the oxide semiconductor film 17c can be increased.

Through the step, the nitride insulating film 15a and the nitride insulating film 26 are in contact with each other so as to surround the oxide semiconductor film 17a, the oxide insulating film 83, and the oxide insulating film 85. In addition, the oxide semiconductor film 17c becomes the metal oxide film 17b. Note that in the case where a silicon nitride film is formed as the nitride insulating film 26 by a plasma CVD method, hydrogen contained in the silicon nitride film is diffused into the oxide semiconductor film 17c, which increases the conductivity.

Next, heat treatment may be performed. The heat treatment is performed at, as a typical example, a temperature higher than or equal to 150° C. and lower than or equal to 400° C., preferably higher than or equal to 300° C. and lower than or equal to 400° C., further preferably higher than or equal to 320° C. and lower than or equal to 370° C. Since the oxide semiconductor film 17a and the oxide insulating films 83 and 85 are provided in a region surrounded by the nitride insulating films 15a and 87 which are in contact with each other, the diffusion of oxygen from the oxide semiconductor film 17a and the oxide insulating films 83 and 85 to the outside can be prevented.

Next, a mask is formed over the nitride insulating film 26 by a photolithography process using a fifth photomask. Then, the nitride insulating film 14a and the nitride insulating film 26 are etched using the mask to form the nitride insulating film 87 having the openings 93 and 94 and the nitride insulating film 15a having the opening 94 as illustrated in FIG. 23B.

After that, the gate electrode 91 and the electrode 92 serving as a pixel electrode are formed as illustrated in FIG. 23C. Note that the gate electrode 91 and the electrode 92 serving as a pixel electrode can be formed by a photolithography process using a sixth photomask. Accordingly, the electrode 20 and the electrode 92 are connected to each other through the opening 93. In addition, the gate electrode 13 and the gate electrode 91 are connected to each other through the opening 94.

Through the above process, the transistor 102 can be manufactured and the capacitor 105 can also be manufactured.

On an element substrate of the semiconductor device described in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

From the above, a semiconductor device which includes an oxide semiconductor film and has improved electrical characteristics can be obtained.

Modification Example 1

Figure 24:
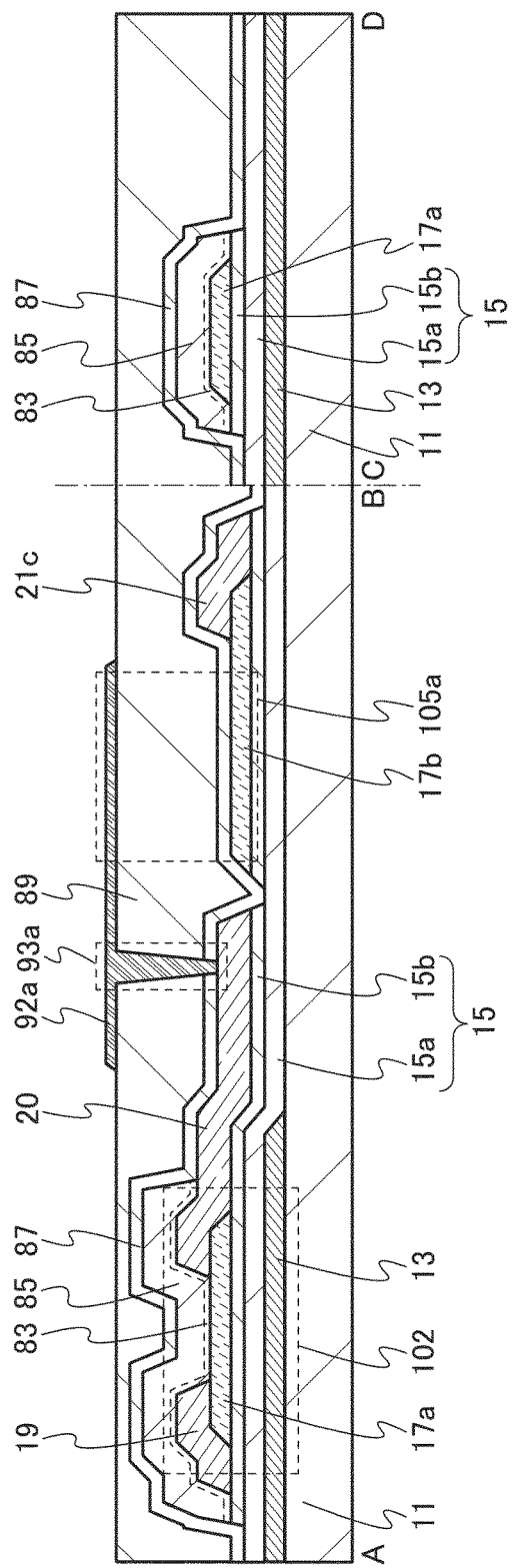
FIG. 24 is a cross-sectional view illustrating one mode of a semiconductor device.

In the semiconductor device in this embodiment, as illustrated in FIG. 24, the transistor 10 in Embodiment 1 may be used as the transistor 102 and a planarization film 89 may be provided over the nitride insulating film 87. The capacitor 105a includes the metal oxide film 17b, the nitride insulating film 87, the planarization film 89, and an electrode 92a. Consequently, the electrode 92a can have a flat surface, resulting in a reduction of unevenness in alignment of the liquid crystal molecules included in the liquid crystal layer.

Modification Example 2

The semiconductor device in this embodiment can be an FFS mode liquid crystal display device. A structure of the FFS mode liquid crystal display device is described with reference to FIG. 25.

Figure 25:
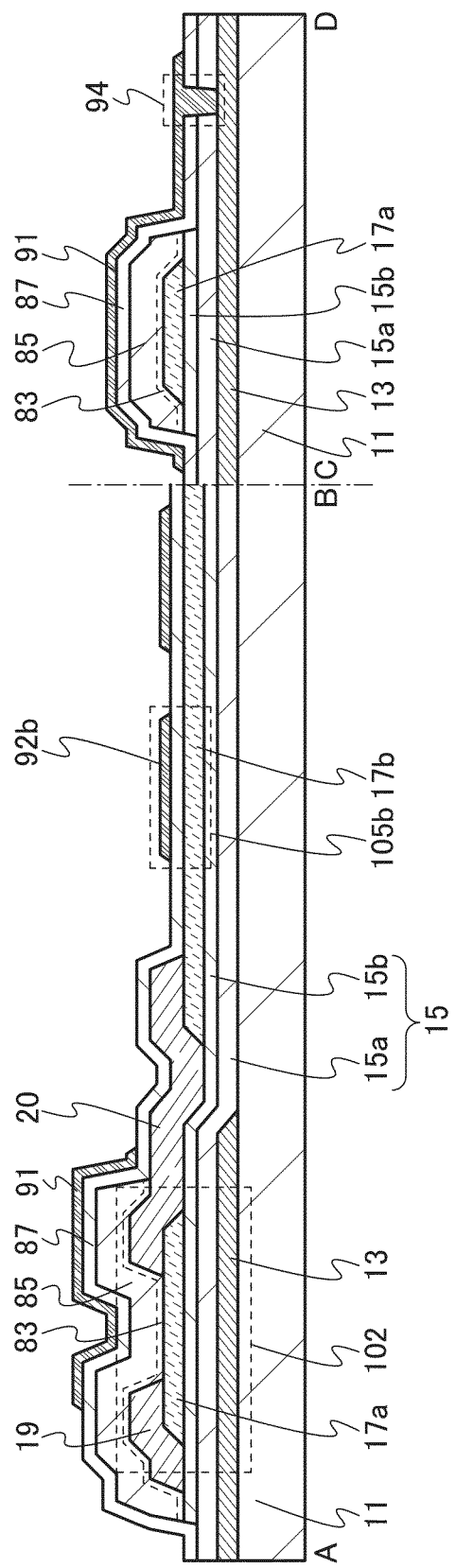
FIG. 25 is a cross-sectional view illustrating one mode of a semiconductor device.

FIG. 25 is a cross-sectional view of the semiconductor device. The metal oxide film 17b is in contact with the electrode 20. Here, the metal oxide film 17b serves as a pixel electrode. A common electrode 92b is provided over the nitride insulating film 87. The common electrode 92b can be formed in a manner similar to that of the electrode 92 in this embodiment. Note that a slit is formed in the common electrode 92b. Instead of the common electrode 92b with a slit, a common electrode with a stripe pattern may be provided.

A region where the metal oxide film 17b, the nitride insulating film 26, and the common electrode 92b overlap with one another functions as the capacitor 105b. When a voltage is applied to the metal oxide film 17b, a parabolic electric field is generated between the metal oxide film 17b and the common electrode 92b. Accordingly, liquid crystal molecules included in the liquid crystal layer can be aligned. The FFS mode liquid crystal display device has a high aperture ratio, can have a wide viewing angle, and can improve an image contrast.

Note that when part of the common electrode 92b is provided to overlap with the electrode 20, the electrode 20, the nitride insulating film 87, and the common electrode 92b function as a capacitor; thus, the potential of the metal oxide film 17b can be held.

The structures, methods, and the like described in this embodiment can be used as appropriate in combination with any of the structures, methods, and the like described in the other embodiments.

Embodiment 6

In this embodiment, a semiconductor device of one embodiment of the present invention is described with reference to FIG. 26, FIGS. 27A to 27C, and FIG. 28.

Figure 26:
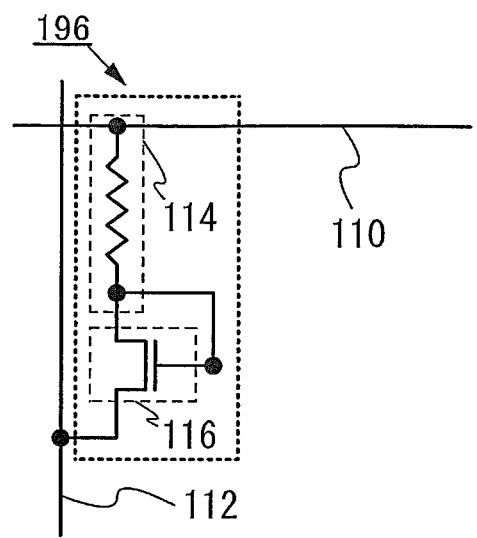
FIG. 26 is a circuit diagram illustrating a protection circuit portion.

FIG. 26 illustrates a specific example of a protection circuit portion 196 included in the semiconductor device.

The protection circuit portion 196 illustrated in FIG. 26 include a resistor 114 connected between a wiring 110 and a wiring 112, and a transistor 116 that is diode-connected.

The resistor 114 is connected to the transistor 116 in series, so that the resistor 114 can control the value of current flowing through the transistor 116 or can function as a protective resistor of the transistor 116 itself.

The wiring 110 is, for example, a lead wiring from a scan line, a data line, or a terminal portion to a driver circuit portion. The wiring 112 is, for example, a wiring that is supplied with a potential (VDD, VSS, or GND) of a power supply line for supplying power to a gate driver or a source driver. Alternatively, the wiring 112 is a wiring that is supplied with a common potential (common line).

For example, the wiring 112 is preferably connected to the power supply line for supplying power to a scan line driver circuit, in particular, to a wiring for supplying a low potential. This is because a gate signal line has a low-level potential in most periods, and thus, when the wiring 112 also has a low-level potential, current leaked from the gate signal line to the wiring 112 can be reduced in a normal operation.

A structural example of the resistor 114 that can be used for the protection circuit portion 196 is described with reference to FIGS. 27A to 27C.

Figure 27A:
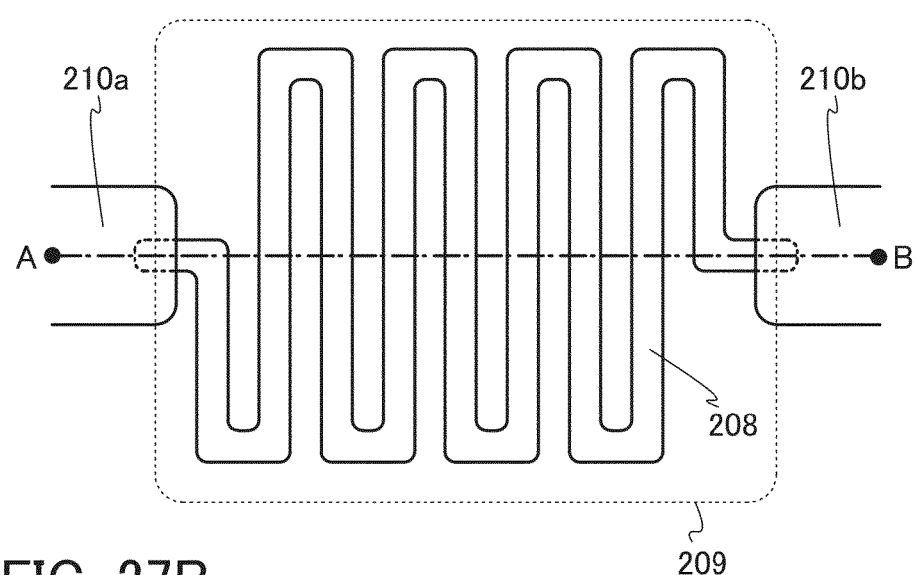
FIGS. 27A to 27C are a top view and cross-sectional views illustrating resistors.
Figure 27B:
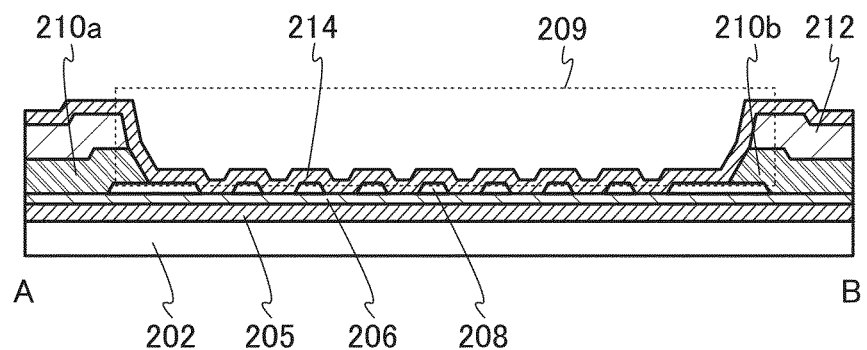
Figure 27C:
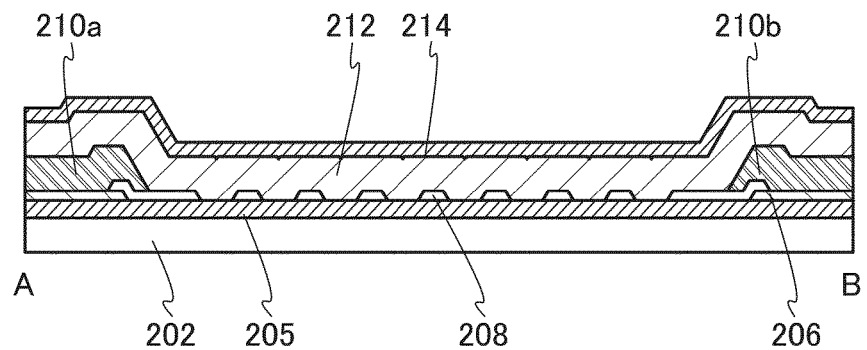

FIG. 27A is a top view of the resistor 114, FIG. 27B is a cross-sectional view taken along the dashed-dotted line A-B in FIG. 27A, and FIG. 27C a cross-sectional view taken along the dashed-dotted line A-B in FIG. 27A. In FIG. 27A, some components are omitted to avoid complexity.

The resistor 114 illustrated in FIGS. 27A to 27C each include a substrate 202, a nitride insulating film 205 over the substrate 202, an oxide insulating film 206 over the nitride insulating film 205, a metal oxide film 208 over the oxide insulating film 206, a conductive film 210a electrically connected to the metal oxide film 208, a conductive film 210b electrically connected to the metal oxide film 208, an oxide insulating film 212 over the conductive film 210a and the conductive film 210b, and a nitride insulating film 214 over the oxide insulating film 212.

The resistor 114 illustrated in FIG. 27B has the oxide insulating film 206 and an opening 209 in the oxide insulating film 212, unlike the resistor illustrated in FIG. 27C. The structure of the insulating films in contact with the upper side and the lower side of the metal oxide film 208 can be changed by the presence or absence of the opening 209.

As illustrated in FIGS. 27A to 27C, the shape, specifically, the length or width of the metal oxide film 208 is adjusted as appropriate so that the resistor can have a given resistance.

The resistor 114 illustrated in FIG. 27B or 27C can be formed at the same time as any of the transistors in Embodiments 1 to 5. Here, description is given with the use of the transistor in Embodiment 5 as a typical example.

The resistor in FIG. 27B includes the nitride insulating film 205, the oxide insulating film 206 over the nitride insulating film 205, the metal oxide film 208 over the oxide insulating film 206, and the nitride insulating film 214 over the metal oxide film 208. The resistor in FIG. 27C includes the nitride insulating film 205, the metal oxide film 208 over the nitride insulating film 205, the oxide insulating film 212 over the metal oxide film 208, and the nitride insulating film 214 over the oxide insulating film 212.

The structure of the insulating films in contact with the upper side and the lower side of the metal oxide film 208 are made different as described above, so that the resistance of the metal oxide film 208 can be controlled. Specifically, for example, when an oxide semiconductor is used as a material for the metal oxide film 208, the resistance of the oxide semiconductor can be controlled with oxygen vacancies in the oxide semiconductor or an impurity (such as hydrogen or water) in the oxide semiconductor. The resistivity of the metal oxide film 208 is preferably $1 \times 10^{-3}$ $\Omega$cm or higher and lower than $1 \times 10^4$ $\Omega$cm, further preferably $1 \times 10^{-3}$ $\Omega$cm or higher and lower than $1 \times 10^{-1}$ $\Omega$cm.

For example, like the nitride insulating films 15a and 87 described in Embodiment 5, the nitride insulating film 205 and 214 are each formed using an insulating film containing hydrogen, that is, an insulating film that can release hydrogen, typically, a silicon nitride film; thus, hydrogen can be supplied to the metal oxide film 208. The nitride insulating film preferably has a hydrogen concentration of $1\times10^{22}$ atoms/cm$^3$ or higher. With such an insulating film, hydrogen can be supplied to the metal oxide film 208. Hydrogen is supplied, i.e., an impurity is introduced to the metal oxide film 208; thus, the resistance of the metal oxide film 208 is reduced. In addition, like the oxide insulating films 15b, 83, and 85 described in Embodiment 5, the oxide insulating films 206 and 212 are each formed using an insulating film containing oxygen, that is, an oxide insulating film that can release oxygen, typified by a silicon oxide film or a silicon oxynitride film; thus, oxygen can be supplied to the metal oxide film 208. Supply of oxygen to the metal oxide film 208 reduces the number of oxygen vacancies in the metal oxide film 208, and thus the resistance of the metal oxide film 208 is increased.

Note that the nitride insulating film 205 and the oxide insulating film 206 can be formed at the same time as the nitride insulating film 15a and the oxide insulating film 15b, respectively, described in Embodiment 5. The metal oxide film 208 can be formed at the same time as the metal oxide film 17b described in Embodiment 5. The conductive films 210a and 210b can be formed at the same time as the pair of electrodes 19 and 20 and the conductive film 21c serving as the capacitor wiring that are described in Embodiment 5. The oxide insulating film 212 can be formed at the same time as the oxide insulating films 83 and 85 described in Embodiment 5. The nitride insulating film 214 can be formed at the same time as the nitride insulating film 87 described in Embodiment 5.

Although the resistor 114 illustrated in FIG. 27 is connected in series to the diode-connected transistor in FIG. 26, the resistor 114 can be connected in parallel to the diode-connected transistor without being limited to the example in FIG. 26.

The resistors 114 illustrated in FIGS. 27A to 27C can each have a plurality of transistors and a plurality of resistors in combination and can be provided in a display device. A structure illustrated in FIG. 28 can be employed, specifically.

Figure 28:
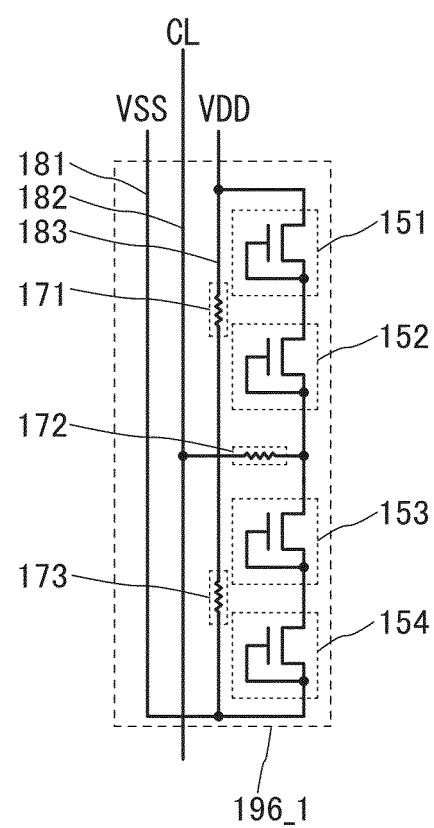
FIG. 28 is a circuit diagram illustrating a protection circuit portion.

A protection circuit portion 196_1 illustrated in FIG. 28 includes transistors 151, 152, 153, and 154 and resistors 171, 172, and 173. The protection circuit portion 196_1 is provided between a set of wirings 181, 182, and 183 and another set of wirings 181, 182, and 183. The wirings 181, 182, and 183 are connected to one or more of a scan line driver circuit, a signal line driver circuit, and a pixel portion. A first terminal serving as a source electrode of the transistor 151 is connected to a second terminal serving as a gate electrode of the transistor 151, and a third terminal serving as a drain electrode of the transistor 151 is connected to the wiring 183. A first terminal serving as a source electrode of the transistor 152 is connected to a second terminal serving as a gate electrode of the transistor 152, and a third terminal serving as a drain electrode of the transistor 152 is connected to the first terminal of the transistor 151. A first terminal serving as a source electrode of the transistor 153 is connected to a second terminal serving as a gate electrode of the transistor 153, and a third terminal serving as a drain electrode of the transistor 153 is connected to the first terminal of the transistor 152. A first terminal serving as a source electrode of the transistor 154 is connected to a second terminal serving as a gate electrode of the transistor 154, and a third terminal serving as a drain electrode of the transistor 154 is connected to the first terminal of the transistor 153. The first terminal of the transistor 154 is connected to the wiring 183 and the wiring 181. The resistors 171 and 173 are provided in the wiring 183. The resistor 172 is provided between the wiring 182 and the first terminal of the transistor 152 and the third terminal of the transistor 153.

Note that the wiring 181 can be used as a power supply line to which the low power supply potential VSS is applied, for example. The wiring 182 can be used as a common line, for example. The wiring 183 can be used as a power supply line to which the high power supply potential VDD is applied.

The resistors 114 illustrated in FIGS. 27A to 27C can be used as the resistors 171 to 173 in FIG. 28.

In this manner, the protection circuit portion 196_1 includes the plurality of transistors that are diode-connected and the plurality of resistors. That is, the protection circuit portion 196_1 can include diode-connected transistors and resistors that are combined in parallel.

With the protection circuit portion, the semiconductor device can have an enhanced resistance to overcurrent due to ESD. Therefore, a novel semiconductor device with improved reliability can be provided.

Because the resistor can be used in the protection circuit portion and the resistance of the resistor can be controlled arbitrarily, the diode-connected transistor or the like that is used in the protection circuit portion can also be protected.

The structure described in this embodiment can be used in appropriate combination with the structure described in any of the other embodiments.

Embodiment 7

In this embodiment, an example of a semiconductor device (memory device) which uses any of the transistors of embodiments of the present invention, can hold stored data even when not powered, and does not have a limitation on the number of write cycles, is described with reference to FIGS. 29A and 29B.

Figure 29A:
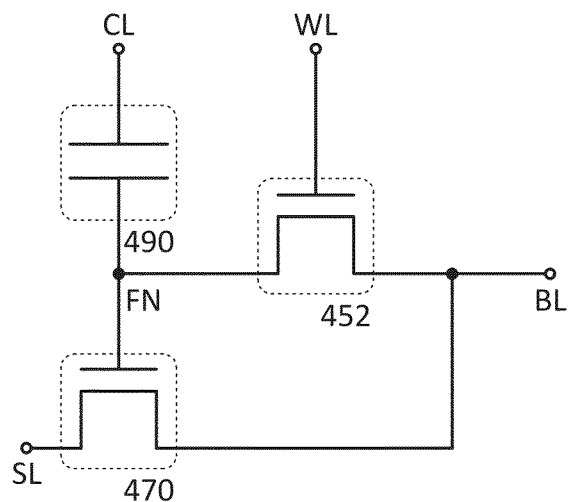
FIGS. 29A and 29B are a circuit diagram and a cross-sectional view illustrating one mode of a semiconductor device.

FIG. 29A is an example of a circuit diagram of a semiconductor device of one embodiment of the present invention. The semiconductor device in FIG. 29A includes a transistor 470 using a first semiconductor, a transistor 452 using a second semiconductor, a capacitor 490, a wiring BL, a wiring WL, a wiring CL, and a wiring SL. Note that as the transistor 452 using the second semiconductor, any of the transistors described in Embodiments 1 to 3 can be used. In this embodiment, a transistor having a structure similar to that of the transistor 450 described in Embodiment 3 is used as the transistor 452 using the second semiconductor.

One of a source and a drain of the transistor 452 is electrically connected to the wiring BL, the other of the source and the drain of the transistor 452 is electrically connected to one electrode of the capacitor 490, and a gate of the transistor 452 is electrically connected to the wiring WL. The other electrode of the capacitor 490 is electrically connected to the wiring CL. A node between the other of the source and the drain of the transistor 452 and the one electrode of the capacitor 490 is referred to as a node FN. One of a source and a drain of the transistor 470 is electrically connected to the wiring BL, the other of the source and the drain of the transistor 470 is electrically connected to the wiring SL, and a gate of the transistor 470 is electrically connected to the node FN.

In the semiconductor device in FIG. 29A, a potential corresponding to the potential of the wiring BL is applied to the node FN when the transistor 452 is on. The semiconductor device has a function of holding the potential of the node FN when the transistor 452 is off. This means that the semiconductor device in FIG. 29A functions as a memory cell of a memory device.

On and off of the transistor 452 can be controlled by a potential applied to the wiring WL. With the use of a transistor with low off-state current as the transistor 452, the potential of the node FN can be held for a long time when the transistor 452 is off. Thus, the refresh rate of the semiconductor device can be reduced, resulting in low power consumption of the semiconductor device. Note that as an example of the transistor with low off-state current, a transistor using an oxide semiconductor can be given.

A constant potential such as a ground potential is applied to the wiring CL. At this time, an apparent threshold voltage of the transistor 470 is changed because of the potential of the node FN. When the apparent threshold voltage is changed, the transistor 470 is turned on or off accordingly; thus, data can be read.

A plurality of semiconductor devices each illustrated in FIG. 29A are arranged in matrix, whereby a memory device (memory cell array) can be formed.

Figure 29B:
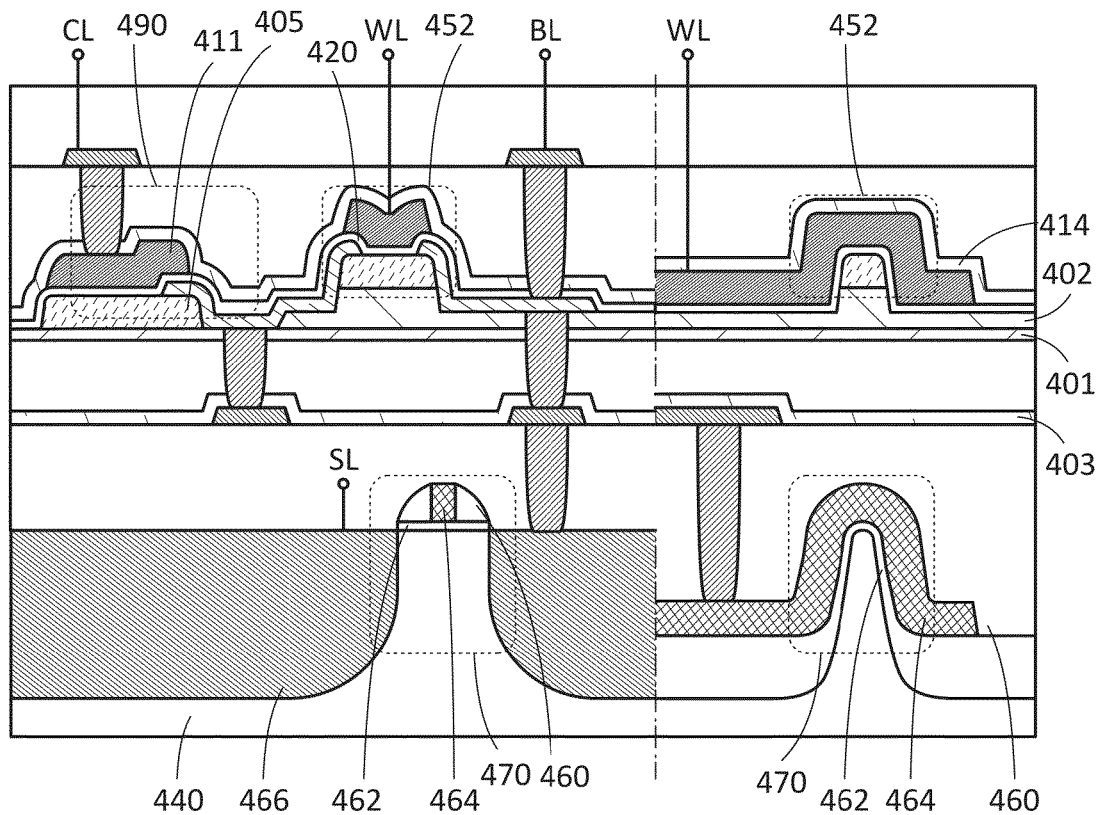

FIG. 29B illustrates an example of a cross-sectional view of the semiconductor device in FIG. 29A.

In the semiconductor device illustrated in FIG. 29B, the transistor 452 and the capacitor 490 are provided over the transistor 470. In the transistor 452, an insulating film 420 functioning as a gate insulating film is provided to cover a pair of electrodes, and also functions as a dielectric film of the capacitor 490. Note that the transistor 452 has the same structure as the transistor 450 except that the insulating film 420 functioning as the gate insulating film is provided to cover the pair of electrodes. The insulating film 420 can be formed using the same material as the gate insulating film 410.

In FIG. 29B, the capacitor 490 includes a nitride insulating film 401, a metal oxide film 405 in contact with the nitride insulating film 401, the insulating film 420 functioning as the dielectric film, and a conductive film 411 at least partly overlapping with the metal oxide film 405. The metal oxide film 405 included in the capacitor 490 can be formed in the same step as the oxide semiconductor film 406 of the transistor 452. In the transistor 450, the insulating film 402 in contact with the oxide semiconductor film 406 is provided so that a region overlapping with the metal oxide film 405 is selectively removed. Thus, the metal oxide film 405 is in contact with the nitride insulating film 401 provided under the insulating film 402. The nitride insulating film 401 is an insulating film containing hydrogen, that is, an insulating film capable of releasing hydrogen; therefore, hydrogen is supplied to the metal oxide film 405 when the insulating film 401 is in contact with the metal oxide film 405. Consequently, with the structure illustrated in FIG. 29B, the metal oxide film 405 can have low resistance and thus can function as the one electrode of the capacitor 490. The conductive film 411, that is, the other electrode of the capacitor 490, can be formed in the same step as the gate electrode of the transistor 452.

In FIG. 29B, the transistor 470 is formed using a semiconductor substrate 440. The transistor 470 includes a projecting portion of the semiconductor substrate 440, impurity regions 466 in the projecting portion, an insulating film 462 having a region in contact with a top surface and side surfaces of the projecting portion, a conductive film 464 facing the top surface and the side surfaces of the projecting portion with the insulating film 462 positioned therebetween, and an insulating film 460 in contact with side walls of the conductive film 464. The conductive film 464 functions as the gate electrode of the transistor 470. The impurity regions 466 function as a source region and a drain region of the transistor 470. Note that the transistor 470 does not necessarily include the insulating film 460. The transistor 470 is also referred to as an FIN-type transistor because it uses the projecting portion of the semiconductor substrate 440. Note that an insulating film may be provided over the projecting portion. The insulating film functions as a mask when the projecting portion of the semiconductor substrate 440 is formed.

Here is shown an example of the semiconductor substrate 440 including the projection portion; however, the semiconductor device of one embodiment of the present invention is not limited thereto. For example, a semiconductor substrate having a projection portion may be formed by processing an SOI substrate.

The transistor 470 may be either an n-channel transistor or a p-channel transistor, and an appropriate transistor is used in accordance with a circuit.

For the semiconductor substrate 440, a semiconductor having an energy gap different from that of an oxide semiconductor may be used. For example, a substrate formed of a semiconductor material other than an oxide semiconductor can be used for the semiconductor substrate 440. When single crystal silicon is used for the semiconductor substrate, the transistor 470 can operate at high speed.

In the semiconductor device in FIG. 29B, the transistor 452 and the capacitor 490 are provided over the transistor 470 with insulating films positioned therebetween. Between the transistor 470 and the transistor 452, a plurality of conductive films which function as wirings are provided. Wirings or electrodes provided in an upper layer and a lower layer are electrically connected to each other by a plurality of conductive films embedded in the insulating films.

Such a structure including stacked transistors can increase the degree of integration of a semiconductor device.

Here, when single crystal silicon is used for the semiconductor substrate 440, an insulating film in the vicinity of the semiconductor substrate 440 preferably has high hydrogen concentration. The hydrogen terminates dangling bonds of silicon, so that the reliability of the transistor 470 can be increased. Meanwhile, the insulating film in the vicinity of the oxide semiconductor film included in the transistor 452 preferably has low hydrogen concentration. This is because since the hydrogen causes carriers to be generated in the oxide semiconductor film, the reliability of the transistor 452 might be reduced when the hydrogen concentration of the vicinity of the insulating film is high. Therefore, in the case where the transistor 470 using single crystal silicon and the transistor 452 using an oxide semiconductor are stacked, providing the insulating film 403 having a function of blocking hydrogen between the transistors is effective because the reliability of the transistors can be increased.

The insulating film 403 may be, for example, formed to have a single-layer structure or a stacked-layer structure using an insulating film containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), silicon nitride, or the like.

As the insulating film 414 that covers the transistor 452 using the oxide semiconductor, an insulating film having a function of blocking hydrogen is preferably formed. Note that an aluminum oxide film is preferably provided as the insulating film 414. The aluminum oxide film has a high effect of blocking both oxygen and impurities such as hydrogen and moisture. Therefore, the use of the aluminum oxide film as the insulating film 414 covering the transistor 452 makes it possible to prevent release of oxygen from the oxide semiconductor included in the transistor 452 and entry of water and hydrogen into the oxide semiconductor film.

Note that the transistor 470 can be a transistor of various types without being limited to the FIN-type transistor. For example, a planar transistor can be used.

The transistor 452 may be formed on the same surface as the transistor 470. At this time, a transistor in which a channel is formed in an oxide semiconductor may be used as the transistor 470. When the transistor 452 and the transistor 470 are formed on the same surface, components included in the transistors can be formed through the same steps. That is, the number of manufacturing steps of the semiconductor device can be small as compared to the case where the transistor 452 and the transistor 470 are formed through different steps, resulting in improvement of the productivity of the semiconductor device.

Figure 30:
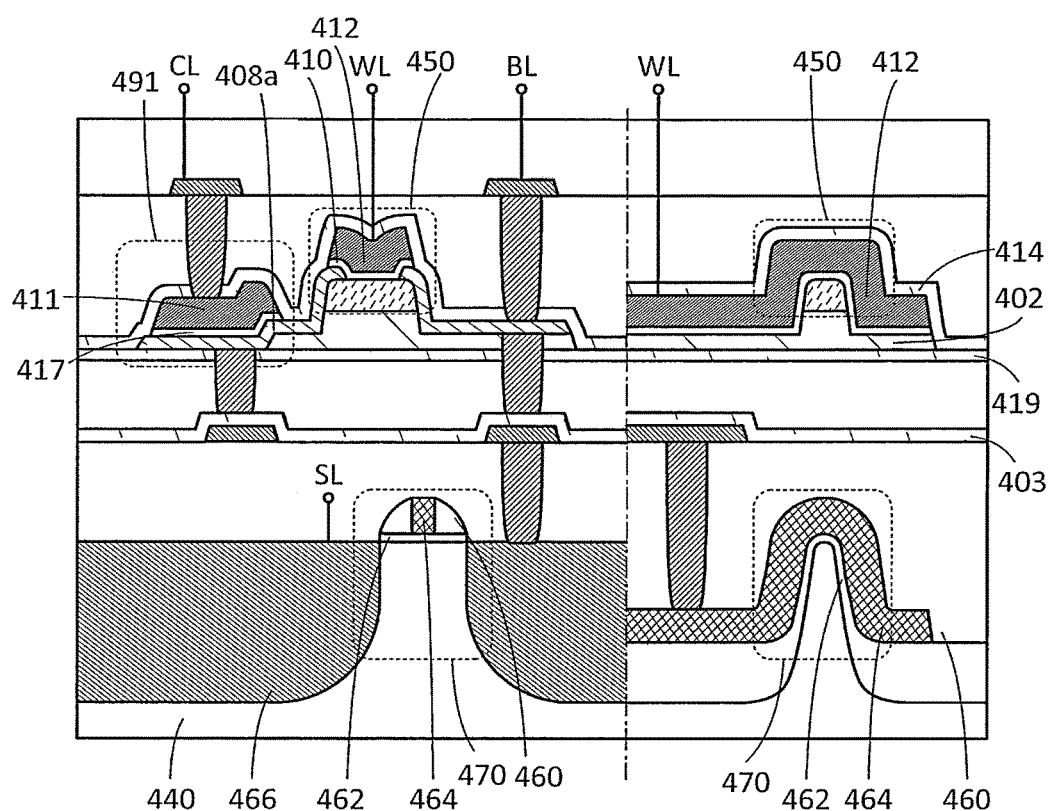
FIG. 30 is a cross-sectional view illustrating one mode of a semiconductor device.
Figure 31A:
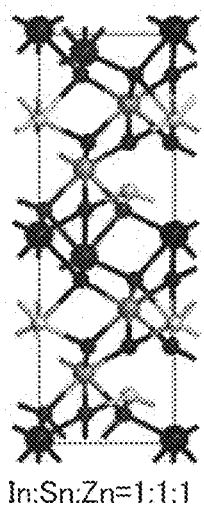
FIGS. 31A to 31D are diagrams illustrating crystal structures of an In—Sn—Zn oxide and an In—Ga—Zn oxide.
Figure 31B:
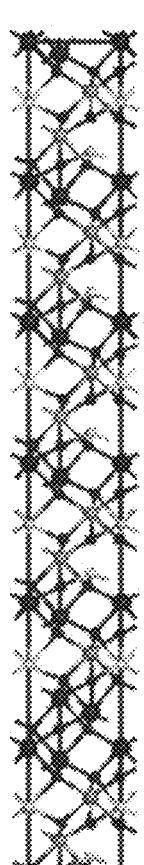
Figure 31C:
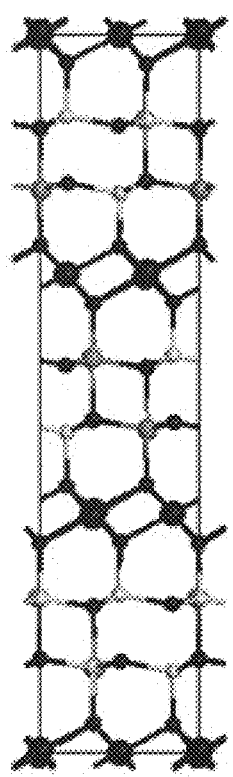
Figure 31D:
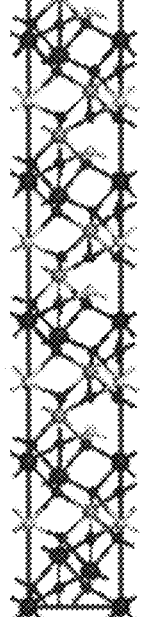

Although the one electrode of the capacitor 490 is formed using the metal oxide film 405 in FIG. 29B, the structure in this embodiment is not limited thereto. FIG. 30 illustrates a modification example of this embodiment. In a semiconductor device illustrated in FIG. 30, instead of the transistor 452 in the semiconductor device illustrated in FIGS. 29A and 29B, the transistor 450 described in Embodiment 3 is included, and instead of the capacitor 490 in FIGS. 29A and 29B, a capacitor 491 is included. In the capacitor 491, the electrode 408a, which is the one of the pair of electrodes functioning as the source electrode or the drain electrode of the transistor 450, is used as one electrode.

In FIG. 30, an insulating film 417 functioning as a dielectric film of the capacitor 491 is formed in the same step as the gate insulating film 410 of the transistor 450, and an insulating film is etched in a self-aligned manner with the use of the conductive film 411 and the gate electrode 412 as masks to form the insulating film 417 and the gate insulating film 410. Furthermore, the insulating film 402 is etched at the same time as the processing into the insulating film 417 and the gate insulating film 410, so that an insulating film 419 and the insulating film 414 are in contact with each other in outer edges of the transistor 450 and the capacitor 491. In other words, in the semiconductor device illustrated in FIG. 30, the transistor 450 and the capacitor 491 are surrounded by the insulating film 419 and the insulating film 414.

In the structure illustrated in FIG. 30, side surfaces of the gate insulating film 410 and side surfaces and a bottom surface of the insulating film 402 are covered with the insulating films 414 and 419; therefore, an insulating film having a property of blocking oxygen and hydrogen, such as an aluminum oxide film, is preferably used as each of the insulating film 419 and the insulating film 414. Thus, it is possible to prevent release of oxygen from the insulating film 402 and the gate insulating film 410 which are in contact with the oxide semiconductor film, and entry of water and hydrogen into the oxide semiconductor film. Furthermore, an insulating film containing excess oxygen is preferably provided as the insulating film 402 and/or the gate insulating film 410, in which case oxygen contained in the insulating film can be effectively supplied to the oxide semiconductor film. Note that when an insulating film having a function of blocking hydrogen (e.g., an aluminum oxide film) as the insulating film 419, the insulating film 403 is not necessarily formed.

The structures, methods, and the like described in this embodiment can be combined as appropriate with any of the structures, methods, and the like described in the other embodiments.

Embodiment 8

Description is given below of crystal structures of an In—Sn—Zn oxide and an In—Ga—Zn oxide each of which is an example of an oxide that can be used for an oxide semiconductor film. In addition, calculation results of effective masses of an electron and a hole in each crystal structure are shown below.

For the calculation, crystal structures illustrated in FIGS. 31A to 31D were assumed. Note that atomic ratios between elements other than oxygen are shown in FIGS. 31A to 31D. An actual crystal structure of an In—Sn—Zn oxide might be different from the crystal structures illustrated in FIGS. 31A to 31C.

For the calculation, the first-principles electronic structure calculation program "CASTEP" was used. Calculation conditions are shown in Table 1.

TABLE 1

| Calculation code | MS-CASTEP |
|---|---|
| Task | Structural optimization · Energy calculation |
| Exchange-correlation function | GGA-PBEsol |
| Cut-off energy | 800 eV* |
| Pseudopotentials | On the fly pseudopotential |
| k-point | 3 × 3 × 1 |

*550 eV in the case of In:Sn:Zn = 4:3:3

Here, lattice constants of structures after optimization are shown in Table 2.

TABLE 2

| | Crystal structure | a [nm] | b [nm] | c [nm] |
|---|---|---|---|---|
| In:Sn:Zn = 1:1:1 | Hexagonal | 0.537 | 0.537 | 1.423 |
| In:Sn:Zn = 4:3:3 | Hexagonal | 0.539 | 0.539 | 7.145 |
| In:Sn:Zn = 2:1:3 | Homologous | 0.676 | 0.675 | 2.646 |
| In:Ga:Zn = 1:1:1 | Homologous | 0.665 | 0.661 | 2.579 |

Note that cases of hexagonal crystal systems are shown.

Next, an electron effective mass ($m_e^*$) and a hole effective mass ($m_h^*$) were obtained by approximating band edges of an E-k dispersion curve to a quadratic function. The results are shown in Table 3 given below.

TABLE 3

| | In:Sn:Zn = 1:1:1 | In:Sn:Zn = 4:3:3 | In:Sn:Zn = 2:1:3 | In:Ga:Zn = 1:1:1 |
|---|---|---|---|---|
| Crystal structure | Hexagonal | Hexagonal | Homologous | Homologous |
| atoms/cell | 30 | 150 | 84 | 84 |
| $m_e[100]^*/m_e$ | 0.16 | 0.16 | 0.16 | 0.2 |
| $m_e[010]^*/m_e$ | 0.16 | 0.16 | 0.16 | 0.21 |
| $m_e[001]^*/m_e$ | 12.41 | 0.16 | 0.15 | 0.2 |
| $m_h[100]^*/m_e$ | 3.55 | 2.24 | 2.51 | 3.43 |
| $m_h[010]^*/m_e$ | 3.55 | 1.14 | x | 3.19 |
| $m_h[001]^*/m_e$ | x | x | x | x |

Note that "x" indicates the case where fitting was not able to be performed because energy dispersion was outside the quadratic function.

Table 3 shows that the hole effective mass is much larger than the electron effective mass in the In—Sn—Zn oxides and the In—Ga—Zn oxide which have assumed crystal structures. This suggests that holes are less likely to move in the oxides.

Consequently, in a transistor in which any of the above oxides is used for a semiconductor film, flow of a leakage current due to holes tunneling from a drain hardly occurs. This indicates that such a transistor has low off-state current.

Embodiment 9

In this embodiment, a semiconductor device including a transistor described in any of Embodiments 1 to 4 will be described. Here, as one mode of the semiconductor device, an RFID tag and a CPU will be described.

<RFID Tag>

An RFID tag including the above-described transistor, resistor, and capacitor is described below with reference to FIG. 32.

The RFID tag includes a memory circuit, stores data in the memory circuit, and transmits and receives data to/from the outside by using contactless means, for example, wireless communication. With these features, the RFID tag can be used for an individual authentication system in which an object or the like is recognized by reading the individual information, for example. Note that the RFID tag is required to have high reliability in order to be used for this purpose.

A configuration of the RFID tag will be described with reference to FIG. 32. FIG. 32 is a block diagram illustrating a configuration example of an RFID tag.

Figure 32:
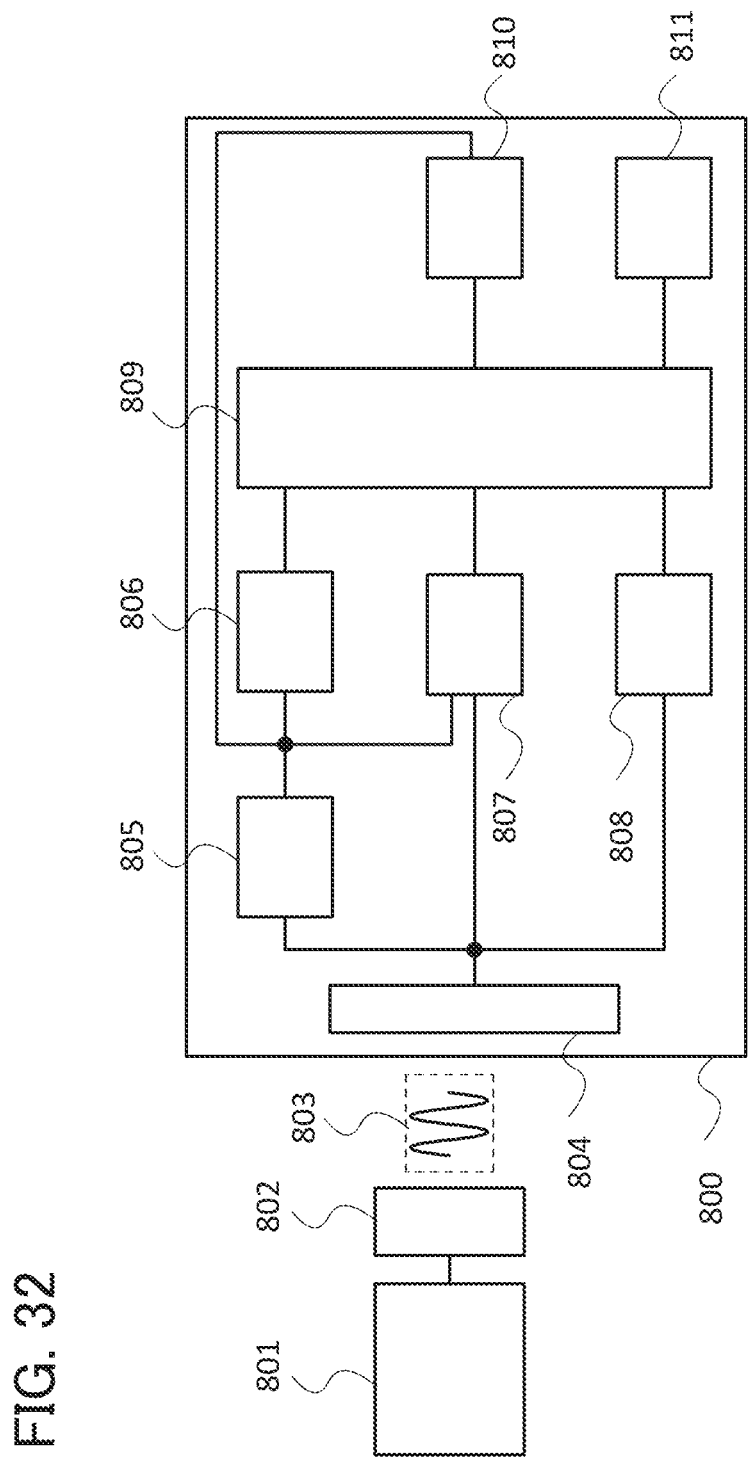
FIG. 32 is a block diagram of an RFID tag of one mode of the present invention.
Figure 33A:
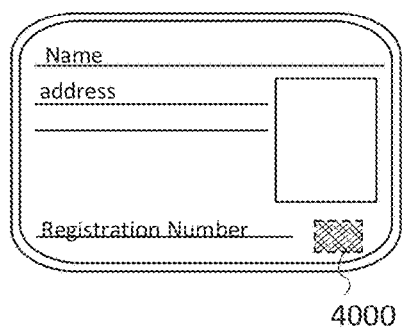
FIGS. 33A to 33F are diagrams illustrating application examples of an RFID tag of one embodiment of the present invention.
Figure 33B:
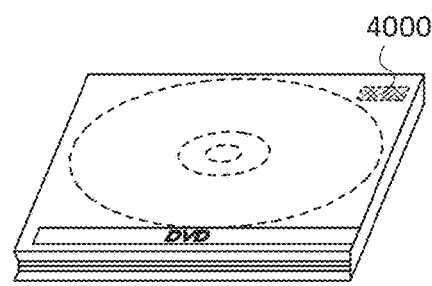
Figure 33C:
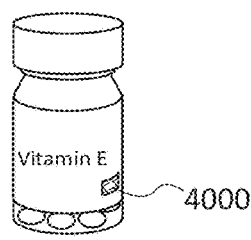
Figure 33D:
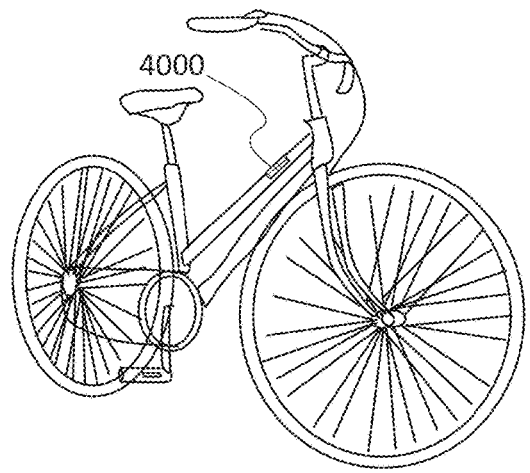
Figure 33E:
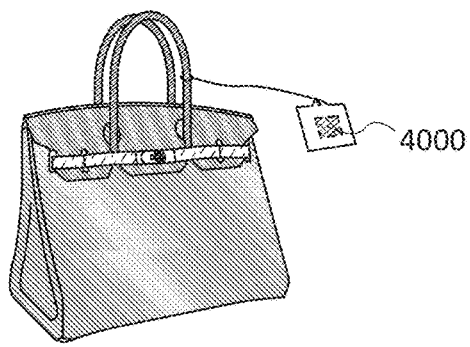
Figure 33F:
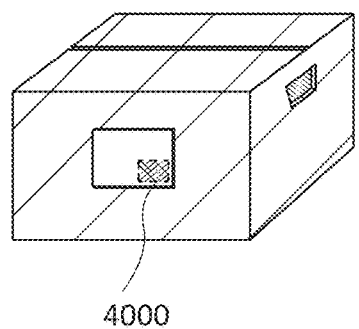

As illustrated in FIG. 32, an RFID tag 800 includes an antenna 804 which receives a radio signal 803 that is transmitted from an antenna 802 connected to a communication device 801 (also referred to as an interrogator, a reader/writer, or the like). The RFID tag 800 includes a rectifier circuit 805, a constant voltage circuit 806, a demodulation circuit 807, a modulation circuit 808, a logic circuit 809, a memory circuit 810, and a ROM 811. As a transistor having a rectifying function included in the demodulation circuit 807, a transistor which allows a reverse current to be low enough, for example, any of the transistors described in Embodiments 1 to 4 can be appropriately used. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RFID tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. The modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in Embodiment 7 can be used as the memory circuit 810. Since the memory device described in Embodiment 7 can retain data even when not powered, the memory device is suitable for an RFID tag. Furthermore, the memory device described in Embodiment 7 needs power (voltage) needed for data writing lower than that needed in a conventional nonvolatile memory; thus, it is possible to prevent a difference between the maximum communication range in data reading and that in data writing. Moreover, it is possible to suppress malfunction or incorrect writing which is caused by power shortage in data writing.

Since the memory device described in Embodiment 7 can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RFID tags, it is possible to put identification numbers to only good products to be shipped. Thus, the identification numbers of the shipped products are in series and customer management corresponding to the shipped products is easily performed.

<Application Examples of RFID Tag>

Application examples of the RFID tag of one embodiment of the present invention are shown below with reference to FIGS. 33A to 33F. The RFID tag is widely used and can be provided for, for example, products such as bills, coins, securities, bearer bonds, documents (e.g., driver's licenses or resident's cards, see FIG. 33A), packaging containers (e.g., wrapping paper or bottles, see FIG. 33C), recording media (e.g., DVD software or video tapes, see FIG. 33B), vehicles (e.g., bicycles, see FIG. 33D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 33E and 33F).

An RFID tag 4000 of one embodiment of the present invention is fixed on products by, for example, being attached to a surface thereof or being embedded therein. For example, the RFID tag 4000 is fixed to each product by being embedded in paper of a book, or embedded in an organic resin of a package. The RFID tag 4000 of one embodiment of the present invention is small, thin, and lightweight, so that the design of a product is not impaired even after the RFID tag 4000 of one embodiment of the present invention is fixed thereto. Furthermore, bills, coins, securities, bearer bonds, documents, or the like can have identification functions by being provided with the RFID tag 4000 of one embodiment of the present invention, and the identification functions can be utilized to prevent counterfeits. Moreover, the efficiency of a system such as an inspection system can be improved by providing the RFID tag 4000 of one embodiment of the present invention for packaging containers, recording media, personal belongings, foods, clothing, household goods, electronic devices, or the like. Vehicles can also have higher security against theft or the like by being provided with the RFID tag 4000 of one embodiment of the present invention.

As described above, the RFID tag of one embodiment of the present invention can be used for the above-described purposes.

<CPU>

A CPU including the above-described transistor, resistor, capacitor, and the like is described below.

Figure 34:
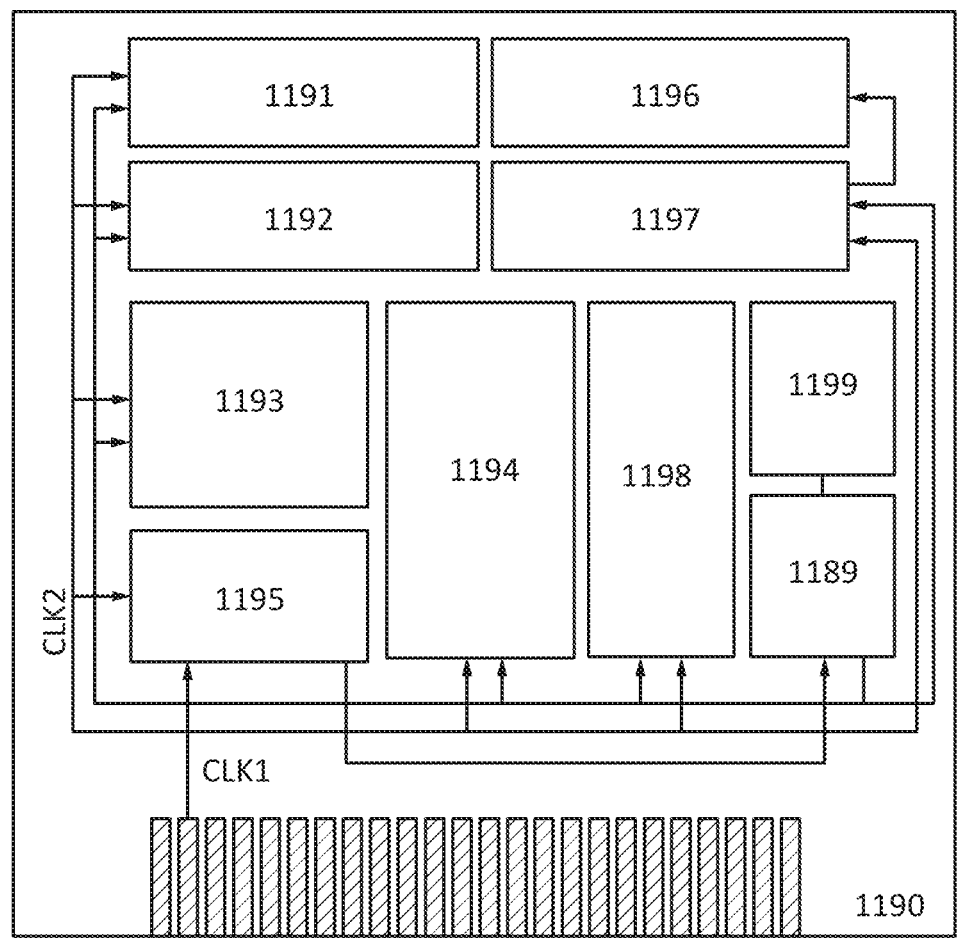
FIG. 34 is a block diagram illustrating a CPU of one embodiment of the present invention.

FIG. 34 is a block diagram illustrating a configuration example of a CPU including any of the above-described transistors as a component.

The CPU illustrated in FIG. 34 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and an ROM interface 1189 (ROM I/F). A semiconductor substrate, an SOI substrate, a glass substrate, or the like is used as the substrate 1190. The rewritable ROM 1199 and the ROM interface 1189 may be provided over a separate chip. Needless to say, the CPU in FIG. 34 is just an example in which the configuration has been simplified, and an actual CPU may have a variety of configurations depending on the application. For example, the CPU may have the following configuration: a structure including the CPU illustrated in FIG. 34 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 34, a memory cell is provided in the register 1196. As the memory cell of the register 1196, the memory device described in Embodiment 7 or the like can be used.

In the CPU illustrated in FIG. 34, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor including an oxide semiconductor film is extremely low. For example, the off-state current of a transistor including an oxide semiconductor film is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Although the CPU is described as one mode of the semiconductor device here, the above-described transistor, resistor, and capacitor can be also used in a digital signal processor (DSP), an LSI such as a custom LSI, or a programmable logic device (PLD), or a radio frequency identification (RF-ID).

Embodiment 10

In this embodiment, structural examples of electronic devices each including a semiconductor device of one embodiment of the present invention will be described. In this embodiment, a display module using the semiconductor device of one embodiment of the present invention will be described with reference to FIG. 35.

In a display module 8000 in FIG. 35, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be used overlapping with the display panel 8006. It is also possible to provide a touch panel function for a counter substrate (sealing substrate) of the display panel 8006. A photosensor may be provided in each pixel of the display panel 8006 to form an optical touch panel. An electrode for a touch sensor may be provided in each pixel of the display panel 8006 so that a capacitive touch panel is obtained.

The backlight unit 8007 includes a light source 8008. The light source 8008 may be provided at an end portion of the backlight unit 8007 and a light diffusing plate may be used.

The frame 8009 protects the display panel 8006 and also functions as an electromagnetic shield for blocking electromagnetic waves generated by the operation of the printed board 8010. The frame 8009 can function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 36A to 36D are external views of electronic devices each including the semiconductor device of one embodiment of the present invention.

Examples of electronic appliances include a television set (also referred to as a television or a television receiver), a monitor of a computer or the like, cameras such as a digital camera and a digital video camera, a digital photo frame, a mobile phone handset (also referred to as a mobile phone or a mobile phone device), a portable game machine, a portable information terminal, an audio reproducing device, and a large-sized game machine such as a pachinko machine.

Figure 36A:
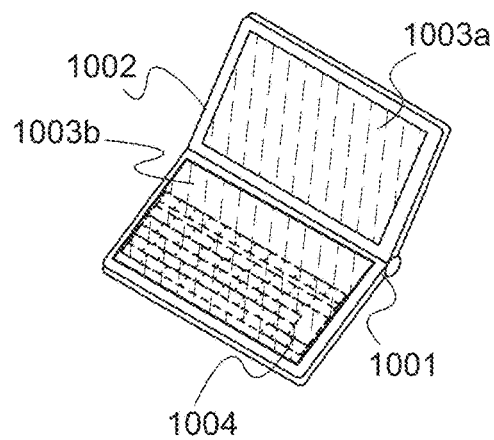
FIGS. 36A to 36D are external views illustrating electronic devices of embodiments of the present invention.

FIG. 36A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is fabricated using any of the transistors described in the above embodiments as a switching element and used in the display portion 1003a or 1003b, whereby the portable information terminal can have high reliability.

The portable information terminal illustrated in FIG. 36A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 36A may transmit and receive data wirelessly. Through wireless communication, desired book data or the like can be purchased and downloaded from an e-book server.

Figure 36B:
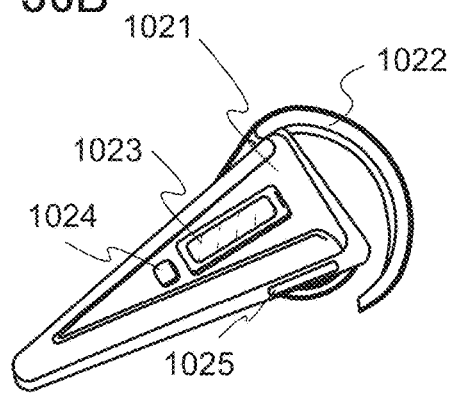

FIG. 36B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element and used in the display portion 1023, whereby the portable music player can have high reliability.

Furthermore, when the portable music player illustrated in FIG. 36B has an antenna, a microphone function, or a wireless communication function and is used with a mobile phone, a user can talk on the phone wirelessly in a hands-free way while driving a car or the like.

Figure 36C:
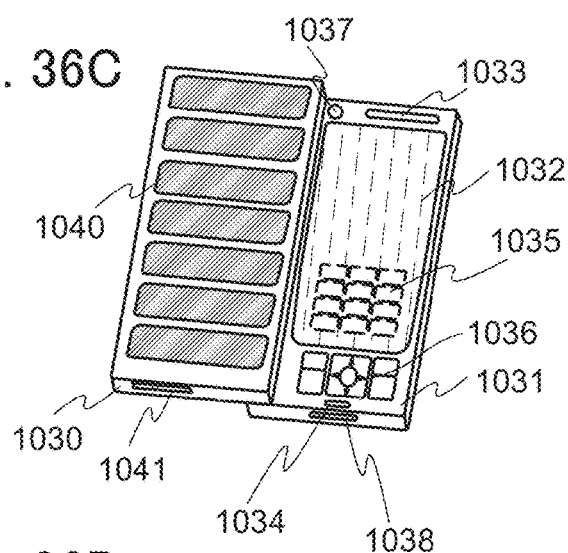

FIG. 36C illustrates a mobile phone including two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 includes a solar cell 1040 for charging of the mobile phone, an external memory slot 1041, and the like. In addition, an antenna is incorporated in the housing 1031. Any of the transistors described in the above embodiments is used in the display panel 1032, whereby the mobile phone can have high reliability.

Furthermore, the display panel 1032 is provided with a touch panel. A plurality of operation keys 1035 that are displayed as images are indicated by dotted lines in FIG. 36C. Note that a boosting circuit for boosting a voltage output from the solar cell 1040 so that it becomes sufficiently high for each circuit is also included.

In the display panel 1032, the direction of display is changed as appropriate depending on the application mode. Furthermore, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are developed as illustrated in FIG. 36C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Furthermore, by inserting a recording medium into the external memory slot 1041, a larger amount of data can be stored and moved.

In addition to the above functions, an infrared communication function, a television reception function, or the like may be provided.

Figure 36D:
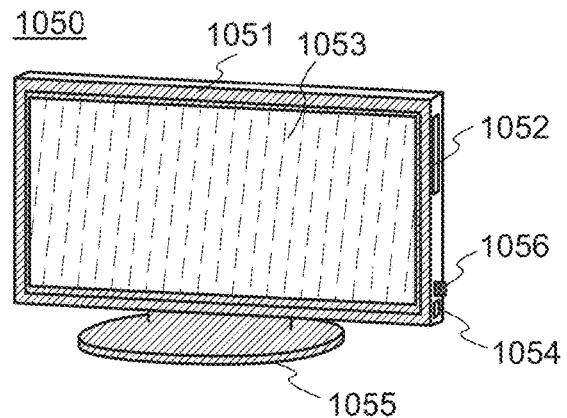

FIG. 36D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. The remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

The television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Furthermore, in the case where the off-state current of the transistor described in the above embodiment is extremely small, the use of the transistor in the external memory 1056 or the CPU allows the television set 1050 to have high reliability and sufficiently reduced power consumption.

This embodiment can be implemented in combination with any of the other embodiments disclosed in this specification, as appropriate.

Example 1

In this example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, diffraction patterns were observed by scanning for 60 seconds at a rate of 5 nm/s. That is, the diffraction patterns were observed while changing a radiating position of a nanobeam one-dimensionally within a range of 300 nm. Then, the observed diffraction patterns were converted into still images every 0.5 seconds to obtain the proportion of CAAC. Note that as an electron beam, a nanobeam with a probe diameter of 1 nm was used. The above measurement was performed on six samples. The proportion of CAAC was calculated using the average value of the six samples.

Figure 37A:
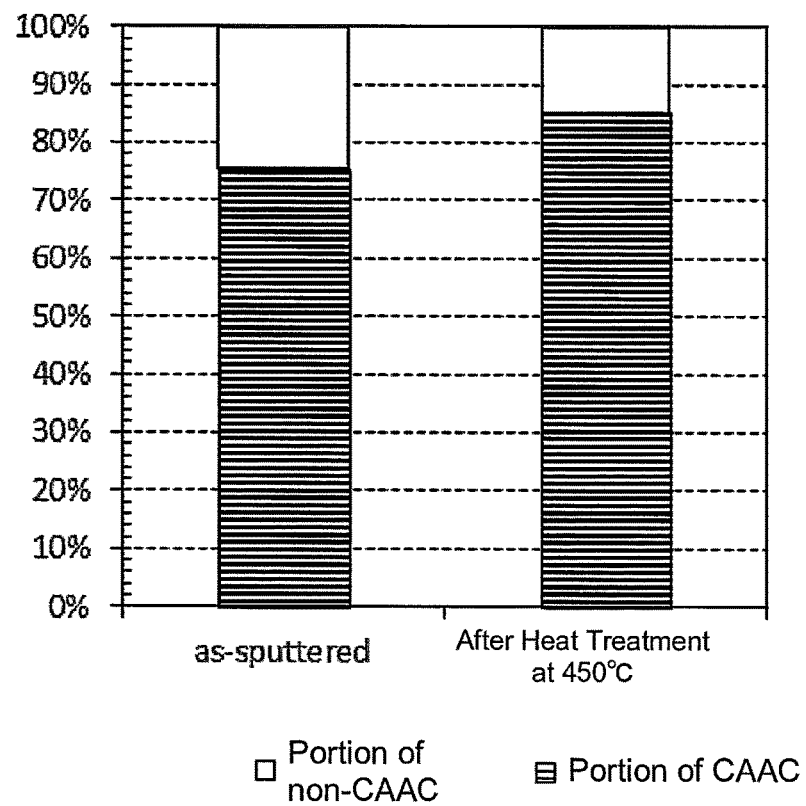
FIG. 37A shows an example of structural analysis by transmission electron diffraction measurement and FIGS. 37B and 37C show high-resolution planar TEM images.

FIG. 37A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 37B:
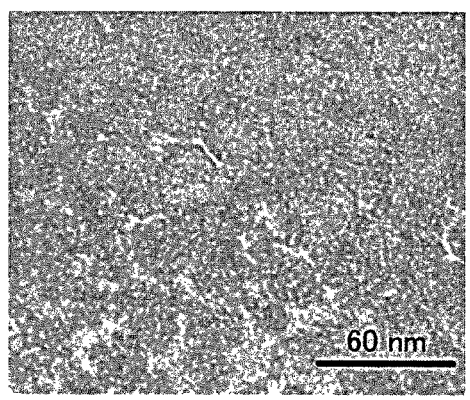
Figure 37C:
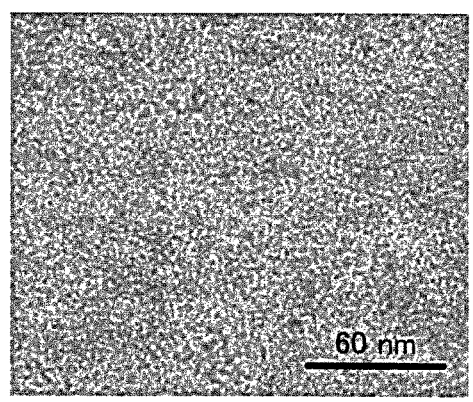

FIGS. 37B and 37C are high-resolution planar TEM images of the CAAC-OS film obtained just after the deposition and the CAAC-OS film subjected to the heat treatment at 450° C., respectively. Comparison between FIGS. 37B and 37C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

This application is based on Japanese Patent Application serial no. 2013-198891 filed with Japan Patent Office on Sep. 25, 2013, the entire contents of which are hereby incorporated by reference.

What is claimed is:

1. A semiconductor device comprising:
a capacitor comprising a metal oxide film including indium over and in contact with an insulating surface, a conductive film at least partly overlapping with the metal oxide film, and a nitride insulating film in contact with the metal oxide film and between the metal oxide film and the conductive film,
wherein the metal oxide film is a stack of an In-M-Zn oxide film and an In—N—Zn oxide film, M and N being each Al, Ti, Ga, Y, Zr, Sn, La, Ce, or Nd,
wherein the In-M-Zn oxide film is on and in direct contact with the In—N—Zn oxide film,
wherein the proportion of M atoms in the In-M-Zn oxide film is higher than the proportion of N atoms in the In—N—Zn oxide film, and
wherein when a region in the In-M-Zn oxide film is observed with a transmission electron diffraction measurement apparatus while changing an observation area one-dimensionally within a range of 300 nm, a diffraction pattern with luminescent spots indicating alignment is observed in 80% or more and less than 100% of the region.

2. The semiconductor device according to claim 1, wherein the metal oxide film comprises a plurality of crystal parts,
wherein c-axis alignment is found in the plurality of crystal parts, and
wherein c-axes in the plurality of crystal parts are aligned in a direction parallel to a normal vector of a top surface of the metal oxide film.

3. The semiconductor device according to claim 1, wherein the metal oxide film comprises a plurality of crystal parts,
wherein a-axes are not aligned in the plurality of crystal parts in the metal oxide film, and
wherein b-axes are not aligned in the plurality of crystal parts in the metal oxide film.

4. The semiconductor device according to claim 1, further comprising a transistor,
wherein the transistor comprises:
a gate electrode over the insulating surface;
an oxide semiconductor film at least partly overlapping with the gate electrode;
a gate insulating film between the gate electrode and the oxide semiconductor film;
a pair of electrodes in contact with the oxide semiconductor film;

an oxide insulating film at least partly overlapping with the pair of electrodes; and the nitride insulating film in contact with the oxide insulating film.

5. The semiconductor device according to claim 1, wherein the nitride insulating film is formed of silicon nitride, a silicon nitride oxide, an aluminum nitride, or an aluminum nitride oxide.

6. The semiconductor device according to claim 1, wherein the semiconductor device further comprises a second nitride insulating film over the capacitor, and wherein the nitride insulating film and the second nitride insulating film are partly in direct contact with each other.

7. A semiconductor device comprising:

a capacitor comprising a nitride insulating film, a metal oxide film including indium in contact with the nitride insulating film, a conductive film at least partly overlapping with the metal oxide film, and an insulating film in contact with the metal oxide film and between the metal oxide film and the conductive film, wherein the metal oxide film is a stack of an In-M-Zn oxide film and an In—N—Zn oxide film, M and N being each Al, Ti, Ga, Y, Zr, Sn, La, Ce, or Nd, wherein the In-M-Zn oxide film is on and in direct contact with the In—N—Zn oxide film, wherein the proportion of M atoms in the In-M-Zn oxide film is higher than the proportion of N atoms in the In—N—Zn oxide film, and wherein when a region in the In-M-Zn oxide film is observed with a transmission electron diffraction measurement apparatus while changing an observation area one-dimensionally within a range of 300 nm, a diffraction pattern with luminescent spots indicating alignment is observed in 80% or more and less than 100% of the region.

8. The semiconductor device according to claim 7, wherein the metal oxide film comprises a plurality of crystal parts, wherein c-axis alignment is found in the plurality of crystal parts, and wherein c-axes in the plurality of crystal parts are aligned in a direction parallel to a normal vector of a top surface of the metal oxide film.

9. The semiconductor device according to claim 7, wherein the metal oxide film comprises a plurality of crystal parts, wherein a-axes are not aligned in the plurality of crystal parts in the metal oxide film, and wherein b-axes are not aligned in the plurality of crystal parts in the metal oxide film.

10. The semiconductor device according to claim 7, further comprising a transistor, wherein the transistor comprises:
a gate electrode over an insulating surface;
an oxide semiconductor film at least partly overlapping with the gate electrode;
a gate insulating film between the gate electrode and the oxide semiconductor film;
a pair of electrodes in contact with the oxide semiconductor film; and
an oxide insulating film at least partly overlapping with the pair of electrodes.

11. The semiconductor device according to claim 7, wherein the nitride insulating film is formed of silicon nitride, a silicon nitride oxide, an aluminum nitride, or an aluminum nitride oxide.

12. The semiconductor device according to claim 7, wherein the semiconductor device further comprises a second nitride insulating film over the capacitor, and wherein the nitride insulating film and the second nitride insulating film are partly in direct contact with each other.

13. A semiconductor device comprising:

a transistor including a semiconductor substrate; and a capacitor comprising an insulating film, a metal oxide film including indium in contact with the insulating film, a conductive film at least partly overlapping with the metal oxide film, and a nitride insulating film in contact with the metal oxide film and between the metal oxide film and the conductive film, wherein the metal oxide film is a stack of an In-M-Zn oxide film and an In—N—Zn oxide film, M and N being each Al, Ti, Ga, Y, Zr, Sn, La, Ce, or Nd, wherein the In-M-Zn oxide film is on and in direct contact with the In—N—Zn oxide film, wherein the proportion of M atoms in the In-M-Zn oxide film is higher than the proportion of N atoms in the In—N—Zn oxide film, and wherein when a region in the In-M-Zn oxide film is observed with a transmission electron diffraction measurement apparatus while changing an observation area one-dimensionally within a range of 300 nm, a diffraction pattern with luminescent spots indicating alignment is observed in 80% or more and less than 100% of the region.

14. The semiconductor device according to claim 13, wherein the metal oxide film comprises a plurality of crystal parts, wherein c-axis alignment is found in the plurality of crystal parts, and wherein c-axes in the plurality of crystal parts are aligned in a direction parallel to a normal vector of a top surface of the metal oxide film.

15. The semiconductor device according to claim 13, wherein the metal oxide film comprises a plurality of crystal parts, wherein a-axes are not aligned in the plurality of crystal parts in the metal oxide film, and wherein b-axes are not aligned in the plurality of crystal parts in the metal oxide film.

16. The semiconductor device according to claim 13, further comprising a second transistor, wherein the second transistor comprises:
a gate electrode over the transistor;
an oxide semiconductor film at least partly overlapping with the gate electrode;
a gate insulating film between the gate electrode and the oxide semiconductor film;
a pair of electrodes in contact with the oxide semiconductor film;
an oxide insulating film at least partly overlapping with the pair of electrodes; and
the nitride insulating film in contact with the oxide insulating film.

17. The semiconductor device according to claim 13, wherein the nitride insulating film is formed of silicon nitride, a silicon nitride oxide, an aluminum nitride, or an aluminum nitride oxide.

18. The semiconductor device according to claim 13, wherein the semiconductor device further comprises a second nitride insulating film over the capacitor, and wherein the nitride insulating film and the second nitride insulating film are partly in direct contact with each other.

\* \* \* \* \*